(12) United States Patent
Nuckolls et al.

(10) Patent No.: US 10,566,539 B2
(45) Date of Patent: Feb. 18, 2020

(54) ORGANIC SEMICONDUCTOR COMPOUNDS AND METHODS OF USE

(71) Applicant: THE TRUSTEES OF COLUMBIA UNIVERSITY IN THE CITY OF NEW YORK, New York, NY (US)

(72) Inventors: Colin Nuckolls, New York, NY (US); Yu Zhong, New York, NY (US); Rongsheng Chen, Wuhan (CN); Bharat Kumar, Tarrytown, NY (US); Tuan M. Trinh, New York, NY (US); Wei Wang, Jersey City, NJ (US); Michael L. Steigerwald, Martinsville, NJ (US); Xiaoyang Zhu, New York, NY (US); Shenxiong Xiao, Shanghai (CN); Fay Ng, New York, NY (US); Boyuan Zhang, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 0 days.

(21) Appl. No.: 15/308,795

(22) PCT Filed: May 5, 2015

(86) PCT No.: PCT/US2015/029285
§ 371 (c)(1),
(2) Date: Nov. 3, 2016

(87) PCT Pub. No.: WO2015/171640
PCT Pub. Date: Nov. 12, 2015

(65) Prior Publication Data
US 2017/0186961 A1    Jun. 29, 2017

Related U.S. Application Data

(60) Provisional application No. 61/988,743, filed on May 5, 2014.

(51) Int. Cl.
| | | |
|---|---|---|
| H01L 51/00 | (2006.01) |
| C09B 5/62 | (2006.01) |
| H01L 51/05 | (2006.01) |
| H01L 51/42 | (2006.01) |

(52) U.S. Cl.
CPC ............ H01L 51/0053 (2013.01); C09B 5/62 (2013.01); H01L 51/0035 (2013.01);
(Continued)

(58) Field of Classification Search
CPC ........................... H01L 51/46; H01L 51/0072
(Continued)

(56) References Cited

U.S. PATENT DOCUMENTS 8,283,469 B2    10/2012   Chen et al.
2012/0227802 A1    9/2012   Khokhlov et al.
(Continued)

FOREIGN PATENT DOCUMENTS

CN       103242312 A      8/2013
EP       2259354 A2     12/2010
(Continued)

OTHER PUBLICATIONS

Jiang et al., "Bay-linked perylene bisimides as promising non-fullerene acceptors for organic solar cells", Oct. 30, 2013, Chem. Commun., 2014, 50, pp. 1024-1026.*
(Continued)

Primary Examiner — Khanh T Nguyen
(74) Attorney, Agent, or Firm — Baker Botts L.L.P.

(57) ABSTRACT

Organic perylene diimide-based compounds are provided. Methods of producing the organic compounds is also provided as well as methods of their use including, among other things, their use as organic semiconductor materials.

50 Claims, 30 Drawing Sheets

(52) U.S. Cl.
CPC ...... *H01L 51/0036* (2013.01); *H01L 51/0037* (2013.01); *H01L 51/0047* (2013.01); *H01L 51/0545* (2013.01); *H01L 51/0558* (2013.01); *H01L 51/4253* (2013.01); *H01L 2251/552* (2013.01)

(58) Field of Classification Search
USPC ............................................ 136/263; 257/40
See application file for complete search history.

(56) References Cited

U.S. PATENT DOCUMENTS

| | | |
|---|---|---|
| 2013/0207090 A1 | 8/2013 | Walba |
| 2014/0021448 A1* | 1/2014 | Polander ............. H01L 51/0072 257/40 |

FOREIGN PATENT DOCUMENTS

| | | |
|---|---|---|
| EP | 2626359 A1 | 8/2013 |
| WO | WO 2008/017714 A1 | 2/2008 |

OTHER PUBLICATIONS

Cnops et al., "8.4% efficient fullerene-free organic solar cells exploiting long-range exciton energy transfer," Nature Communications 5:3406 (2014).

Iino et al., "High Electron Mobility of 0.1 cm2 V-1 S-1 in the Highly Ordered Columnar Phase of Hexahexylthiotriphenylene," Applied Physics Letters 87(19):192105-1-4 (2005).

International Search Report dated Jul. 27, 2015 in International Application No. PCT/US15/29285.

Kozma et al., "Perylene diimides based materials for organic solar cells," Dyes and Pigments 98:160-179 (2013).

Li et al., "Synthesis and Properties of Ethylene-Annulated Di(perylene diimides)," Organic Letters 14(20):5278-5281 (2012).

Lin et al., "A Star-Shaped Perylene Diimide Electron Acceptor for High-Performance Organic Solar Cells," Advanced Materials 26:5137-5142 (2014).

National Center for Biotechnology Information. PubChem Compound Database; CID=13979869, https://pubchem.ncbi.nlm.nih.gov/compound/13979869 (accessed May 5, 2017).

Shrotriya, "Organic photovoltaics: Polymer power," Nature Photonics 3:447-449 (2009).

Tan et al., Efficient All-Polymer Solar Cells Based on Blend of Tris(thienylenevinylene)-Substituted Polythiophene and Poly[perylene diimide-alt-bis (dithienothiophene)] Applied Physics Letters 93(7):073309-1-3 (2008).

Zhong et al., "Efficient Organic Solar Cells with Helical Perylene Diimide Electron Acceptors," J. Am. Chem. Soc. 136(43):15215-15221 (2014).

Zhong et al., "Helical Ribbons for Molecular Electronics," J. Am. Chem. Soc. 136:8122-8130 (2014).

\* cited by examiner (A) Cyclized Dimer of Compound 1

(B) Cyclized Trimer of Compound 2

(C) Cyclized Tetramer of Compound 3

(A) Dimer (Compound 1)

(B) Trimer (Compound 2)

(C) Tetramer (Compound 3)

(A)

(B)

(C)

(D)

(E)

(F)

(G)

A

B (A)

(B)

(C)

A

B

C

A

Device structure (inverted)

B

C

A

B

ORGANIC SEMICONDUCTOR COMPOUNDS AND METHODS OF USE

CROSS-REFERENCE TO RELATED APPLICATIONS

This application is a U.S. National Stage Patent Application under 35 U.S.C. 371 of International Application No. PCT/US2015/029285, filed on May 5, 2015, which claims priority under 35 U.S.C. § 119 to U.S. Provisional Application No. 61/988,743, filed May 5, 2014. The contents of each of which are hereby incorporated by reference in their entirety.

STATEMENT REGARDING FEDERALLY SPONSORED RESEARCH OF DEVELOPMENT

This invention was made with government support under DE-SC0001085 awarded by the Department of Energy. The government has certain rights in the invention.

BACKGROUND

The present disclosure provides compounds, which can be used, for example, as organic semiconductor materials.

Organic solar cells (OSC) can produce lightweight, flexible energy conversion devices due to their synthetic variability and low-temperature manufacturing process. Chemists have developed synthetic pathways and well-designed p-type materials; however, in terms of n-type materials, fullerene derivatives (e.g., $PC_{60}BM$ and PC-43M) are the dominant acceptors in organic solar cells. There are, however, several issues with fullerene derivatives (e.g., a limited absorption range which can make it difficult to tune the optical properties and/or modify or enhance absorption in the visual light range, and the cost of fullerene derivatives can limit practical use on a large scale).

Perylene-3,4,9,10-tetracarboxylic acid diimide (PDI), a known n-type organic semiconductor, is a promising candidate as a non-fullerene acceptor material for use in, for example, organic solar cells. Unfortunately, certain PDIs and other electron acceptors have not fulfilled their potential in solar cells. Certain photon conversion efficiencies (PCE) are about ca. 4%, realized by using a PDI dimer-based material as the electron acceptor (Bis-PDI-T-EG).

Narrow graphene ribbons have been proposed for use in electronic applications. Certain approaches to preparing graphene nanoribbons with PDI subunits, however, have suffered from low yields and a lack of structural control over the formation of the higher oligomers.

Thus, there is a need for atomically defined graphene nanoribbons that yield a higher PCE as well as a method for reliably making these organic compounds.

SUMMARY

The disclosed subject matter provides graphene nanoribbons comprising perylene-3,4,9,10-tetracarboxylic acid diimide (PDI) subunits bridged with ethylene (C═C) subunits. Also disclosed herein are synthetic procedures to fuse PDIs together with an ethylene bridge to form the disclosed oligomer compounds.

One aspect of the disclosed subject matter provides the organic semiconductor materials. In particular, the present disclosure provides PDI-based oligomer compounds as organic semiconductor materials. In certain embodiments, the PDI-based oligomer compounds can include one or more PDI monomers. In certain embodiments, the PDI-based compound can include two or more PDI monomers, i.e., a PDI oligomer. For example, and not by way of limitation, the oligomer can be a PDI dimer, trimer, and tetramer. In certain embodiments, the oligomer can include at least five PDI monomers. In certain embodiments, the oligomer compound can include substituted groups on the imide-N bay- (e.g., 1, 6, 7, 12) and/or 2, 5, 68, 11 positions.

One aspect of the disclosed subject matter provides oligomer compounds that do not self-aggregate. In certain aspects, the oligomer compounds form optimal conformations resulting in helical ribbon-like molecules. In certain aspects, the disclosed oligomers have enhanced absorption in the visible light region with increasing oligomer length due to quantum confinement effect.

In certain embodiments, the oligomer compound is a compound comprising at least one repeating monomer. In a non-limiting embodiment of the presently disclosed subject matter, the oligomer compounds can be represented by the general formula:

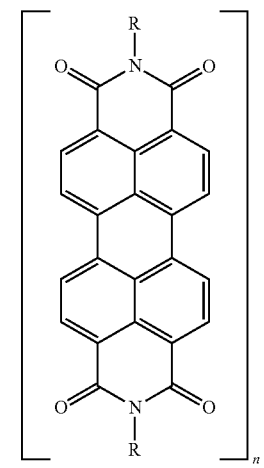

wherein each R is independently selected from the group consisting of branched and unbranched $C_6$-$C_{20}$ alkyl groups, n is an integer from 2-10, and wherein the units are connected by ethylene bridges (C═C) between the bay positions.

One aspect of the disclosed subject matter provides a process for preparing organic semiconductor materials. In particular, the present disclosure provides a process for preparing PDI-based oligomer compounds as organic semiconductor materials. In certain embodiments, the process entails preparing oligomer compounds that include two or more PDI monomers, i.e., a PDI oligomer. For example, and not by way of limitation, the process entails preparing a PDI dimer, trimer, and tetramer. In certain embodiments, the process entails preparing oligomer compounds having at least five PDI monomers. In certain embodiments, the oligomer compound can include substituted groups on the imide-N bay- (e.g., 1, 6, 7, 12) and/or 2, 5, 68, 11 positions. In certain embodiments, the oligomer compounds can be synthesized by coupling two or more monomers via an ethylene bridge, wherein the resulting oligomer compound is represented by the general formula:

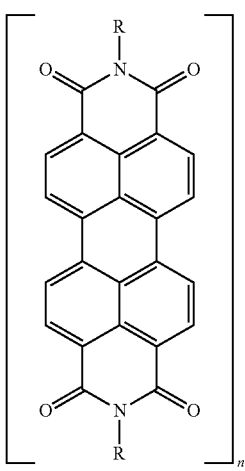

wherein each R is independently selected from the group consisting of branched and unbranched $C_6$-$C_{20}$ alkyl groups, n is an integer from 2-10, and wherein the units are connected by ethylene bridges (C=C) between the bay positions.

In certain embodiments, each R is independently selected from the group consisting of branched and unbranched $C_8$-$C_{15}$ alkyl groups or $C_9$-$C_{12}$ alkyl groups. In a non-limiting embodiment, at least one R is branched or unbranched $C_{11}H_{23}$. In another non-limiting embodiment, each R is

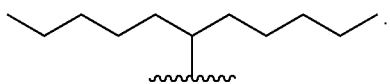

In certain embodiments, n is an integer from 2-4. In certain embodiments, n is an integer from 2-5.

Another aspect of the disclosed subject matter includes methods of using the described PDI-based oligomer compounds as electron-accepting semiconductor material. For example, but not by way of limitation, the oligomer compounds can be used in organic solar cells, organic electroluminescent devices, organic field-effect transistors (FET), organic optical memories, organic non-linear devices and organic laser devices. In certain embodiments, the oligomer compounds can be used in organic solar cells as electron-accepting compounds. In certain embodiments, the oligomer compounds disclosed herein can be used in a solar cell that further includes an electron donor compound. In certain embodiments, the oligomer compounds disclosed herein can be used in a solar cell that further includes the electron donor compound, thieno[3,4-b]thiophene/benzodithiophene or poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene)-2-carboxylate-2,6-diyl] (PBDTT-TT/PTB7-Th). In certain embodiments, the oligomer compounds disclosed herein can be used in a solar cell that further includes a solvent additive. In certain embodiments, the oligomer compounds disclosed herein can be used in a solar cell that further includes the solvent additive 1,8-diiodooctane (DIO) or 1-chloronaphthalene.

BRIEF DESCRIPTION OF THE DRAWINGS

Further features and various advantages of the disclosed subject matter will be more apparent from the following detailed description of the embodiments and the accompanying drawings in which.

DETAILED DESCRIPTION

Disclosed herein are atomically defined graphene nanoribbons comprising perylene-3,4,9,10-tetracarboxylic acid diimide (PDI) subunits bridged with ethylene (C=C) subunits. Also disclosed herein are synthetic procedures to fuse PDIs together with an ethylene bridge to form oligomers. The disclosed synthetic approach can provide control over the final structure.

As used herein, the term "alkyl" refers to saturated aliphatic groups. Alkyl groups can be straight chain (e.g., ethyl, n-propyl, n-butyl, n-hexyl, n-octyl, n-decyl, n-dodecyl) or branched chain (e.g., i-propyl, s-butyl). An alkyl can be substituted or unsubstituted.

As used herein, the term "substituted" means that a group can be substituted by replacement of one or more hydrogen radicals with one or more groups selected from oxygen, nitrogen, sulfur, alkyl, alkenyl, alkynyl, oxy, dioxy, aryl, halo, haloalkyl, haloalkenyl, haloalkynyl, haloaryl, hydroxy, alkoxy, carboxy, haloalkoxy, nitrile, nitro, nitroalkyl, nitroalkenyl, nitroalkynyl, nitroaryl, nitroheterocyclyl, azido, amino, alkylamino, alkenylamino, alkynylamino, arylamino, benzylamino, acyl, alkenylacyl, alkynylacyl, arylacyl, acylamino, acyloxy, aldehydo, alkylsulfonyl, arylsulfonyl, alkylsulfonylamino, arylsulfonylamino, alkylsulfonyloxy, arylsulfonyloxy, heterocyclyl, heterocycloxy, heterocyclylamino, haloheterocyclyl, alkylsulfenyl, arylsulfenyl, carboalkoxy, carboaryloxy, mercapto, alkylthio, arylthio, acylthio, and the like. As used herein, the term "about" or "approximately" means within an acceptable error range for the particular value as determined by one of ordinary skill in the art, which will depend in part on how the value is measured or determined, i.e., the limitations of the measurement system. For example, "about" can mean a range of up to 20%, up to 10%, up to 5%, and or up to 1% of a given value.

PDIs undergo strong self-aggregation in a film because planar molecules favor molecular stacking. Self-aggregation causes phase separation which is harmful to device performance. The disclosed oligomers, however, have several optimal conformations resulting in helical ribbon-like molecules which prevents the disclosed oligomers from self-aggregating. As a result, the oligomers have enhanced absorption in the visible light region with increasing oligomer length due to quantum confinement effect. Thus, the disclosed non-planar conformation is beneficial to the performance of, but not by way of limitation, organic solar cells, organic electroluminescent devices, organic field-effect transistors, organic optical memories, organic nonlinear devices and organic laser devices. Indeed, the disclosed synthetic procedure results in devices having PCEs that are among the highest reported for non-fullerene-based devices. Due to the disclosed synthetic routes, the manufacturing costs of OSCs can be reduce by replacing fullerene derivatives with the oligomers disclosed herein.

Figure 1:
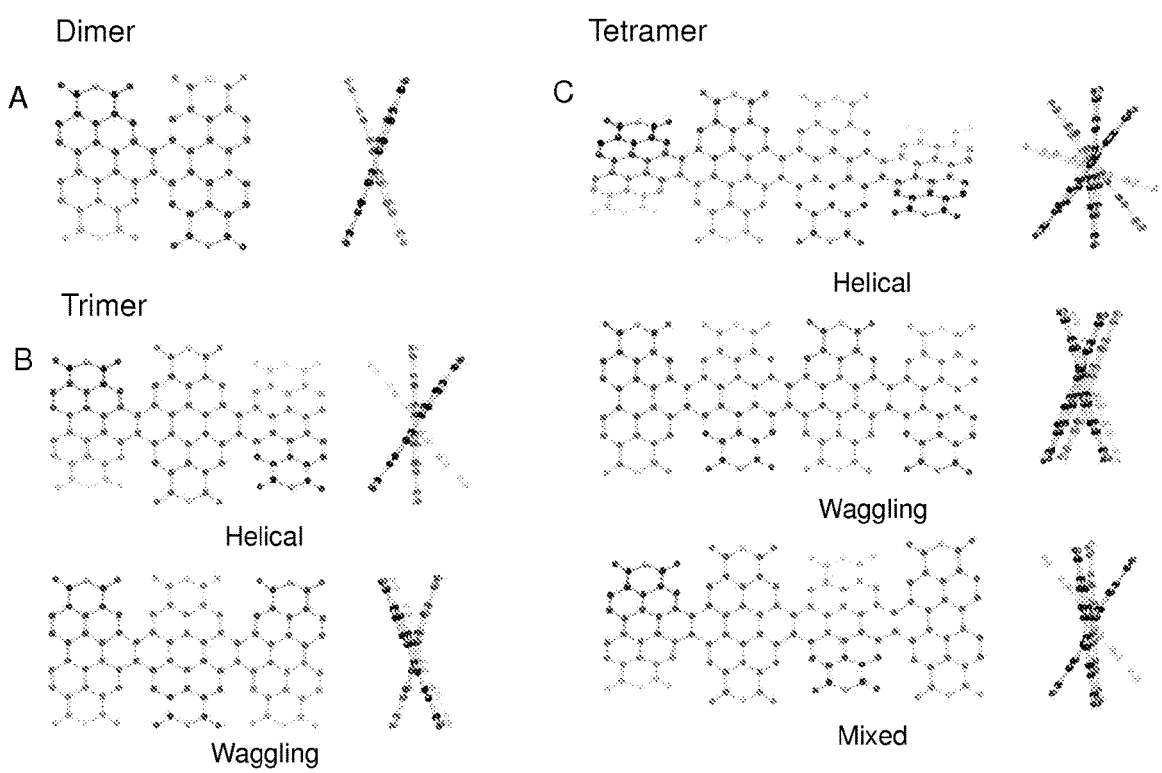
FIG. 1 depicts density functional theory (DFT) models of (A) dimer (Compound 1), (B) trimer (Compound 2) and (C) tetramer (Compound 3).

The disclosed oligomers have several optimal conformations as shown in FIGS. 1A-C. Density functional theory (DFT) calculations reveal twisted structures of these ribbon-like molecules. The physical and electronic structure of this series of oligomers is a consequence of the unusual fusion in the ribbon backbone. The steric congestion introduced by the fusion between the PDIs causes the ribbons to become severely contorted into helical, waggling, or a mix of helical and waggling superstructures. As a result, the oligomers have enhanced absorption in the visible light region with increasing oligomer length due to quantum mechanical effects (FIG. 3A). Thus, non-planar conformation is beneficial to solar cell performance.

Cyclic voltammograms show that the lowest unoccupied molecular orbital (LUMO) levels of the PDI dimers, trimers, and tetramers are located around −4 eV. These values are slightly lower than the LUMO level of PDI monomer and close to that of common n-type materials such as [6,6]-phenyl-$C_{61}$-butyric acid methyl ester (PC60BM). The electron mobility of the oligomers in thin film transistors (FIG. 8) shows that electron mobilities within the range of $10^{-1} \sim 10^{-2}$ $cm^2V^{-1}s^{-1}$. The high electron mobilities indicate that they may have good charge carrier transport properties in the organic bulk-heterojunction (BHJ).

The optical and electronic properties of the disclosed oligomers suggest that they are promising candidates for organic solar cells, organic light-emitting diodes (OLED), and photovoltaic applications. Indeed, when tested as discussed below in bulk junction solar cells the highest PCE of non-fullerene organic BHJs was achieved.

Due to the synthetic routes disclosed herein, the manufacturing costs of OSCs can be reduce by replacing fullerene derivatives with the oligomers disclosed herein.

In certain embodiments, the perylene diimide-based compound is an oligomer compound comprising at least one repeating monomer in which the oligomer compound is represented by the general formula:

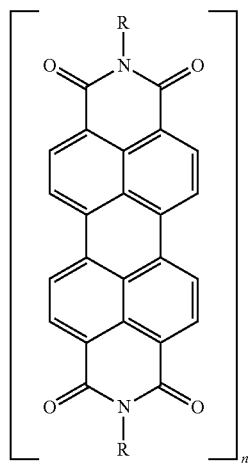

wherein each R is independently selected from the group consisting of branched and unbranched $C_6$-$C_{20}$ alkyl groups, n is an integer from 2-10, and wherein the units are connected by ethylene bridges (C=C) between the bay positions.

In certain embodiments, each R is independently selected from the group consisting of branched and unbranched $C_8$-$C_{15}$ or $C_9$-$C_{12}$ alkyl groups. In certain embodiments, each R is independently branched or unbranched $C_7$-$C_{19}$, $C_8$-$C_{18}$, $C_9$-$C_{17}$, $C_{10}$-$C_{16}$, $C_{11}$-$C_{15}$, or $C_{12}$-$C_{14}$ alkyl groups. In certain embodiments, each R is independently branched or unbranched $C_6H_{13}$, $C_7H_{15}$, $C_8H_{17}$, $C_9H_{19}$, $C_{10}H_{21}$, $C_{11}H_{23}$, $C_{12}H_{25}$, $C_{13}H_{27}$, $C_{14}H_{29}$, $C_{15}H_{31}$, $C_{16}H_{33}$, $C_{17}H_{35}$, $C_{18}H_{37}$, $C_{19}H_{39}$, or $C_{20}H_{41}$. In a non-limiting embodiment, at least one R is branched or unbranched $C_{11}H_{23}$. In certain embodiments, each R is independently a branched $C_{11}H_{23}$. In certain embodiments, each R is:

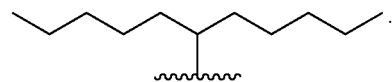 [SMILES: *C(CCCCC)CCCCC]

In a non-limiting embodiment of the presently disclosed subject matter, the monomer building block of the oligomer compound is the structure:

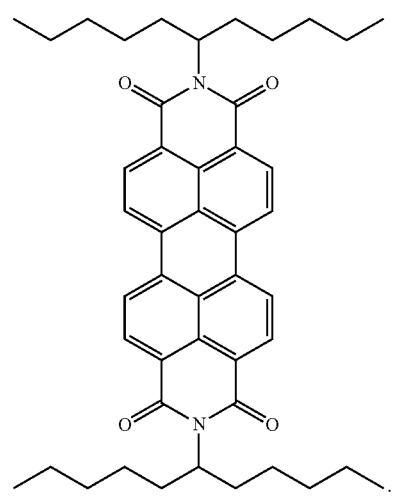 [SMILES: CCCCCC(CCCCC)N1C(=O)c2ccc3c4ccc5c6c(ccc(c7ccc(c2c37)C1=O)c64)C(=O)N(C(CCCCC)CCCCC)C5=O]

In certain embodiments, n is 2-5. In certain embodiments, n is 2-4. In certain embodiments, 11 is 2, 3, 4, 5, 6, 7, 8, 9, or 10.

In certain embodiments, the oligomer compound is represented by the general formula:

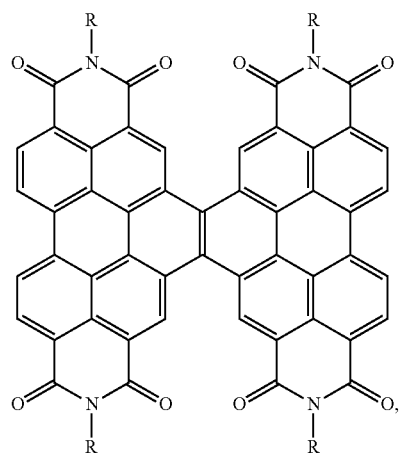
Dimer
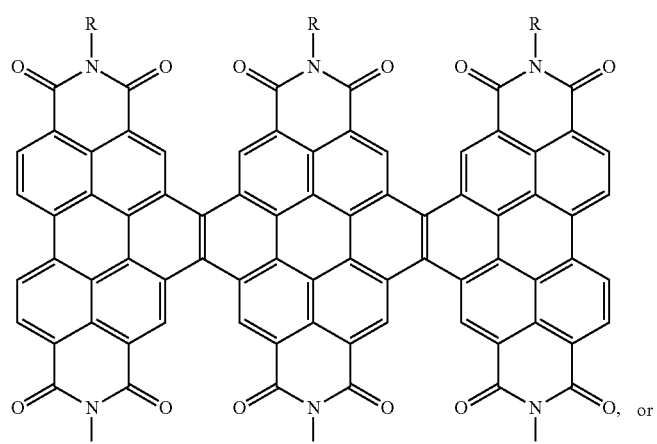
Trimer
or
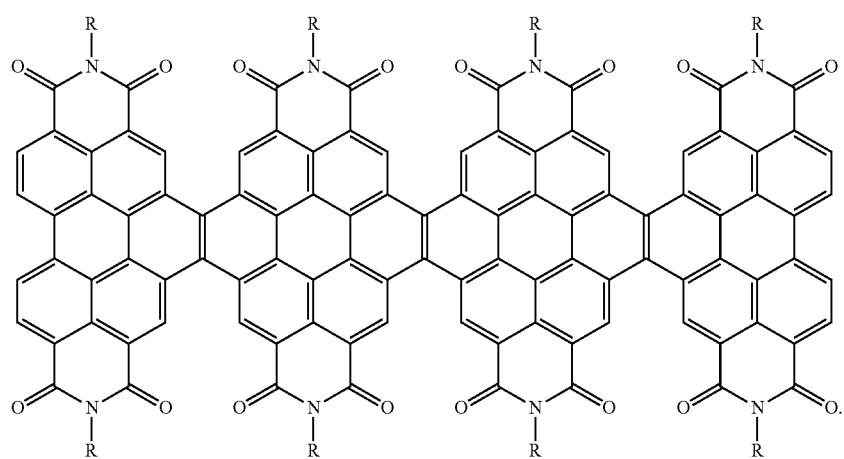
Tetramer

In a non-limiting embodiment, the oligomer compound is:
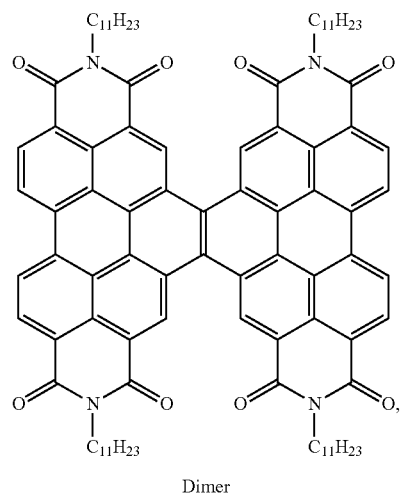
Dimer
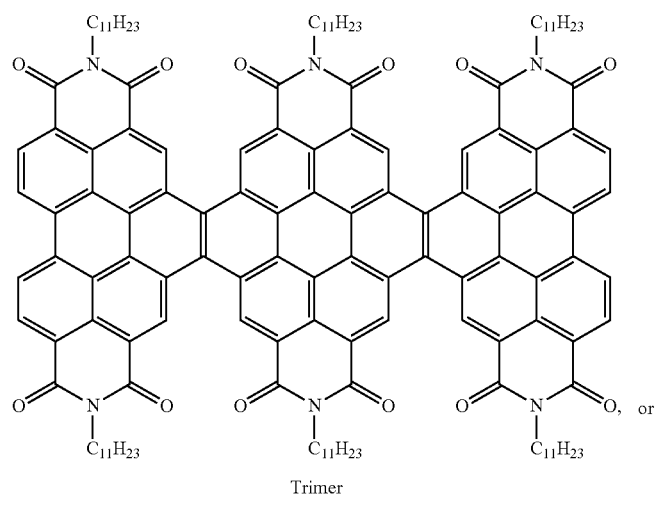
Trimer

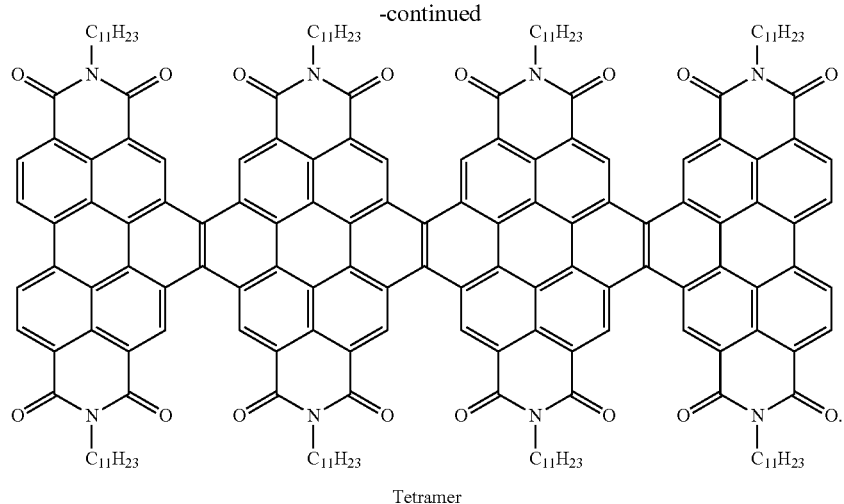
Tetramer
In certain embodiments, R is a branched $C_{11}H_{23}$. In certain embodiments, R is
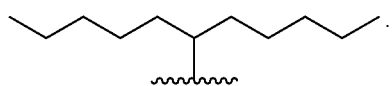
In a non-limiting embodiment, the oligomer compound is:
(Compound 1)
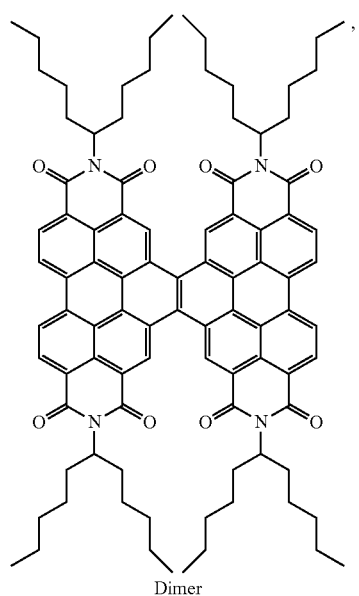
Dimer -continued
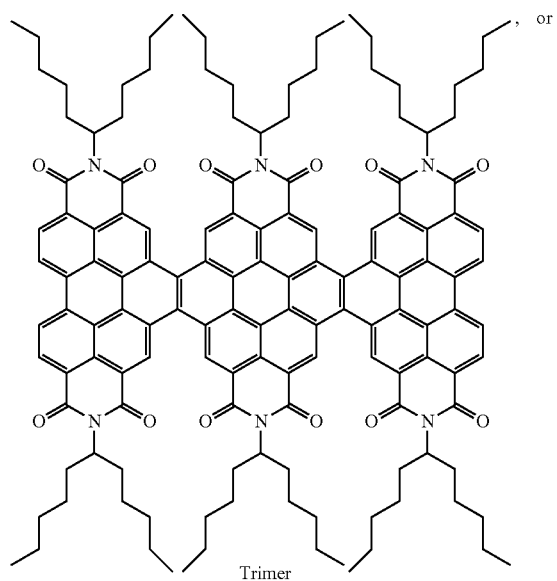
Trimer
(Compound 2)
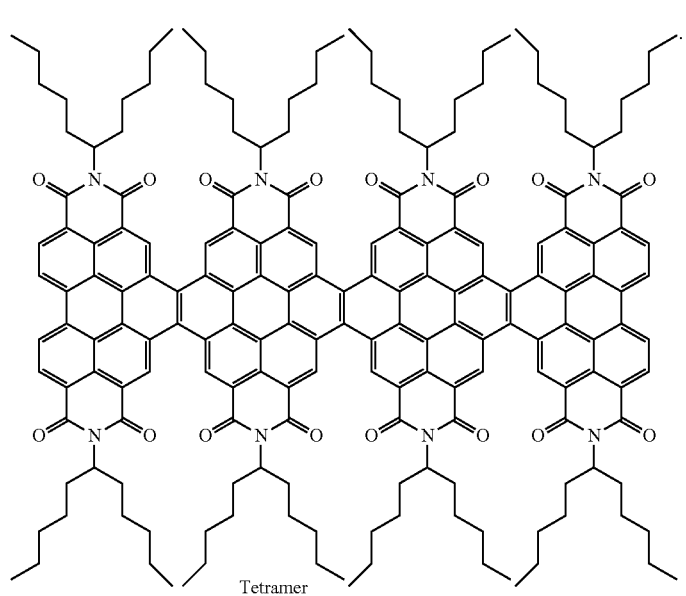
Tetramer
(Compound 3)

In certain embodiments, one or more carbons at positions 1, 2, 5, 6, 7, 8, 11, or 12 is substituted. In certain embodiments, the carbons are substituted with a halogen. In certain embodiments, the halogen is bromine. In certain embodiments, the halogen is chlorine. In certain embodiments, the carbons at positions 1 and/or 7 are substituted. In certain embodiments, the carbons are substituted with a nitrile group. In certain embodiments the carbons are substituted with ethylene glycol dimethyl ether. In certain embodiments, the carbons at positions 1 and/or 7 are substituted. In certain embodiments the carbons of the disclosed oligomers are numbered as follows:

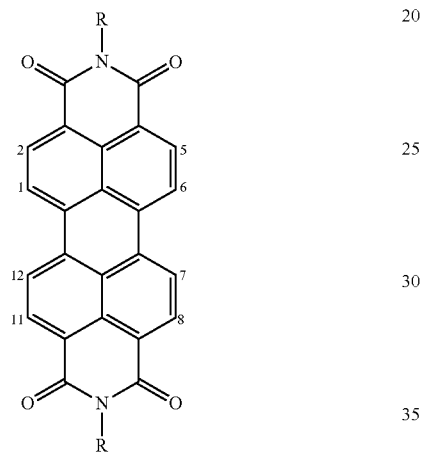

In a non-limiting embodiment, the oligomer compound is:

Compound 4

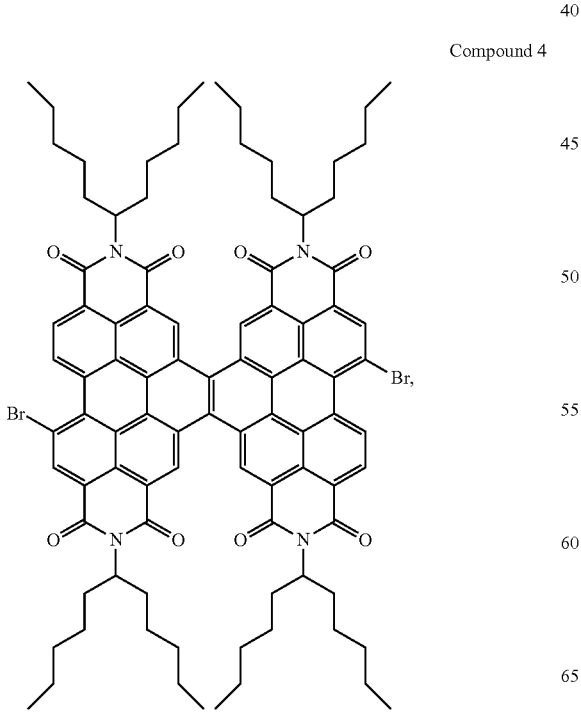

Compound 5

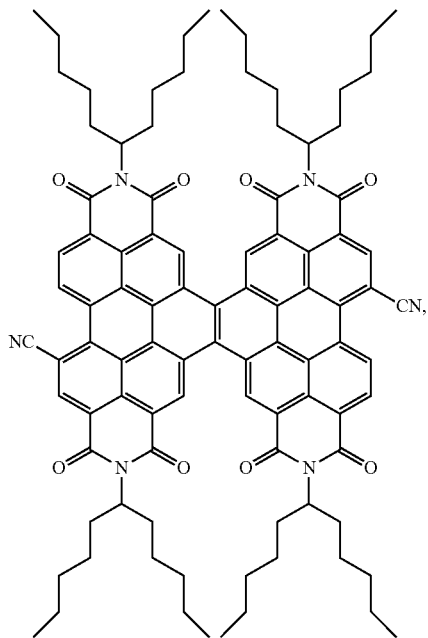

Compound 6

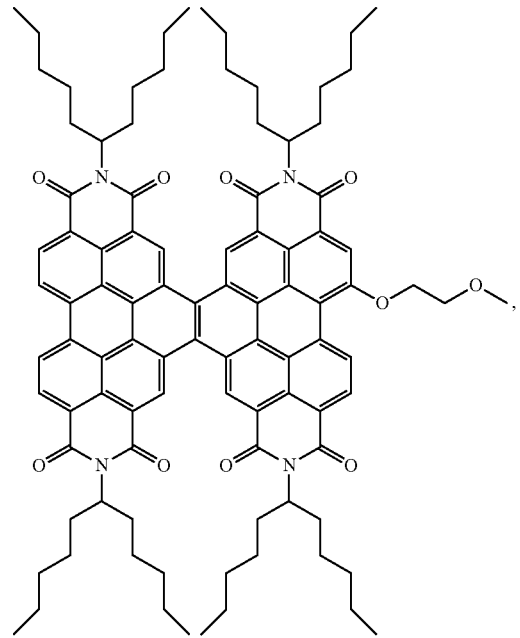

or an oligomer with the same substitutions containing more than two monomers (e.g., 3-10 monomers).

In certain embodiments, the oligomer compounds do not self-aggregate. In certain embodiments, the oligomer compounds are non-planer. In certain embodiments, the oligomer compounds form a helical or waggling superstructure, or a combination thereof (i.e., mixed form). In certain embodiments, the oligomer compounds form a mixed helical and waggling superstructure form. In certain embodiments, the oligomer compounds form optimal conformations resulting in mixed helical and waggling ribbon-like molecules. In certain embodiments, the disclosed oligomers have enhanced absorption in the visible light region with increasing oligomer length. In certain embodiments, the oligomers with enhanced absorption in the visible light region have 2-10 monomer units, 3-9 monomer units, 4-8 monomer units, or 5-7 monomer units. In certain embodiments, the oligomers with enhanced absorption in the visible light region have at least 4 monomers, at least 5 monomers, at leave 6 monomers, or at least 7 monomers. In certain embodiments, the oligomers with enhanced absorption in the visible light region have 4 or 5 monomer units.

In certain embodiments, the lowest unoccupied molecular orbital (LUMO) levels of the oligomer compounds are between about −1 eV to about −6 eV. In certain embodiments, the LUMO levels are between about −2 eV to about −5 eV. In certain embodiments, the LUMO levels are between about −3 eV to about −4 eV. In certain embodiments, the LUMO levels are about −4 eV.

In certain embodiments, the electron mobilities of the oligomer compounds are between about $10^{-1}$ to about $10^{-5}$ cm$^2$V$^{-1}$s$^{-1}$. In certain embodiments, the electron mobilities of the oligomer compounds are between about $10^{-1}$ to about $10^{-2}$ cm$^2$V$^{-1}$s$^{-1}$.

Figure 2:
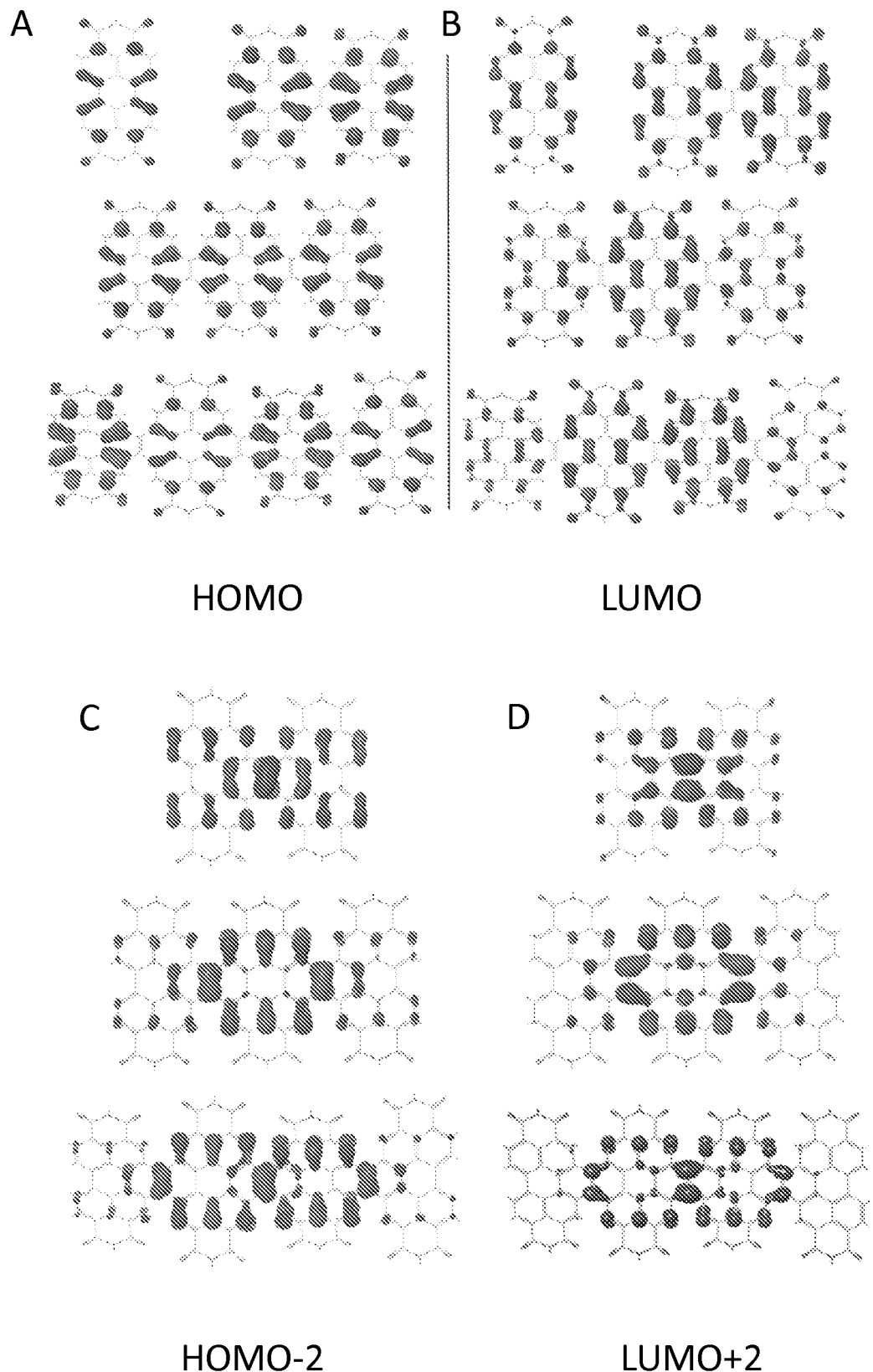
FIG. 2 depicts (A) the highest occupied molecular orbitals for PDI oligomers; (B) the lowest unoccupied molecular orbitals of PDI oligomers; (C) the Homo-2 for PDI oligomers; and (D) the lowest energy antibonding orbital of the bridging olefin.

The dimer (Compound 1) exists in the helical conformation as a pair of enantiomers (FIG. 1A). As longer oligomers were synthesized, the conformers become more numerous. Two conformations for the trimer (Compound 2) were identified: helical and waggling (FIG. 1B). The tetramer (Compound 3) also adopts a helical and waggling conformation, but, now with three ring junctions, there is also a mixed conformation (FIG. 1C). Calculations (using B3LYP/6-31G) suggest that these conformations are similar in energy. From both ground- and excited-state DFT calculations of Compounds 1-3, the energy of the HOMO/LUMO excitation decreases with increasing oligomers length, which is typical for conjugated molecules. Interestingly, it was surprisingly discovered that the HOMO-2 to LUMO transition also decreased in energy across the oligomer series (FIG. 2). The HOMO-2 orbital is the highest energy occupied orbital associated within the olefin connecting the oligomers, whereas the LUMO is concentrated predominantly within the PDI-subunits. As a result, the HOMO-2 to LUMO transition describes the promotion of an electron from the bridging olefin(s) to the PDI subunits. Within the tetramer, the HOMO/LUMO and HOMO-2/LUMO transitions are approximately isoenergetic, resulting in greatly increased absorption in the visible wavelengths.

In one aspect of the disclosed subject matter, the oligomer compounds can be synthesized by coupling two or more monomers via an ethylene bridge, wherein the resulting oligomer compound is represented by the Formula:

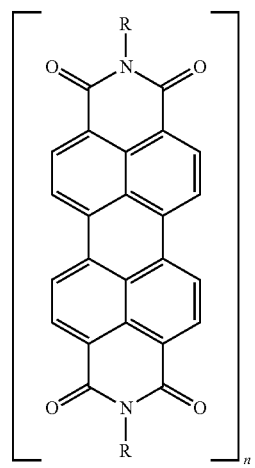

wherein each R is independently selected from the group consisting of branched and unbranched C$_6$-C$_{20}$ alkyl groups, n is an integer from 2-10, and wherein the units are connected by ethylene bridges (C═C) between the bay positions In certain embodiments, each R is independently selected from the group consisting of branched and unbranched C$_8$-C$_{15}$ or C$_9$-C$_{12}$ alkyl groups. In certain embodiments, each R is independently branched or unbranched C$_7$-C$_{19}$, C$_8$-C$_{18}$, C$_9$-C$_{17}$, C$_{10}$-C$_{16}$, C$_{11}$-C$_{15}$, or C$_{12}$-C$_{14}$ alkyl groups. In certain embodiments, each R is independently branched or unbranched C$_6$H$_{13}$, C$_7$H$_{15}$, C$_8$H$_{17}$, C$_9$H$_{19}$, C$_{10}$H$_{21}$, C$_{11}$H$_{23}$, C$_{12}$H$_{25}$, C$_{13}$H$_{27}$, C$_{14}$H$_{29}$, C$_{15}$H$_{31}$, C$_{16}$H$_{33}$, C$_{17}$H$_{35}$, C$_{18}$H$_{37}$, C$_{19}$H$_{39}$, or C$_{20}$H$_{41}$. In a non-limiting embodiment, at least one R is branched or unbranched C$_{11}$H$_{23}$. In certain embodiments, each R is independently a branched C$_{11}$H$_{23}$. In certain embodiments, each R is:

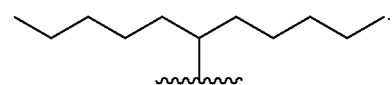

In a non-limiting embodiment of the presently disclosed subject matter, the monomer building block of the oligomer compound is the structure:

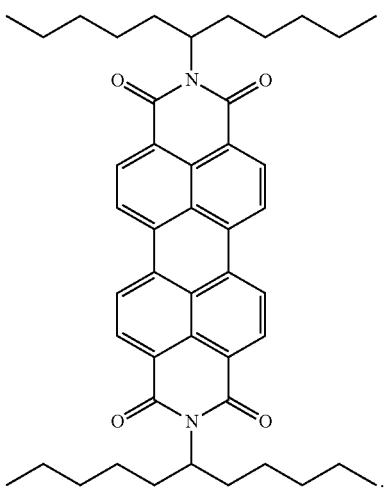 [SMILES: CCCCCC(CCCCC)N1C(=O)c2ccc3c4ccc5c6c(ccc(c7ccc(c2c37)C1=O)c64)C(=O)N(C(CCCCC)CCCCC)C5=O]

In certain embodiments, n is 2, 3, 4, 5, 6, 7, 8, 9, or 10. In certain embodiments, one or more carbons at positions 1, 2, 5, 6, 7, 8, 11, or 12 is substituted. In certain embodiments, the carbons are substituted with a halogen. In certain embodiments, the halogen is bromine. In certain embodiments, the halogen is chlorine. In certain embodiments, the carbons are substituted with a nitrile group. In certain embodiments the carbons are substituted with ethylene glycol dimethyl ether. In certain embodiments, the carbons at positions 1 and/or 7 are substituted.

In certain embodiments, the oligomer compound is synthesized by coupling a halogen substituted PDI monomer or oligomer (e.g., dimer, trimer, tetramer, etc. . . . ) to trans-1,2-bis(tributylstannyl)ethene or to bis-boronate ester followed by a cyclization reaction. In certain embodiment, the oligomer compound is synthesized by coupling a bromine substituted PDI monomer or oligomer to trans-1,2-bis(tributylstannyl)ethene or to bis-boronate ester followed by a cyclization reaction. In certain embodiments, the oligomer compound is synthesized by coupling a trifluoromethanesulfonate substituted PDI monomer or oligomer to trans-1,2-bis(tributylstannyl)ethene or to bis-boronate ester followed by a cyclization reaction. In certain embodiments, the halogen or trifluoromethanesulfonate substitution is at the bay-positions. In certain embodiments, the halogen or trifluoromethanesulfonate substitution is carbon positions 1, 2, 5, 6, 7, 8, 11, and/or 12.

In certain embodiments, the cyclization reaction is photocyclization. In certain embodiments the photocyclization is a Mallory photocyclization. In certain embodiments, the cyclization is conducted under oxidative conditions or non-oxidative conditions. In certain embodiments, the oxidant used in the oxidative cyclization reaction is $O_2$ and/or $I_2$. In certain embodiments, $I_2$ is the oxidant used in the oxidative cyclization reaction. In certain embodiments, the cyclization reaction takes place while purging with air. In certain embodiments, the air is purged during the irradiation step of the photocyclization reaction. In certain embodiments, the irradiation step utilizes a 600 W lamp. In certain embodiments, the irradiation step utilizes a 300-500 W lamp. In certain embodiments, the irradiation step utilizes a 450 W medium mercury lamp. In certain embodiments, photocyclization occurs with both $I_2$ and purging with air under irradiation with a 450 W Hanovia medium pressure mercury lamp.

Scheme 1. Synthesis of Dimer (Compound 1):

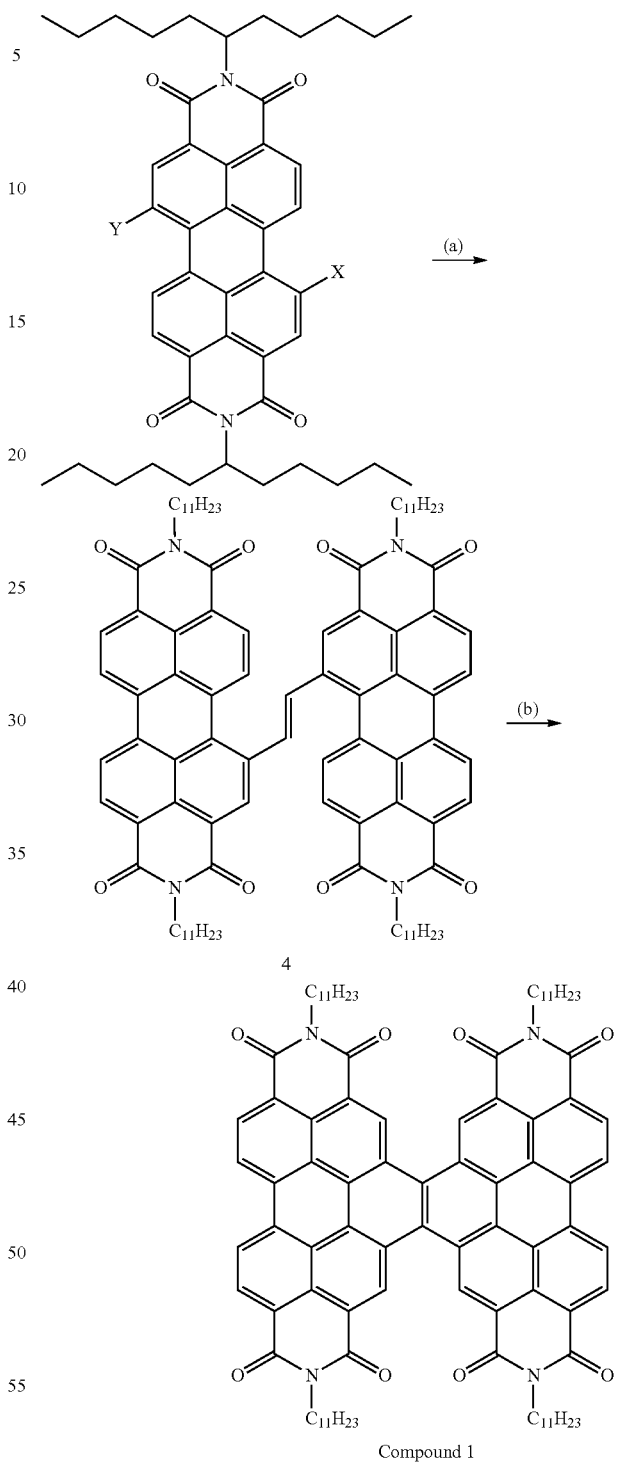

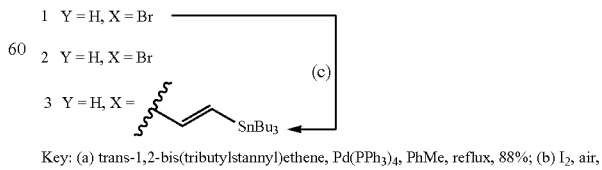

Key: (a) trans-1,2-bis(tributylstannyl)ethene, Pd(PPh₃)₄, PhMe, reflux, 88%; (b) $I_2$, air, hv, PhH, 83%; (c) trans-1,2-bis(tributylstannyl)ethene, Pd(PPh₃)₄, PhMe, reflux, 70%.

Scheme 1 summarizes the synthesis of the dimer (Compound 1). In this scheme trans-1,2-bis(tributylstannyl)ethene is coupled to the monobromo-PDI (1) via a Stille coupling. Next, the ethylene-bridged PDI (4) was cyclized using Mallory photocyclization. Exemplary conditions for the photocyclization to Compound 1 required both I$_2$ and purging with air under irradiation with a 450 W Hanovia medium pressure mercury lamp. Under these conditions high yields (~83%) could be obtained for compound 1.

A method to create the important PDI monostannane building block 3, shown in Scheme 1 was discovered. This building block is essential for the higher oligomer syntheses.

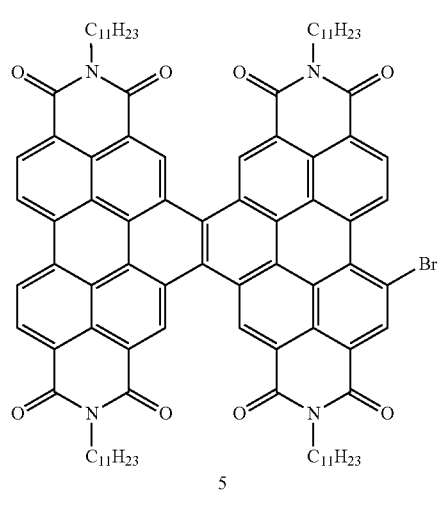

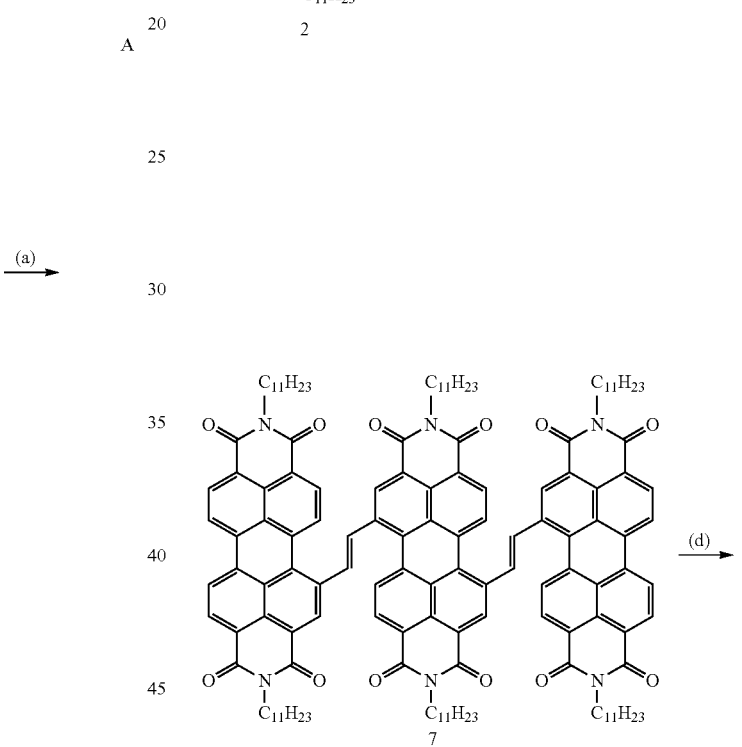

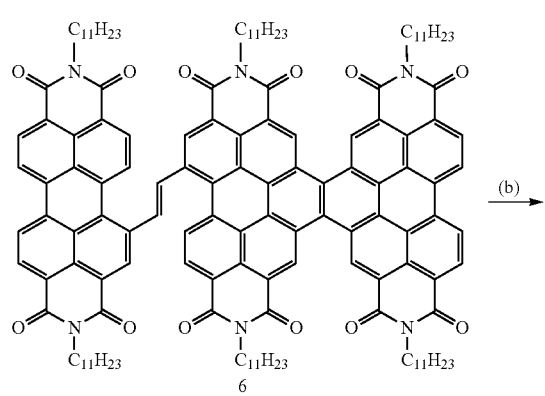

Compound 2

Key: (a) 3, Pd(PPh$_3$)$_4$, PhMe, reflux, 93%; (b) I$_2$, air, hv, PhMe, 63%; (c) 3 (from Scheme 1), Pd(PPh$_3$)$_4$, PhMe, reflux, 47%; (d) I$_2$, air, hv, PhMe, 62%.

Two alternative syntheses of the Compound 2 is shown in Scheme 2. Coupling monostannane 3 with either the monobrominated dimer 5, in Scheme 2A or with the dibrominated parent PDI (2, in Scheme 2B) furnishes the substrates for the photocyclization. The same Mallory conditions used in Scheme 1 was applied; both substrates yield Compound 2 in >60% yield. The yield of Compound 2 (from 6 or 7) was in actuality much higher, but it is difficult to chromatograph the cyclized PDI oligomers due to their tendency to bind to the silica during chromatography.

Scheme 3. Synthesis of Tetramer (Compound 3):
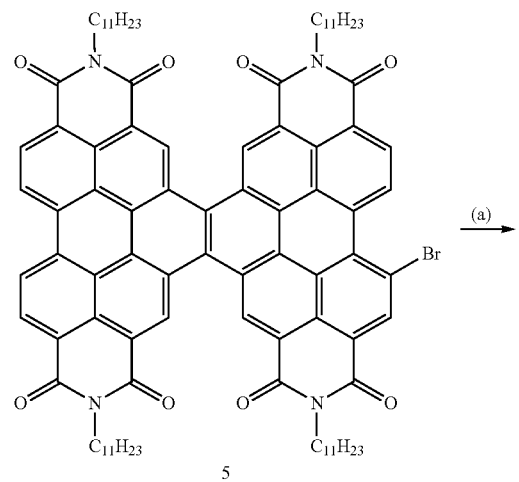
5
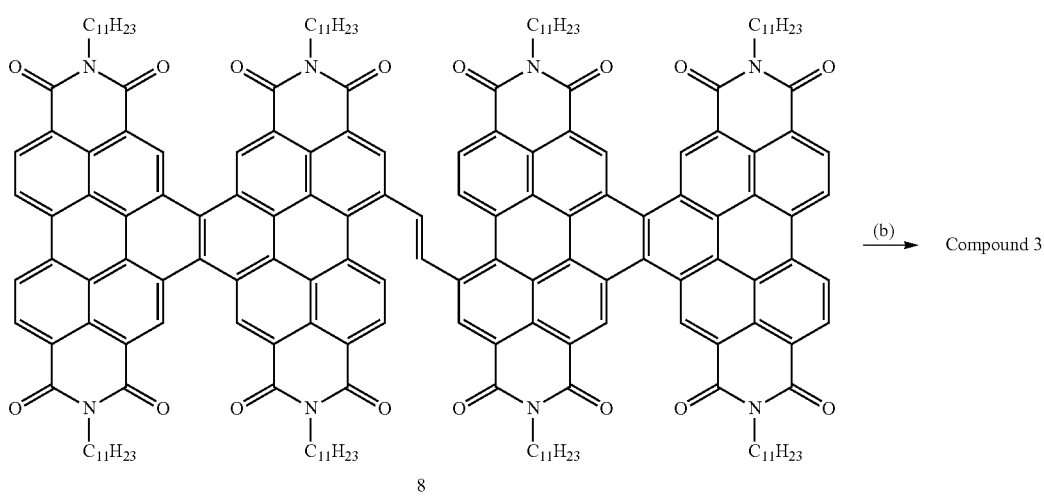
8
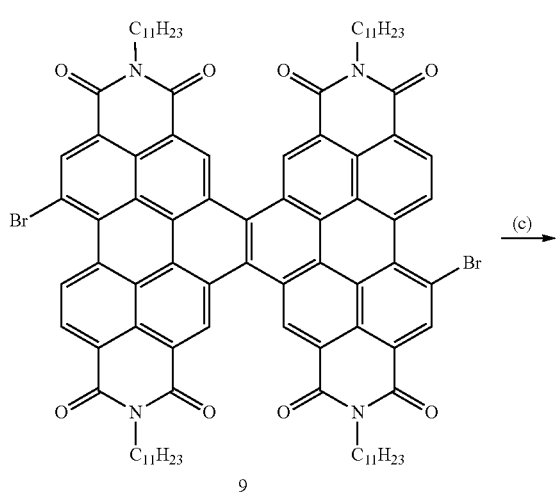
9

-continued

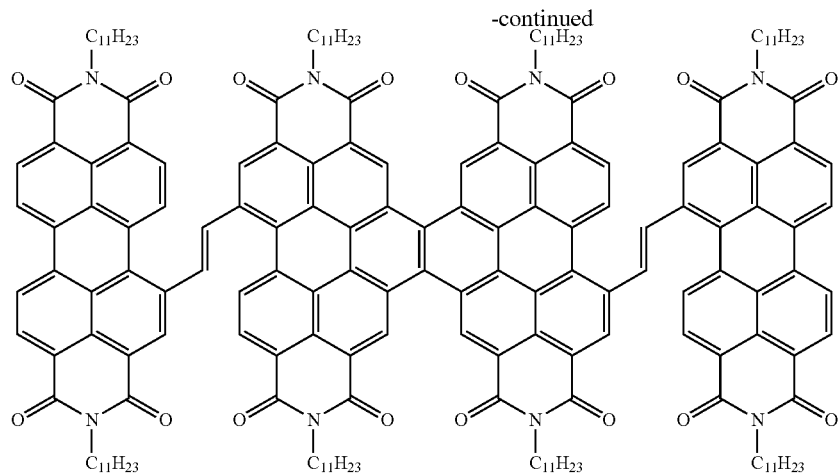

10

Key: (a) trans-1,2-bis(tributylstannyl)ethene, Pd(PPh₃)₄, PhMe, reflux, 65%; (b) I₂, air, hv, PhMe; (c) 3, Pd(PPh₃)₄, PhMe, reflux, 72%; (d) I₂, air, hv, PhMe, 45%.

Two similar routes were developed for the tetrameric PDI (Compound 3) shown in Scheme 3. In Scheme 3A the monobrominated dimer 5 was coupled with 1,2-bis(tributylstannyl)ethene to yield 10. In Scheme 3B, the monostannane 3 was coupled with the dibrominated dimer 9. Each of these substrates produced the tetramer (Compound 3) upon photocyclization. It was surprising that the reaction mixture resulting from the double photocyclization in Scheme 3B was much cleaner than that resulting from the apparently intimately related single photocyclization in Scheme 3A. The mixture in Scheme 3A contains partially cyclized products that are difficult to separate from the desired product. Therefore, the tetramer was synthesized according to Scheme 3B. Given the high yields, the solubility of the products, and the generality of this method, it is likely that this method can yield substantially longer oligomers.

Oligomer Compounds 1-3 were isolated as dark red solids having a metallic sheen. The oligomers were soluble in common organic solvents including toluene, chloroform and dichloromethane. They were insoluble in methanol and ethanol. One advantage of a nonplanar core is that it maintains its solubility and processability even with the longer oligomers. The Oligomer Compounds 1-3 were thermally robust; TGA did not show any detectable decomposition below 400° C. The Oligomer Compounds 1-3 were also resistant to oxidation as evident by absence of any oxidation peak in CV up to +1 V in Bu4NPF6 solution (0.1 M) as the electrolyte in dichloromethane.

Another aspect of the disclosed subject matter includes methods of using the described oligomer compounds as electron-accepting semiconductor material. For example, but not by way of limitation, oligomer compounds can be used in organic solar cells, organic electroluminescent devices, organic field-effect transistors, organic optical memories, organic non-linear devices and organic laser devices. In certain embodiments, the oligomer compounds can be used in organic solar cells as electron-accepting compounds.

In certain embodiments, the disclosed subject matter includes devices that achieve a PCE between 2%-15%, 3%-12%, or 4%-10%. In certain embodiments, the disclosed subject matter includes devices that achieve a PCE at least about 3%, at least about 4%, at least about 5%, at least about 6%, at least about 7%, at least about 8%, at least about 9%, or at least about 10%.

In certain embodiments, the disclosed subject matter includes methods of using the described oligomer compounds as electron-accepting semiconductor material. In certain embodiments, the oligomer compounds disclosed herein can be used in a solar cell that further includes an electron donor compound. In certain embodiments, the oligomer compounds disclosed herein can be used in a solar cell that further includes the electron donor compound, Group IA metals, Group IA metal arenes, P3HT, poly[2-methoxy-5-(3,7-dimethyloctyloxy)-1,4-phenylene vinylene] (MDMO-PPV), poly(2-methoxy-5-(2'-ethyl-hexyloxy)-1,4-phenylene vinylene) (MEH-PPV), N,N-diisopropyl-3-pentylamine, N-ethyldiisopropylamine, and 1,2,2,6,6-pentamethylpiperidine, thieno[3,4-b]thiophene/benzodithiophene (PTB7), PSBTBT, poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene)-2-carboxylate-2,6-diyl] (PBDTT-TT/PTB7-Th) and combinations thereof. In certain embodiments the electron donor is thieno[3,4-b]thiophene/benzodithiophene or poly[4,8-bis(5-(2-ethylhexyl)thiophen-2-yl)benzo[1,2-b;4,5-b]dithiophene-2,6-diyl-alt-(4-(2-ethylhexyl)-3-fluorothieno[3,4-b]thiophene)-2-carboxylate-2,6-diyl] (PBDTT-TT/PTB7-Th).

In certain embodiments, the oligomer compounds disclosed herein can be used in a solar cell that further includes a solvent additive. In certain embodiments, the oligomer compounds disclosed herein can be used in a solar cell that further includes the solvent additive 1,8-diiodooctane (DIO) or 1-chloronaphthalene.

In certain embodiments, the oligomer compounds disclosed herein can be used in a solar cell that further includes a solvent additive. In certain embodiments, the oligomer compounds disclosed herein can be used in a solar cell that further includes the solvent additive: 1,6-dichlorohexane; 1,6-dibromohexane; 1,6-diiodohexane; diiodooctane; 1,8-dithioloctane; 1,8-dichlorooctane; 1,8-dibromooctane; 1,8-diiodooctane, decanedinitrile; 1,10-dithioldecane; 1,8-dichlorodecane; 1,8-dibromodecane; 1,8-diiododecane; chloronaphthalene, octanedithiol, 1,6-dithiolhexane; octadinitrile; dodecanedinitrile; 1-chloronaphthalene. In certain embodiments, the perylene diimide-based compounds disclosed herein can be used in a solar cell that further includes the solvent additive 1,8-diiodooctane (DIO) or 1-chloronaphthalene.

EXAMPLES

Materials and Methods.

Unless otherwise noted, all reactions were performed in oven-dried or flame-dried round bottom flasks. Flasks were fitted with rubber septa, and reactions were conducted under a positive pressure of nitrogen, unless otherwise noted. Anhydrous and anaerobic solvents were obtained from a Schlenk manifold with purification columns packed with activated alumina and supported copper catalyst (Glass Contour, Irvine, Calif.). Automated flash chromatography was performed using a Teledyne Isco Combiflash Rf200 and Redisep Rf Gold Silica columns.

Materials.

Perylene-3,4,9,10-tetracarboxylicbisimides,1-bromoperylene-3,4,9,10 tetracarboxylicbisimides, 1,6 and 1,7-dibromoperylene-3,4,9,10-tetracarboxylicbisimides were synthesized using known procedures. All chemicals were purchased from commercial sources and used without further purification unless otherwise specified.

Instrumentation.

$^1$H, and $^{13}$C NMR spectra were recorded on a Bruker DRX300 (300 MHz), Bruker DRX400 (400 MHz) or a Bruker DMX500 (500 MHz) spectrometer. Chemical shifts for protons are reported in parts per million downfield from tetramethylsilane and are referenced to residual protium in the NMR solvent (CHCl$_3$: δ7.26; C$_6$H$_6$ δ 7.15). Chemical shifts for carbon are reported in parts per million downfield from tetramethylsilane and are referenced to the carbon resonances of the solvent (CDCl$_3$ δ 77.0; C$_6$D$_6$ δ 128.5). Data are represented as follows: chemical shift, multiplicity (s=singlet, d=doublet, t=triplet, m=multiplet), coupling constants in Hertz, and integration. The mass spectroscopic data were obtained at the Columbia University mass spectrometry facility using a JEOL JMSHX110A/110A tandem mass spectrometer. Absorption spectra were obtained on Shimadzu UV 1800 UV-Vis spectrophotometer and emission spectra were recorded in a Fluorolog-3 spectrophotometer. Cyclic voltammograms (CVs) were recorded on a CH166 electrochemical workstation using Ag/AgCl electrode as the reference electrode. 0.1 M solution tetrabutylammonium hexafluorophosphate (TBAPF$_6$) in dichloromethane was used as the supporting electrolyte. The thin film transistors were tested on the Agilent 4155C semiconductor parameter analyzer. Atomic force microscopy (AFM) was performed by a PSIA XE100. Transient absorption. The pump laser light (~100 fs pulse width, ~200 nJ pulse energy) comes from an optical parametric amplifier pumped by a Ti:sapphire femtosecond regenerative amplifier (800 nm, 1 kHz rep-rate). The probe light is a white-light supercontinuum (450-900 nm, ~100 fs pulse width). The pump and probe beams overlapped under a small angle. The detection consists of a pair of high-resolution multichannel detector arrays coupled to a high-speed data acquisition system.

Example 1: Synthesis of PDI Dimer (Compound 1)

Example 1(a): Synthesis of Stannyl-PDI (Building Block 3, Shown in Scheme 1)

A solution of monobromo-PDI (1.67 g, 2.15 mmol) and trans-1,2-bis(tributylstannyl)ethene (3.0 mL, 5.6 mmols) in toluene (40 mL) was degassed under Argon for 45 minutes. Tetrakis(triphenylphosphine)palladium(0) (65 mg, 0.06 mmol) was added. It was further degassed for 30 minutes. The mixture was refluxed for 3 h under Argon. The black reaction mixture was filtered through celite, solvent was removed under reduced pressure. The residue was purified by neutral alumina column chromatography (gradient mobile phase: DCM:hexane 2:8 to DCM:hexane 6:4) to yield 8 as red solid (1.53 g, 1.51 mmol, 70%).

$^1$H NMR (500 MHz, CDCl$_3$): δ 8.83-8.63 (m, 7H), 7.46 (s, 2H), 5.21-5.17 (m, 2H), 2.27-2.23 (m, 4H), 1.85 (m, 4H), 1.65-1.62 (m, 6H), 1.42-1.25 (m, 30H), 1.11-1.09 (m, 6H), 0.95-0.92 (m, 9H), 0.83-0.81 (m, 12H).

$^{13}$C NMR (100 MHz, CDCl$_3$): δ 165.0, 163.9, 147.4, 139.5, 138.7, 134.5, 131.2, 130.0, 129.3, 128.3, 127.7, 127.4, 123.5, 122.8, 54.9, 54.8, 32.5, 31.9, 29.4, 27.5, 26.8, 22.7, 14.2, 13.9, 10.0, 1.2.

IR (ATR) [cm$^{-1}$] 2958, 2923, 2852, 1695, 1655, 1588, 1459, 1397, 1330, 1254, 1179, 809, 738. HRMS (FAB+) m/z (M$^+$) calcd for C$_{60}$H$_{82}$SnN$_2$O$_4$=1014.01; found 1014.50.

Example 1(b): Synthesis of Uncyclized Dimer

Example 1(c): Synthesis of Cyclized Dimer (Compound 1)

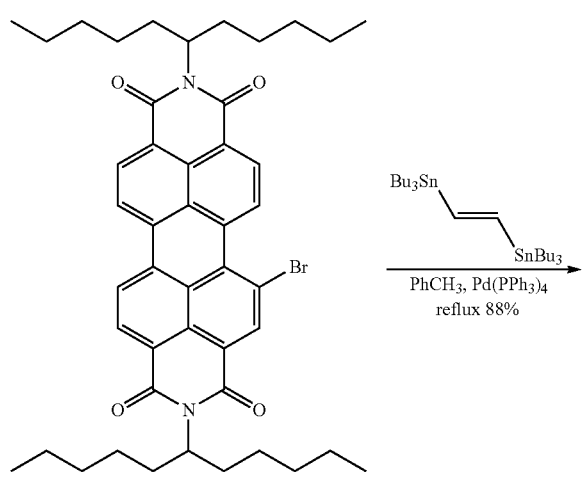

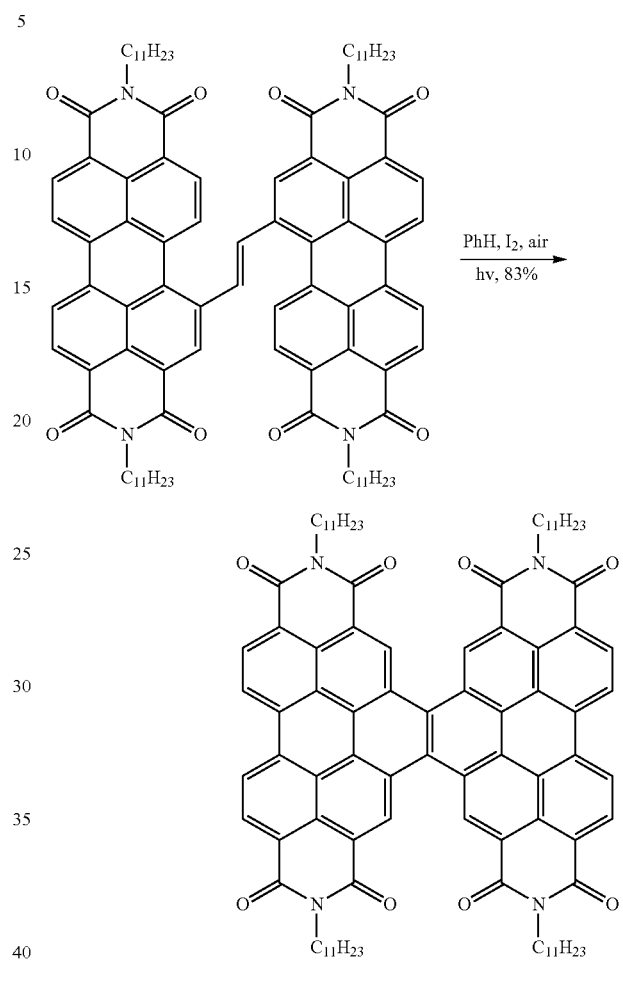

A solution of monobromo-PDI (2.55 g, 3.28 mmol) and trans-1,2-bis(tributylstannyl)ethene (0.90 mL, 1.68 mmols) in toluene (30 mL) was degassed under Argon for 30 minutes. Tetrakis(triphenylphosphine)palladium(0) (100 mg, 0.09 mmol) was added, and the resultant solution was degassed for 20 minutes. The mixture was refluxed for 16 h under Argon. The black reaction mixture was filtered through celite. The solvent was removed under reduced pressure and the product was purified using neutral alumina column chromatography (DCM:hexane 6:4) to yield a dark purple crystalline solid (2.1 g, 1.48 mmol, 88%).

$^1$H NMR (400 MHz, CDCl$_3$, 323K): δ 8.97 (s, 2H), 8.76-8.66 (m, 12H), 8.18 (s, 2H), 5.20-5.16 (m, 4H), 2.26-2.23 (m, 8H), 1.88-1.83 (m, 8H), 1.29-1.24 (m, 48H), 0.83-0.79 (m, 24H).

$^{13}$C NMR (100 MHz, CDCl$_3$, 323K): δ 164.2, 136.0, 134.9, 134.6, 134.3, 133.3, 130.0, 129.4, 128.8, 128.0, 127.4, 123.8, 123.1, 55.1, 55.0, 32.5, 31.9, 26.8, 22.6, 14.1.

IR (ATR) [cm$^{-1}$] 3025, 2966, 2929, 2909, 2842, 2723, 2244, 1628, 1427, 1371.

HRMS (FAB+) m/z (M$^+$) calcd for C$_{94}$H$_{108}$N$_4$O$_8$=1420.82; found 1420.26.

In standard photocyclization glassware, uncyclized dimer (1.0 g, 0.71 mmol) was dissolved in 450 mL benzene and iodine (100 mg) was added. The resultant purple solution was photoirradiated using 450 W mercury lamp for 36 hours with slow bubbling of air through the solution. The resultant pink reaction mixture extracted with saturated sodium bicarbonate (2×400 mL), brine (400 mL) and concentrated under reduced pressure. The residue was treated with 50 mL methanol to crash out red solid. The red solid was purified using column chromatography (gradient mobile phase: DCM:hexane 2:8 to DCM:hexane 6:4) to yield a dark red crystalline solid (0.84 g, 0.59 mmol, 83%).

$^1$H NMR (500 MHz, CDCl$_3$, 323K): δ 10.31 (s, 4H), 9.47-9.45 (d, J=8 Hz, 4H), 9.21 (d, J=8 Hz, 4H), 5.34 (m, 4H), 2.38-2.34 (m, 8H), 1.98 (m, 8H), 1.37-1.31 (m, 48H), 0.87-0.85 (m, 24H).

$^{13}$C NMR (100 MHz, CDCl3, 323K): δ 164.5, 134.2, 130.5, 127.6, 127.0, 126.8, 126.0, 124.5, 124.1, 123.9, 123.8, 123.3, 123.1, 55.3, 32.7, 31.9, 26.9, 22.7, 14.1.

IR (ATR) [cm$^{-1}$] 2957, 2921, 2854, 1699, 1653, 1591, 1447, 1316, 1258, 1168, 912, 809, 737.

HRMS (FAB+) m/z (M$^+$) calcd for C$_{94}$H$_{104}$N$_4$O$_8$=1417.89; found 1417.30.

Example 2: Synthesis of Trimer (Compound 2)

Example 2(a): Bromination of PDI-Dimer (Compound 1)

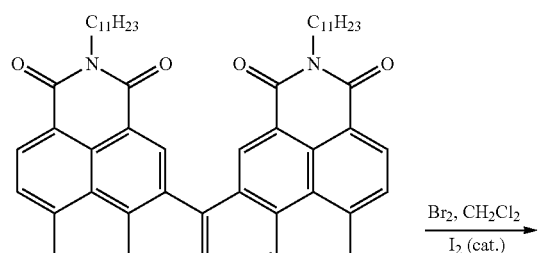

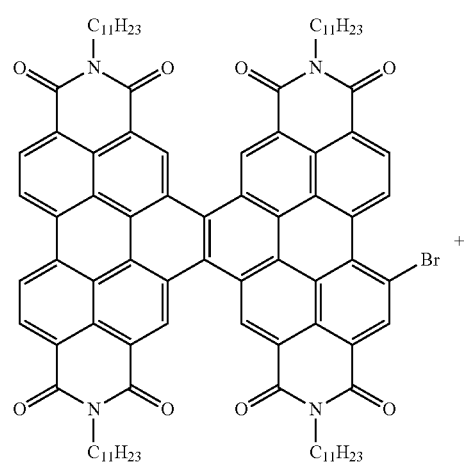

PDI-dimer Compound 1 (1.0 g, 0.71 mmol) was dissolved in 50 mL of dichloromethane. Excess bromine (10 mL) was added, followed by few crystal of iodine. The solution was capped with a rubber septum and stirred at room temperature for 3 days. Bromine was quenched with saturated solution of sodium thiosulfate (300 mL) and extracted with $CH_2Cl_2$ (2×400 mL). The combined organic layer was dried over anhydrous magnesium sulfate and concentrated under reduced pressure. The crude mixture was purified by silica gel column chromatography (gradient mobile phase: DCM:hexane 2:8 to DCM:hexane 6:4). Dibromide (highest rf, 330 mg, 0.21 mmol), monobromide (lower rf, 480 mg, 0.32 mmol) and starting material (PDI-dimer) (lowest rf, 250 mg, 0.18 mmol) were isolated in 30, 45 and 25% yield, respectively.

DiBr-dimer: $^1$H NMR (500 MHz, $CDCl_3$, 323K): δ 10.75-10.73 (d, J=8 Hz, 2H), 10.34 (s, 2H), 10.28 (s, 2H), 9.47 (s, 2H), 9.20-9.18 (d, J=8 Hz, 2H), 5.31 (m, 4H), 2.35 (m, 8H), 1.97 (m, 8H), 1.42-1.32 (m, 48H), 0.85 (m, 24H).

$^{13}$C NMR (100 MHz, $CDCl_3$, 323K): δ 164.1, 138.5, 134.0, 133.3, 132.8, 129.5, 128.5, 127.3, 127.1, 126.9, 126.6, 126.2, 125.7, 125.6, 125.5, 125.4, 123.7, 121.7, 55.6, 55.4, 32.7, 32.6, 31.9, 26.9, 22.7, 14.1.

IR (ATR) [cm$^{-1}$] 2953, 2928, 2863, 1705, 1662, 1597, 1446, 1321, 1242, 1185, 819, 808, 762.

HRMS (FAB+) m/z (M$^+$) calcd for $C_{94}H_{102}Br_2N_4O_8$=1575.67; found 1575.20.

MonoBr-dimer: $^1$H NMR (500 MHz, CDCl3): δ 10.73-10.71 (d, J=8 Hz, 1H), 10.33 (m, 4H), 9.47-9.45 (d, J=8 Hz, 3H), 9.20 (m, 3H), 5.32 (m, 4H), 2.34 (m, 8H), 1.96 (m, 8H), 1.43-1.30 (m, 48H), 0.85 (m, 24H).

$^{13}$C NMR (100 MHz, $CDCl_3$, 323K): δ 164.4, 134.2, 133.3, 132.8, 130.6, 128.4, 127.6, 127.5, 127.1, 127.0, 126.9, 126.8, 126.6, 126.2, 126.1, 126.0, 125.6, 125.5, 125.4, 124.5, 124.2, 124.0, 121.7, 55.6, 55.3, 32.7, 32.6, 31.9, 26.9, 22.7, 14.1.

IR (ATR) [cm$^{-1}$] 2953, 2931, 2863, 1708, 1669, 1590, 1443, 1328, 1256, 1181, 811, 747, 761.

HRMS (FAB+) m/z (M$^+$) calcd for $C_{94}H_{103}BrN_4O_8$=1496.78; found 1496.21.

Example 2(b): Synthesis of Trimer (Compound 2) Method a Using PDI-Dimer

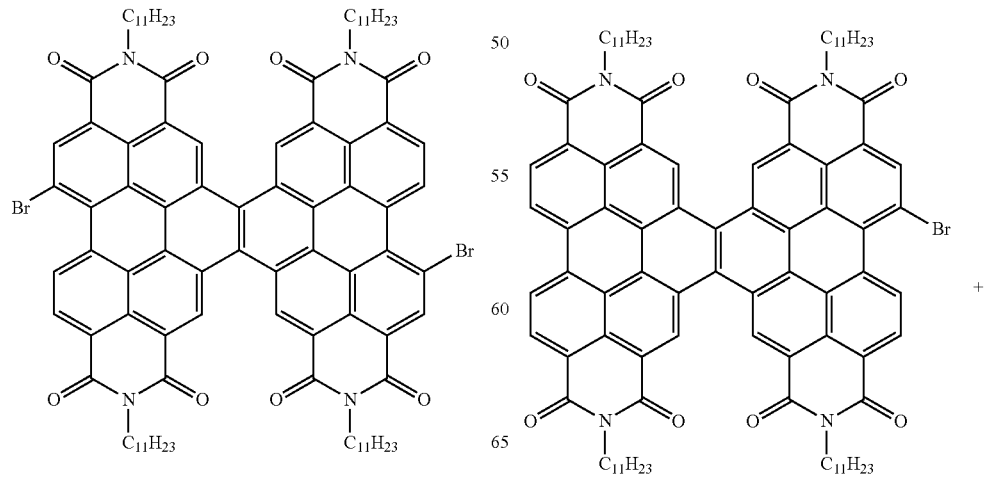

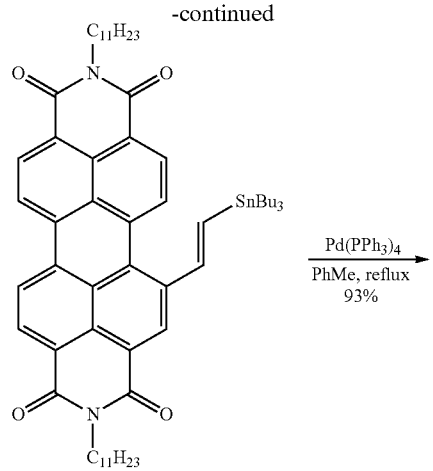

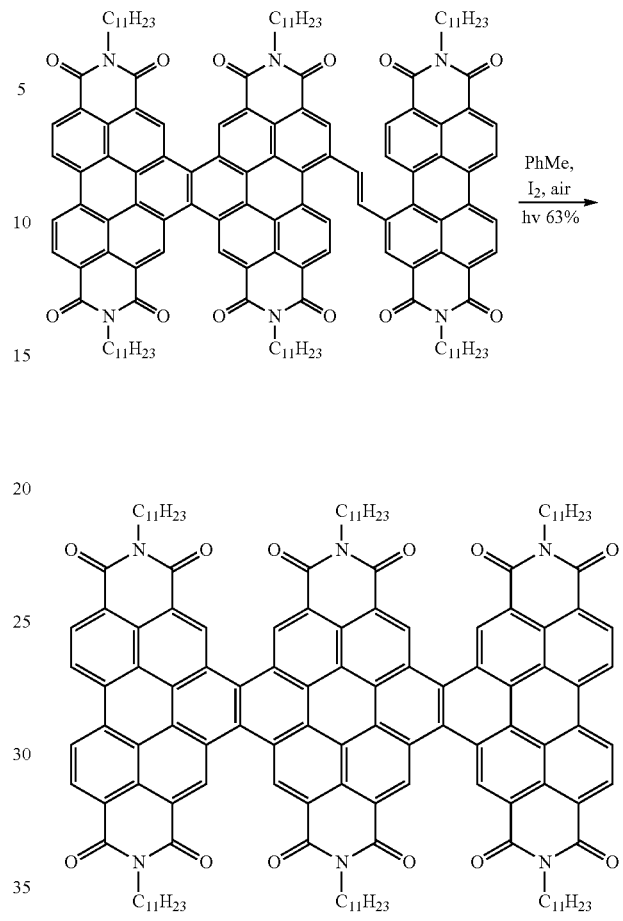

A solution of Br-PDI-dimer (0.26 g, 0.17 mmol) and stannyl-PDI (Example 1) (0.26 g, 0.26 mmol) in toluene (10 mL) was degassed under Argon for 30 minutes. Solid tetrakis(triphenylphosphine)palladium(0) (30 mg, 0.03 mmol) was added, and the solution was further degassed for 15 minutes. The mixture was refluxed overnight (16 h) under Argon. The black reaction mixture was filtered through celite, and the solvent was removed under reduced pressure. The black residue was purified using neutral alumina column chromatography (gradient mobile phase: DCM:hexane 2:8 to DCM:hexane 6:4) to yield a purple crystalline solid (0.35 g, 93%).

$^1$H NMR (500 MHz, CDCl$_3$): δ 10.37 (s br, 4H), 9.52-9.40 (m, 4H), 9.22-9.12 (m, 4H), 8.84-8.77 (m, 6H), 8.70-8.67 (d, J=16 Hz, 1H), 8.45-8.42 (d, J=16 Hz, 1H), 5.35-5.22 (m, 6H), 2.37-2.28 (m, 12H), 1.96-1.86 (m, 12H), 1.32-1.28 (m, 72H), 0.88-0.81 (m, 36H).

$^{13}$C NMR (100 MHz, CDCl$_3$, 323K): δ 164.3, 137.1, 136.1, 135.3, 134.8, 134.6, 134.2, 134.1, 134.0, 133.5, 132.3, 131.2, 130.1, 129.3, 128.8, 128.0, 127.4, 127.1, 126.7, 126.6, 126.5, 126.0, 125.9, 125.8, 125.3, 124.4, 123.8, 123.1, 55.2, 55.0, 54.9, 32.6, 32.5, 32.4, 31.8, 26.8, 26.7, 26.6, 22.6, 22.5, 14.0.

IR (ATR) [cm$^{-1}$] 2939, 2925, 2858, 1698, 1657, 1593, 1448, 1411, 1320, 1250, 1182, 1122, 811 HRMS (MALDI-TOF) m/z (M$^+$) calcd for C$_{142}$H$_{158}$N$_6$O$_{12}$=2140.81, (M+H$^+$)=2141.8; found 2141.1.

In standard photocyclization glassware, uncyclized trimer (0.4 g, 0.19 mmol) was dissolved in 420 mL anhydrous toluene, followed by addition of iodine (120 mg). The resultant purple solution was photoirradiated using 450 W mercury lamp for 20 hours with slow bubbling of air through the solution. Heat was applied to the reaction mixture by minimal cooling of the inner jacketed glass tubing that houses the lamp. The resultant reddish reaction mixture extracted with saturated sodium bicarbonate (2×400 mL), and brine (400 mL). The organic layer was concentrated under reduced pressure. The black residue treated with methanol (40 mL) to crash out dark red solid that was purified using column chromatography (gradient mobile phase: DCM:hexane 0:10 to DCM:hexane 6:4) to yield a dark red crystalline solid (0.26 g, 0.12 mmol, 63%).

$^1$H NMR (400 MHz, CDCl$_3$, 323K): δ 10.96 (s, 4H), 10.65 (s, 4H), 9.55-9.54 (d, J=8 Hz, 4H), 9.26 (d, J=8 Hz, 4H), 5.52 (m, 2H), 5.40 (m, 4H), 2.53-2.42 (m, 12H), 2.12-2.02 (m, 12H), 1.41-1.39 (m, 72H), 0.89 (m, 36H).

$^{13}$C NMR (100 MHz, CDCl$_3$, 323K): δ 164.7, 134.1, 132.7, 130.4, 127.5, 127.4, 127.1, 127.0, 126.0, 125.0, 124.6, 124.5, 123.9, 123.1, 122.2, 55.6, 55.2, 32.7, 32.6, 31.8, 26.9, 26.8, 22.6, 14.0.

IR (ATR) [cm$^{-1}$] 2952, 2928, 2856, 1708, 1597, 1450, 1177.

MS (MALDI-TOF) m/z (M$^+$) calcd for C$_{142}$H$_{154}$N$_6$O$_{12}$=2136.8, (M+H$^+$)=2137.8; found 2137.7.

Example 2(c): Synthesis of Trimer (Compound 2) Method B Using diBr-PDI

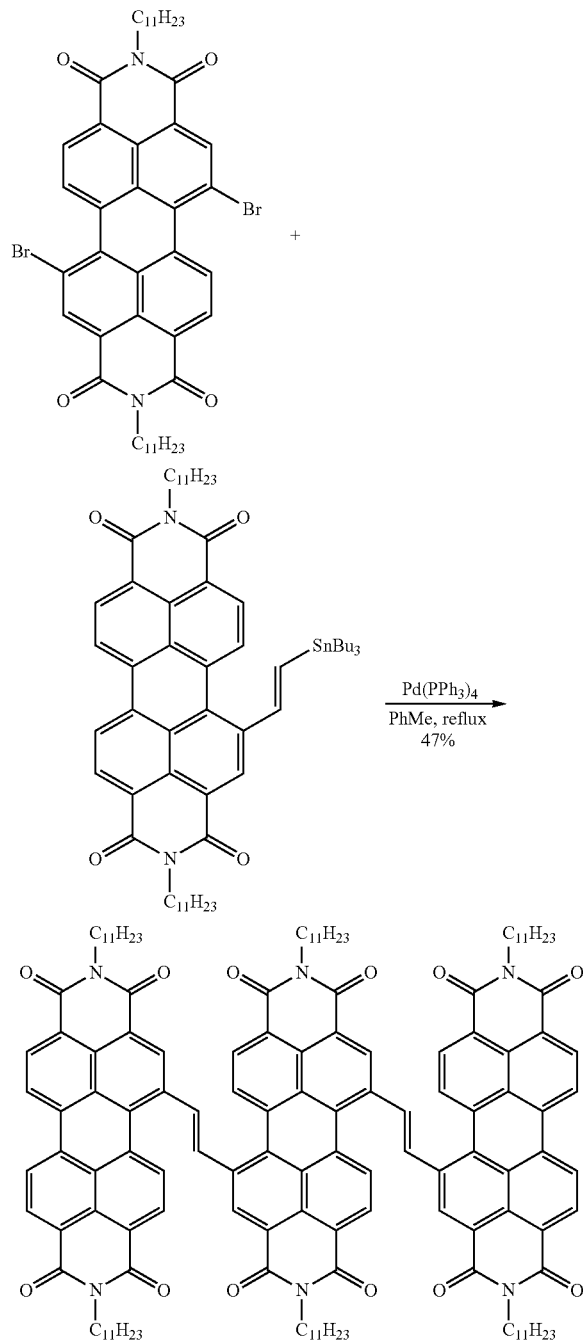

A solution of diBr-PDI (0.10 g, 0.12 mmol) and stannyl-PDI (Example 1) (0.28 g, 0.28 mmol) in toluene (6 mL) was degassed under Argon for 30 minutes. Solid tetrakis(triphenylphosphine)palladium(0) (30 mg, 0.03 mmol) was added, and the solution was further degassed for 20 minutes. The mixture was refluxed overnight (16 h) under Argon. The black reaction mixture was filtered through celite, and the solvent was removed under reduced pressure. The residue was purified using neutral alumina column chromatography (gradient mobile phase: DCM:hexane 1:9 to DCM:hexane 8:2) to yield a purple crystalline solid (120 mg, 0.056 mmol, 47%).

$^1$H NMR (500 MHz, CDCl$_3$): δ 9.09-9.05 (m, 4H), 8.78-8.67 (m, 16H), 8.27 (s, H), 5.22-5.19 (m, 6H), 2.27-2.25 (m, 12H), 1.86-1.85 (m, 12H), 1.30-1.28 (m, 72H), 0.84-0.82 (m, 36H).

$^{13}$C NMR (100 MHz, CDCl$_3$, 323K): δ 164.2, 136.0, 135.5, 134.8, 134.7, 134.6, 134.5, 134.4, 134.2, 134.0, 133.3, 132.8, 130.2, 130.1, 129.9, 129.3, 128.8, 128.7, 128.2, 128.0, 127.9, 127.3, 123.7, 123.1, 55.0, 54.9, 32.4, 31.7, 26.6, 22.5, 13.9.

IR (ATR) [cm$^{-1}$] 2924, 2856, 1698, 1655, 1590, 1455, 1409, 1329, 1249, 811.

MS (MALDI-TOF) m/z (M$^+$) calcd for C$_{142}$H$_{162}$N$_6$O$_{12}$=2144.84; found 2144.80.

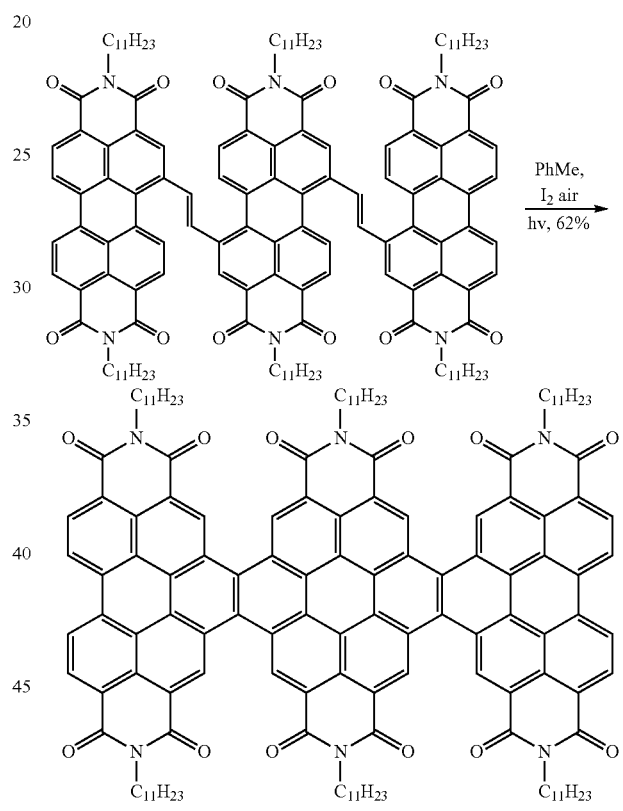

In standard photocyclization glassware, uncyclized trimer (84 mg, 0.04 mmol) was dissolved in 300 mL anhydrous toluene, followed by addition of iodine (15 mg, 0.10 mmol). The resultant purple solution was photoirradiated using 450 W mercury lamp for 9 hours with slow bubbling of air through the solution. Heat was applied to the reaction mixture by minimal cooling of the inner jacketed glass tubing that houses the lamp. The resultant reddish reaction mixture was extracted with saturated sodium bicarbonate (2×300 mL) and brine (300 mL). The organic layer was concentrated under reduced pressure. The resultant solid was treated with methanol (15 mL) to crash out dark red solid that was purified using silica gel column chromatography (gradient mobile phase: DCM:hexane 2:8 to DCM:hexane 6:4) to isolate (Compound 2) as dark red crystalline solid (54 mg, 0.025 mmol, 62%).

Example 3: Synthesis of Tetramer (Compound 3)

Example 3(a): Synthesis of Tetramer (Compound 3) Method a Using PDI-Dimer

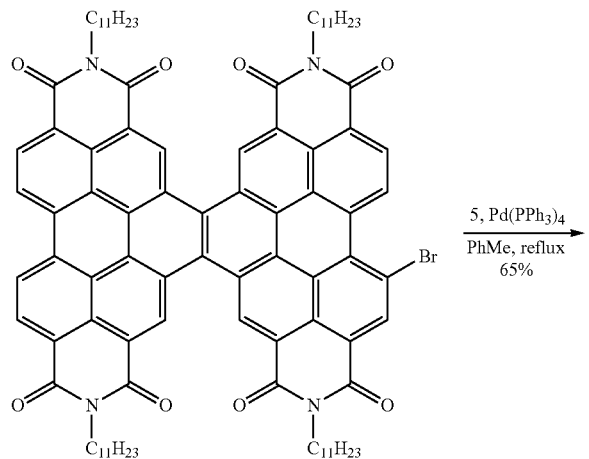

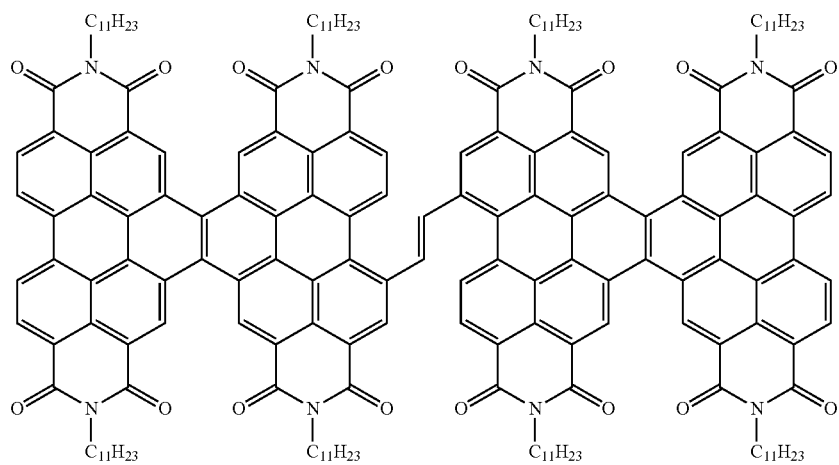

A solution of Br-dimer (410 mg, 0.274 mmol) and trans-1,2-bis(tributylstannyl)ethene (100 mg, 0.165 mmols) in toluene (8 mL) was degassed under Argon for 30 minutes. Tetrakis(triphenylphosphine)palladium(0) (20 mg, 0.02 mmol) was added. It was further degassed for 20 minutes. The mixture was refluxed overnight under Argon. The black reaction mixture was filtered through celite, solvent was removed under reduced pressure. The residue was purified by column chromatography using neutral alumina as stationary phase (gradient mobile phase: DCM:hexane 1:9 to DCM:hexane 7:3) to yield a purple crystalline solid (306 mg, 0.107 mmol, 65%).

$^1$H NMR (400 MHz, CDCl$_3$, 323K): δ 10.45-10.41 (m, 8H), 9.76-9.73 (d, J=8 Hz, 2H), 9.64 (br s, 2H), 9.50-9.47 (d, J=8 Hz, 4H), 9.32-9.30 (d, J=8 Hz, 2H), 9.25-9.23 (d, J=8 Hz, 4H), 8.93 (s, 2H), 5.38-5.37 (m, 8H), 2.42-2.40 (m, 16H), 2.01-2.00 (m, 16H), 1.41-1.34 (m, 98H), 0.91-0.86 (m, 48H).

$^{13}$C NMR (100 MHz, CDCl$_3$, 323K): δ 164.6, 137.1, 135.5, 134.2, 134.1, 132.6, 130.2, 127.5, 127.1, 126.8, 126.6, 126.0, 125.9, 125.4, 124.5, 123.9, 123.0, 55.2, 32.6, 31.8, 26.8, 22.6, 14.0.

IR (ATR) [cm$^{-1}$] 2955, 2923, 2854, 1698, 1660, 1594, 1448, 1318, 1258, 1179, 808.

HRMS (FAB+) m/z (M$^+$) calcd for C$_{190}$H$_{208}$N$_8$O$_{16}$=2859.73, (M+H$^+$)=2860.73; found 2860.74.

Example 3(b): Synthesis of Tetramer (Compound 3) Method B Using diBr-Dimer

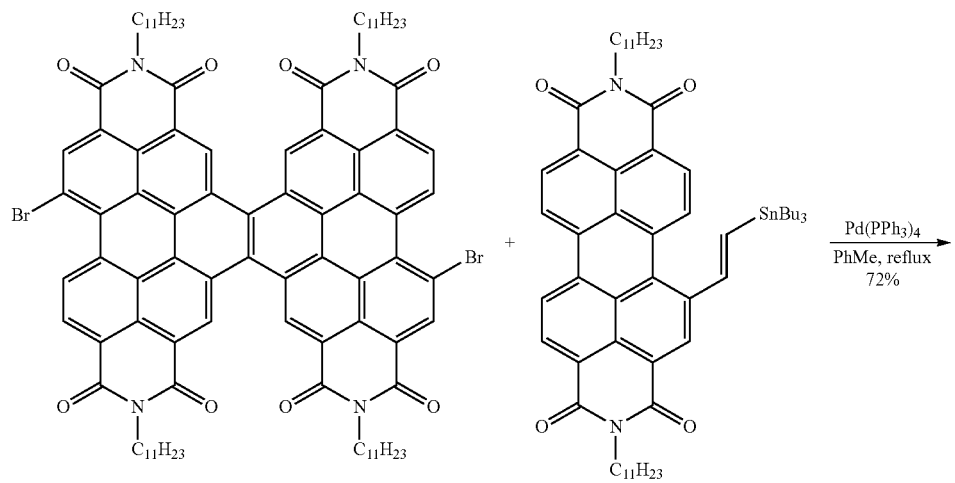

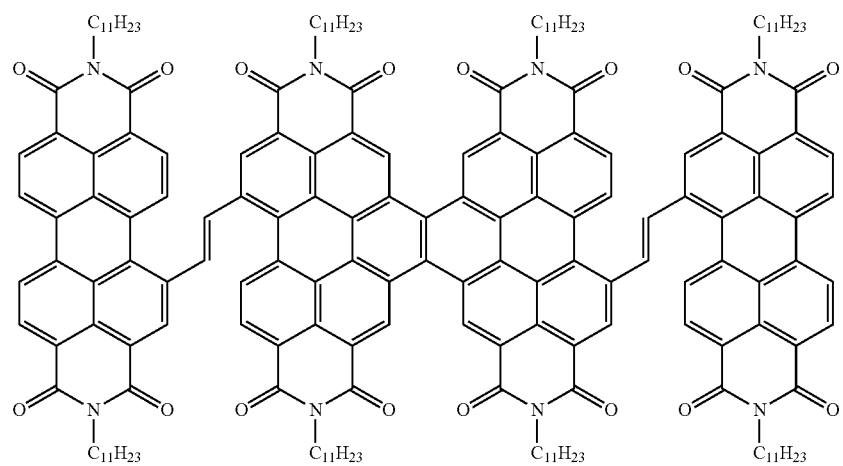

A solution of diBr-dimer (250 mg, 0.16 mmol) and stannyl-PDI (Example 1) (400 mg, 0.39 mmol) in toluene (10 mL) was degassed under Argon for 30 minutes. Solid tetrakis(triphenylphosphine)palladium(0) (20 mg, 0.02 mmol) was added, and the solution was further degassed for 20 minutes. The mixture was refluxed overnight (20 h) under Argon. The black reaction mixture was filtered through plug of celite, and the solvent was removed under reduced pressure. The residue was purified using neutral alumina column chromatography (gradient mobile phase: DCM: hexane 0:10 to DCM:hexane 7:3) to yield a purple crystalline solid (330 mg, 0.115 mmol, 72%).

$^1$H NMR (500 MHz, CDCl$_3$): δ 10.45 (s, 4H), 9.54-9.52 (d, J=8 Hz, 2H), 9.42 (s, 2H), 9.23-9.14 (m, 4H), 8.85-8.75 (m, 12H), 8.72-8.68 (d, J=15 Hz, 2H), 8.47-8.44 (d, 3=15 Hz, 2H), 5.36 (m, 4H), 5.24 (m, 4H), 2.39-2.28 (m, 16H), 1.97-1.89 (m, 16H), 1.30 (m, 96H), 0.85 (m, 48H).

$^{13}$C NMR (100 MHz, CDCl$_3$, 323K): δ 164.2, 137.1, 136.0, 135.2, 134.9, 134.8, 134.7, 134.3, 134.1, 133.6, 132.3, 130.1, 130.0, 129.4, 128.8, 128.0, 127.4, 127.3, 127.1, 126.7, 126.6, 126.5, 126.0, 125.9, 125.3, 123.8, 123.1, 55.3, 55.0, 54.9, 32.5, 32.4, 31.8, 26.7, 26.6, 22.5, 14.0.

IR (ATR) [cm-1] 2957, 2925, 2854, 1699, 1657, 1592, 1447, 1409, 1321, 1246, 1179, 811, 749.

MS (MALDI-TOF) m/z (M$^+$) calcd C$_{190}$H$_{212}$N$_8$O$_{16}$=2863.76; (M+H$^+$)=2864.7; found 2864.2.

Example 3(c): Synthesis of Cyclized Tetramer (Compound 3)

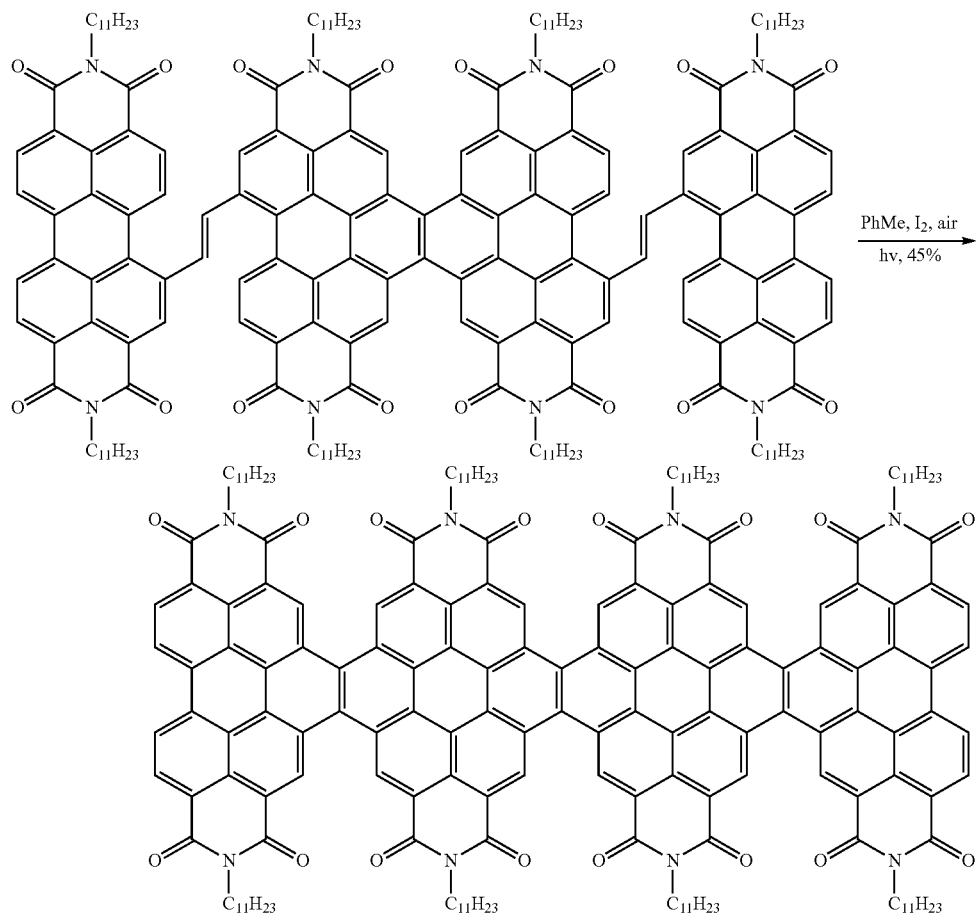

In standard photocyclization glassware, uncyclized tetramer (50 mg, 0.017 mmol) was dissolved in 250 mL toluene, followed by addition of iodine (15 mg, 0.10 mmol). The resultant purple solution was photoirradiated using 450 W mercury lamp for 9 hours with slow bubbling of air through the solution. Heat was applied to the reaction mixture by minimal cooling of the inner jacketed glass tubing that houses the lamp. The resultant reddish reaction mixture was extracted with saturated sodium bicarbonate (300 mL) and brine (300 mL). The organic layer was concentrated under reduced pressure. The residue was treated with methanol (15 mL) to crash out dark red solid that was purified using silica gel preparative column chromatography (chloroform:hexane 7:3) to give a dark red crystalline solid (22 mg, 0.007 mmol, 45%).

$^1$H NMR (400 MHz, CDCl$_3$, 323K): δ 11.28 (s, 4H), 11.01 (s, 4H), 10.70 (s, 4H), 9.57-9.55 (d, J=8 Hz, 4H), 9.31-9.29 (d, J=8 Hz, 4H), 5.59 (m, 4H), 5.42 (m, 4H), 2.59-2.57 (m, 8H), 2.46-2.44 (m, 8H), 2.17 (m, 8H), 2.05 (m, 8H), 1.61-1.27 (m, 94H), 0.92-0.90 (m, 48H).

$^{13}$C NMR (100 MHz, CDCl$_3$, 323K): δ 164.8, 134.2, 132.9, 130.5, 127.8, 127.6, 127.4, 127.1, 126.0, 125.1, 124.7, 124.5, 123.1, 122.3, 55.7, 55.3, 32.7, 32.6, 31.9, 26.9, 26.8, 22.6, 14.0.

IR (ATR) [cm$^{-1}$] 2953, 2924, 2863, 1705, 1662, 1597, 1447, 1317, 1235, 1181, 927, 811.

MS (MALDI-TOF) m/z (M$^+$) calcd for C$_{190}$H$_{204}$N$_8$O$_{16}$=2855.7; found 2855.9.

Example 4: Thermal Gravimetric Analysis

Figure 4:
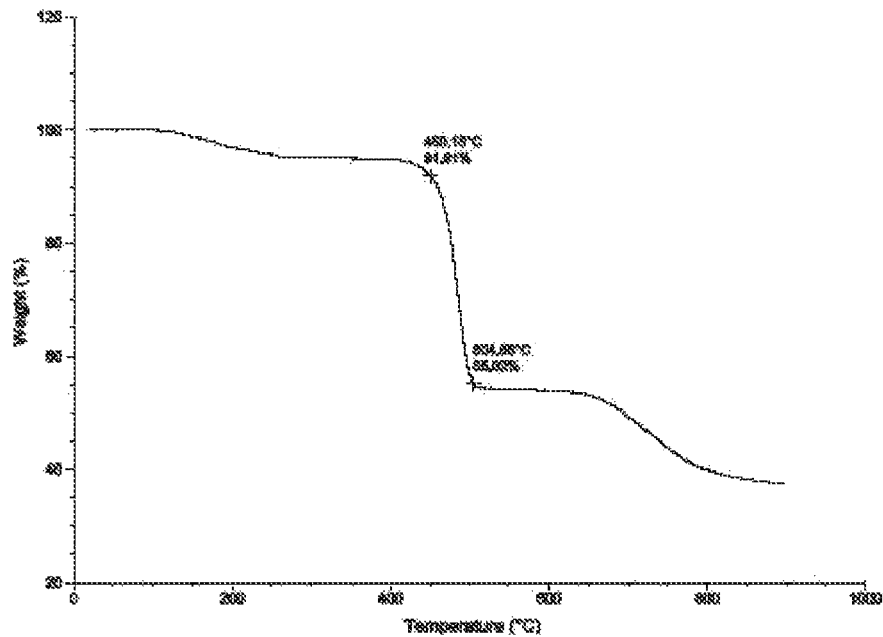
FIG. 4 (A)-(C) are representative thermal gravimetric analysis (TGA) plots of (A) the dimer of Compound 1; (B) the trimer of Compound 2; and (C) the tetramer of Compound 3.
Figure 4:
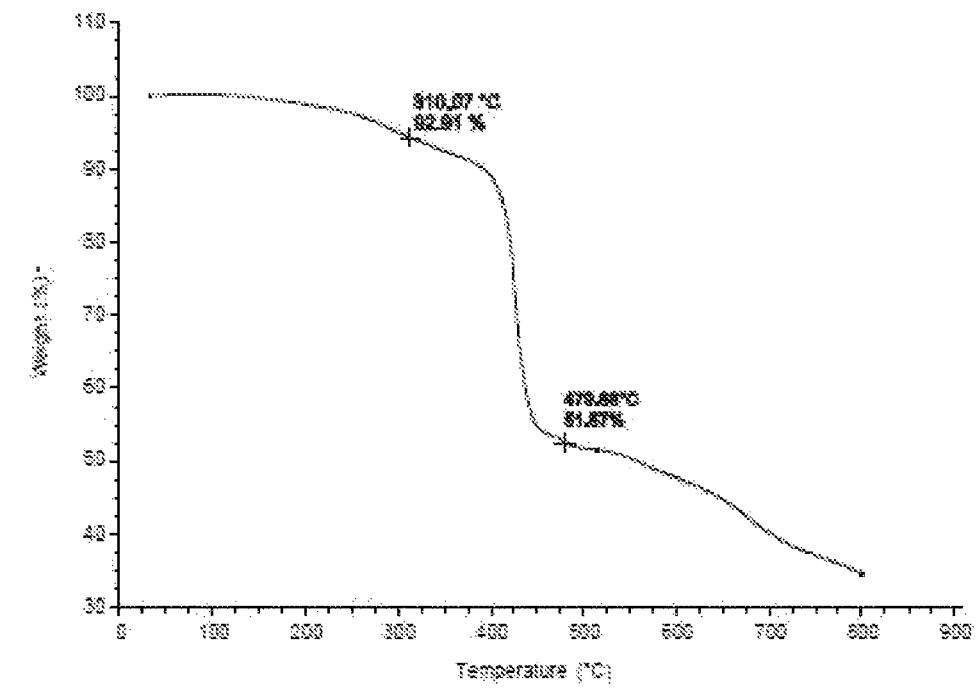
Figure 4:
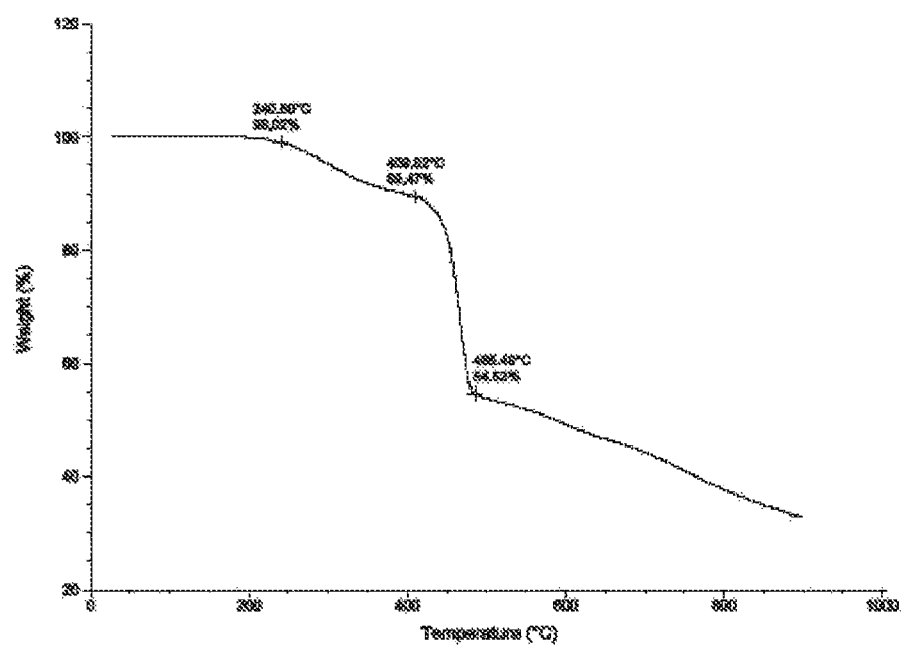

One advantage of a nonplanar core is that it maintains its solubility and processability for the longer oligomers. The oligomers were thermally robust; TGA (FIG. 4) does not show any detectable decomposition below 400° C. The oligomers were also resistant to oxidation as evident by absence of any oxidation peak in CV up to +1 V in Bu$_4$NPF$_6$ solution (0.1 M) as the electrolyte in dichloromethane (vide infra).

Example 5: Confirmation of the Ribbons

As these oligomer compounds were unable to grow as single crystals in sufficient quality for Xray structure determination, DFT optimized structures were relied upon to gain insight into molecular conformations of the oligomers. To simplify the calculations, the C$_{11}$H$_{23}$ side chain attached to each nitrogen atom was replaced with a single H. The influence of alkyl N-substituents on the electronic structures was negligible due to the nodes of frontier orbitals at the imide nitrogens. The nonplanar conformation of the ribbons was a consequence of repulsion between the two C—H bonds on the inner bay position of adjacent PDI units. This steric repulsion caused them to twist away from planarity. This can be seen clearly for the model of the dimer shown in FIG. 1A. The dimer had a helical twist along ribbon axis meaning that the dimer exists as a mixture of enantiomers.

Figure 5:
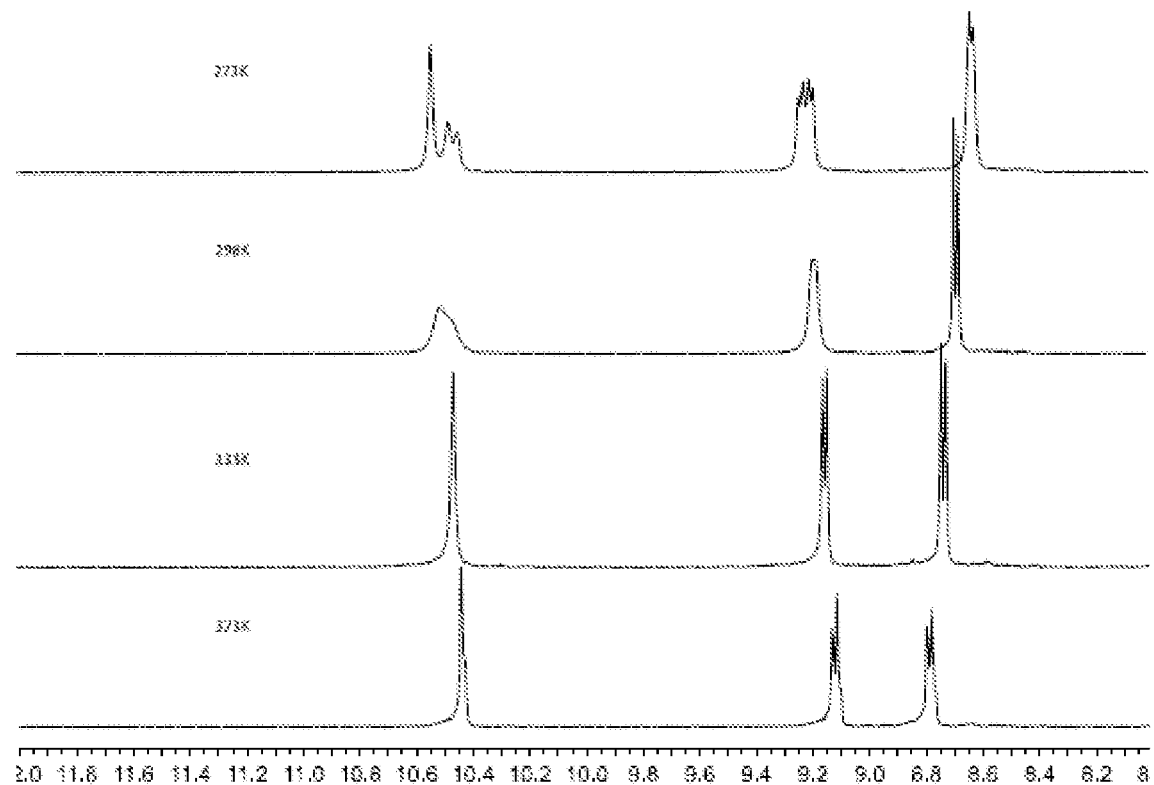
FIG. 5 (A)-(C) are representative VT-NMR of (A) the dimer of Compound 1; (B) the trimer of Compound 2; and (C) the tetramer of Compound 3.
Figure 5:
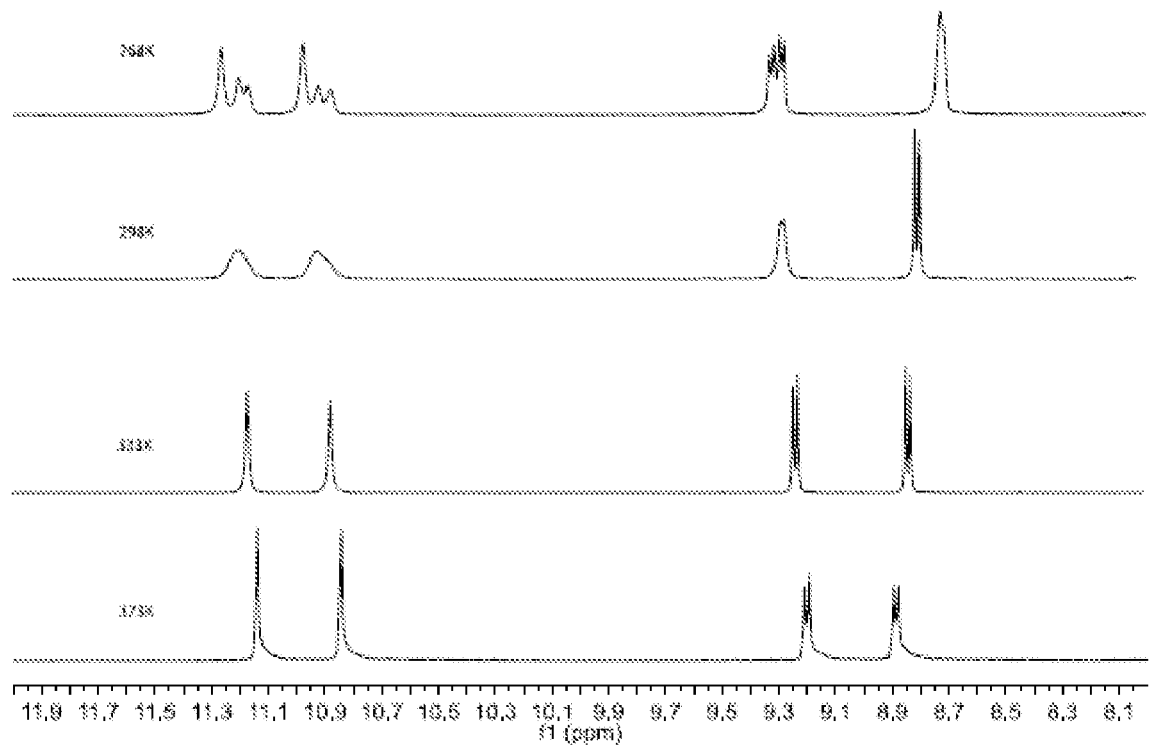
Figure 5:
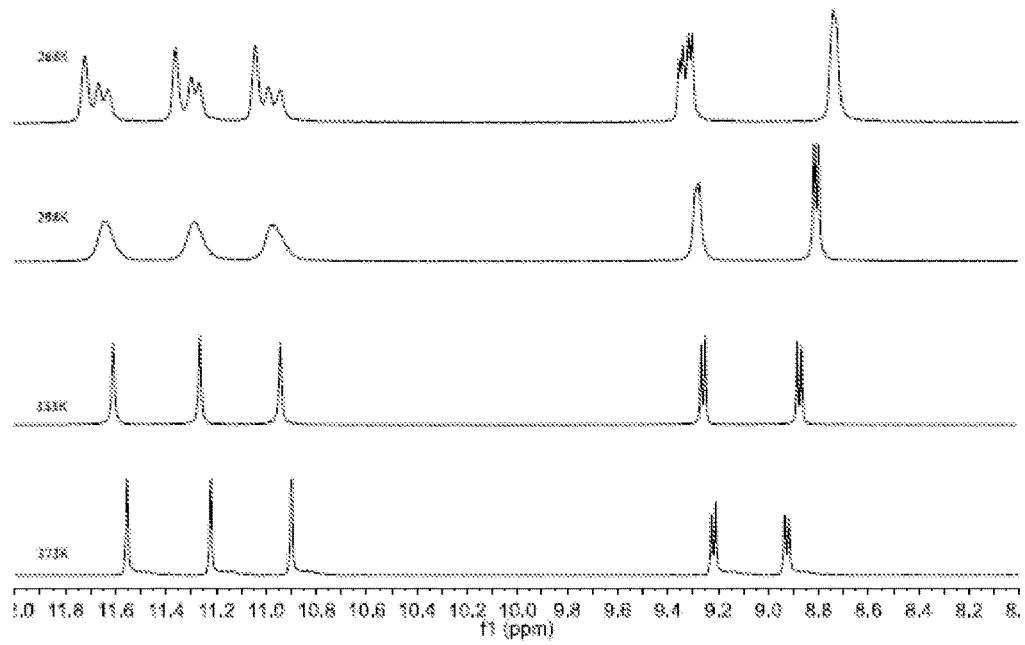

Variable temperature $^1$H NMR (between −5 to 100° C.) was performed to determine if there was conformational interchange on the NMR time scale; however, the only detectable dynamics for Compounds 1-3 were due to the hindered rotation of the amide N—CHR bond (FIG. 5 A-C). The broadening of the $^1$H NMR resonances due to these rotational isomers obscured details about which conformer exists at room temperature.

The trimer structure consisted of two conformational options (FIG. 1B). When the helicity at each of the fusion points has the same handedness, the ribbon was helical. The pitch of this helix was 7.0 nm/turn. This is the "Helical" conformation shown in FIG. 1B. If the helical sense in the first junction between PDIs is opposite to that of the second junction, then the ribbon is achiral or called the "Waggling" conformation in FIG. 1B.

DFT calculations revealed that the tetramer (Compound 3) has three possible conformers. Two of these conformations were directly analogous to those from the trimer, the helical and waggling conformers (FIG. 1C). Now having three ring junctions, the tetramer can adopt a conformation that is a mixture of helical and waggling or called a "Mixed" conformer. The relative energies of each of the conformers was calculated, and for both the trimer and tetramer all of the competing conformations were isoenergetic.

Example 6: Electrical Measurements

Figure 6:
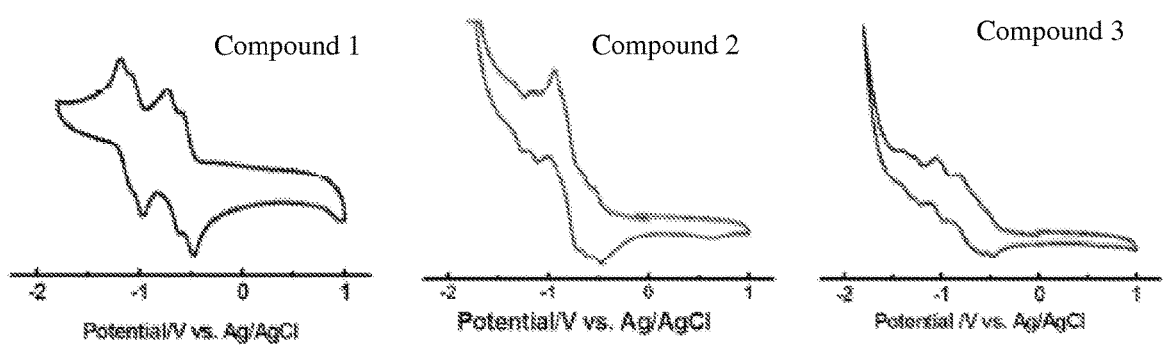
FIG. 6 is representative cyclic voltammograms for the dimer (Compound 1; left), trimer (Compound 2; middle); and tetramer (Compound 3; right).

Electrochemical measurements in $CH_2Cl_2$ with $Bu_4NPF_6$ (0.1 M) as the supporting electrolyte revealed that Compounds 1-3 can accept electrons (FIG. 6). The trimer and tetramer can accept up to five electrons. From the potential of the first reduction peak, the LUMO was estimated to be −3.77, −3.82, and −3.84 eV for Compound 1, Compound 2, and Compound 3, respectively. These values are slightly lower than the LUMO level of PDI monomer and close to that of common n-type materials such as [6,6]-phenyl-C61-butyric acid methyl ester (PC60BM).

Figure 7:
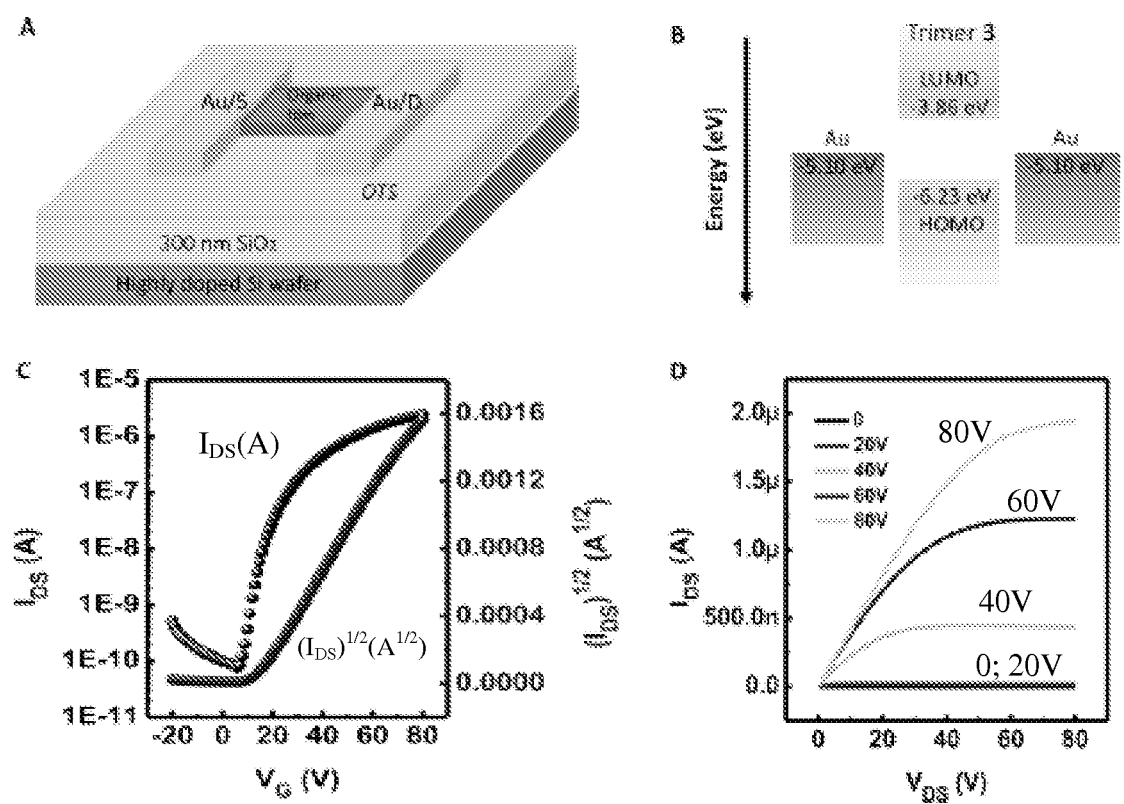
FIG. 7 represents a device according to some embodiments of the disclosed subject matter, in particular for Compound 2: (A) Schematic of an FET device structure; (B) Energy diagram for Au/trimer/AU; (C) Transfer and (D) output characteristics of FET for Compound 2.
Figure 8:
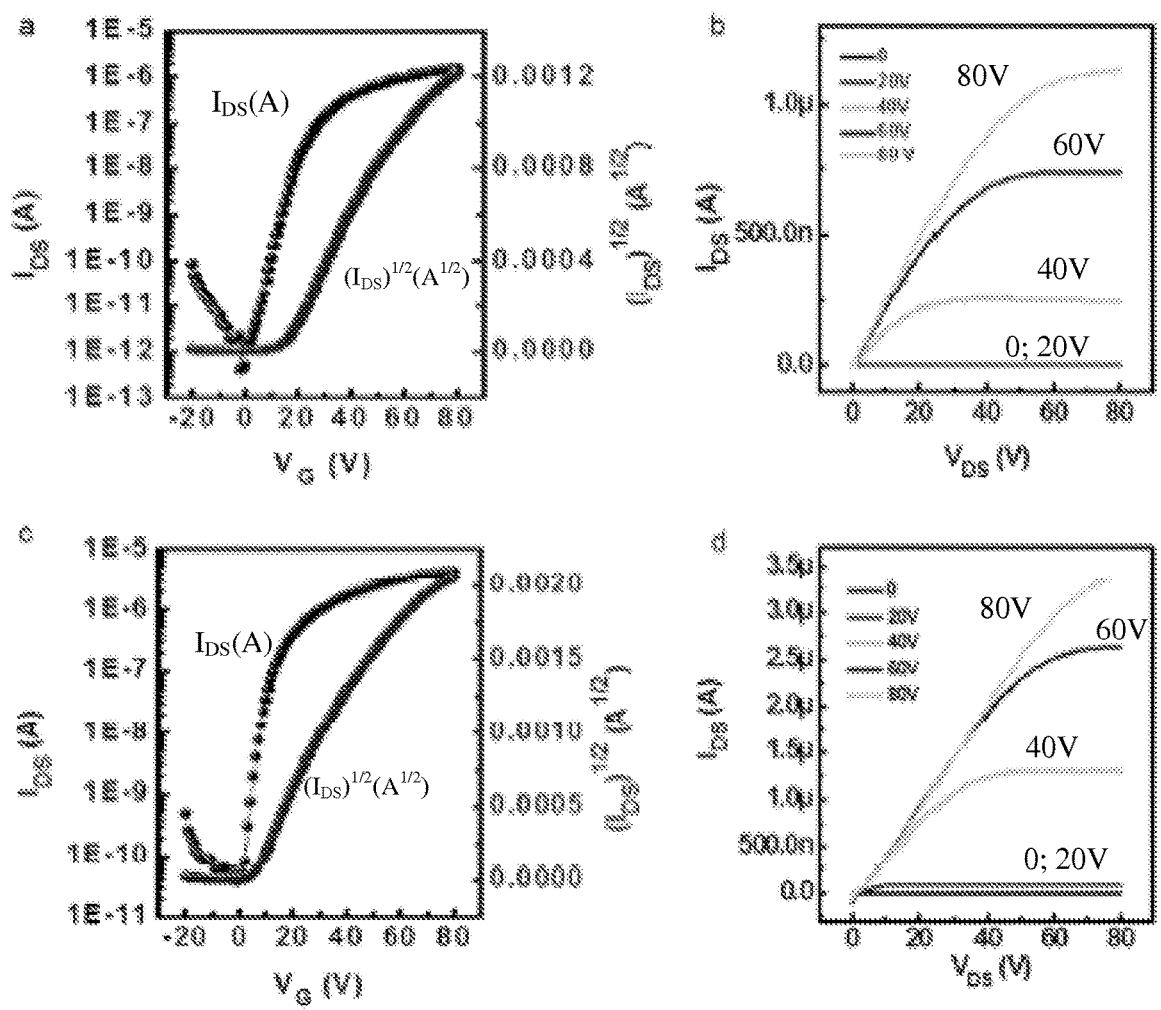
FIG. 8 is representative transfer (a and c) and output (b and d) characteristics of TFTs for Compound 1(a-b) and Compound 3 (c-d).

Field-effect transistors (FETs) were constructed using Compounds 1-3 as the semiconductor to compare their ability to transport electrons. The substrate (300 nm of $SiO_2$ on a Si wafer) was first treated with octadecyltrichlorosilane (OTS) in order to passivate traps on the $SiO_2$ surface. Next, Compounds 1-3 were spun-casted as films of onto this surface. The thickness of the organic films was 15-20 nm. Transistors made from thicker films (40-60 nm) exhibited nonlinear characteristic at low bias voltage. Au source and drain electrodes were deposited on the film to make a bottom-gate and top-contact configuration with W=105 μm and L=15 μm. The schematic of the FET device structure is shown in FIG. 7A along with the corresponding energy level diagram (FIG. 7B). The samples were annealed (under inert atmosphere) to optimize device performance. All of the oligomers form n-type, electron-transporting semiconductors. The typical transfer and output curves for Compound 2 are shown in FIG. 7C,D. The FET characteristics for Compounds 1 and 3 are similar to those of Compound 2 (see Table 1); FIG. 8 contains the IV curves for Compounds 1 and 3.

TABLE 1

|   | Mobility[a]/cm$^2$V$^{-1}$s$^{-1}$ | Log($I_{On}/I_{off}$) | $V_{th}$/V |
|---|---|---|---|
| 2 | 0.02[b] | ~6 | 11 |
| 3 | 0.04[c] | ~5 | 10 |
| 4 | 0.05[d] | ~5 | 8 |

[a]Measured in nitrogen-filled glovebox.
[b]Annealed at 160° C. for 10 min.
[c]Annealed at 240° C. for 10 min.
[d]Annealed at 200° C. for 10 min.
Annealing temperatures reported here are the optimal annealing conditions for the corresponding materials.

The mobility was calculated in the saturation regime using IDS=(W/2 L) Ciμ (VG−VT)2, where W and L are the width and length of the channel, Ci (11.5 nFcm-2), μ, and VT correspond to the capacitance per unit area of the gate insulator, the field effect mobility, and the threshold voltage, respectively. The mobility increased from dimer (Compound 1) to tetramer (Compound 3). The FETs for Compound 3 exhibited the highest electron mobility, 0.05 cm$^2$ V-1 s-1. The average threshold voltage varied from 11 to 8 V.

Figure 9:
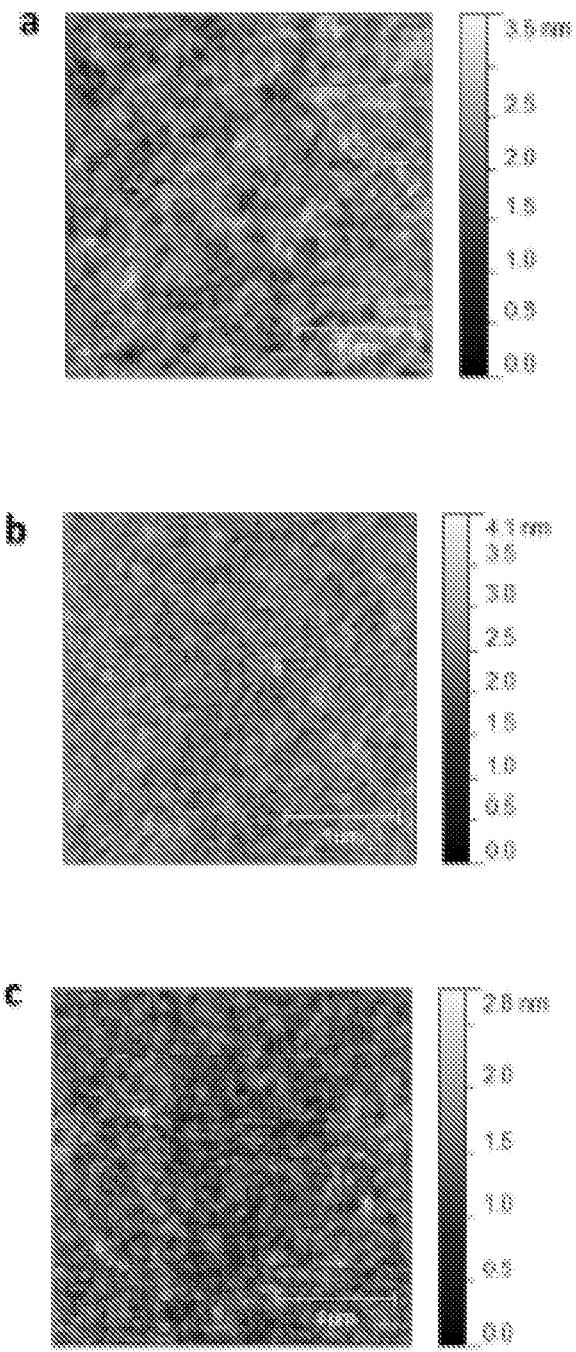
FIG. 9 is representative AFM height images of spin-cast films from (a) Compound 1 (annealed at 160° C.), (b) Compound 2 (annealed at 240° C.) and (c) Compound 3 (annealed at 200° C.).

It was previously reported that the mobility for PDI monomers with similar structure to 1 range from 0.1 to 2 cm$^2$ V-1 s-1.46-49 PDIs featuring planar structure show strong self-aggregation, which facilitates intermolecular charge carrier transport. Here, all of the Compounds 1-3 formed very smooth films as evident from their AFM images (FIG. 9) with RMS of 0.32, 0.34, and 0.27 nm, respectively. No significant crystalline grains were observed. This is probably due to the twisted structures of Compounds 1-3 that reduces long-range crystallinity.

Example 7: Electronic Structure

Figure 3:
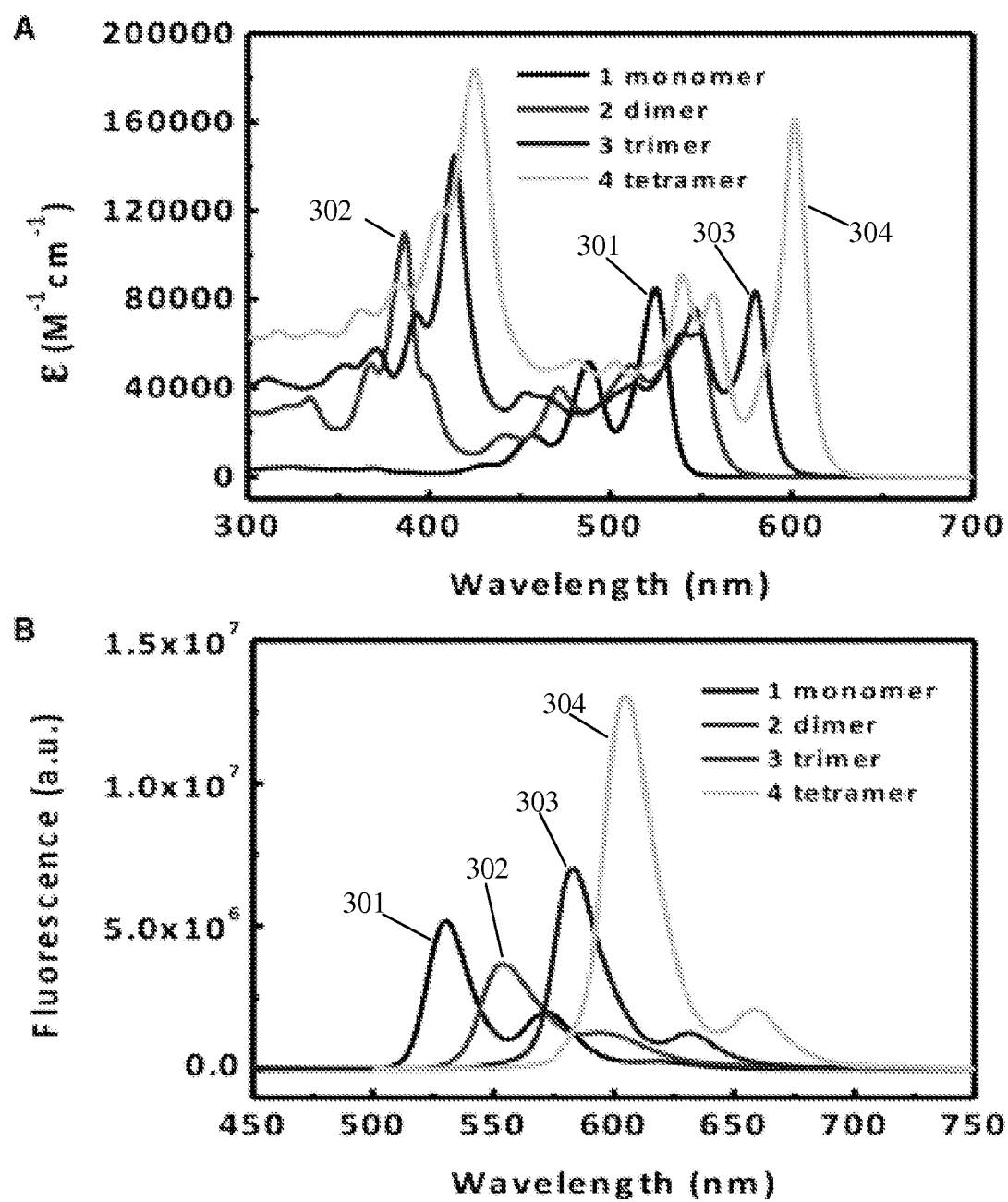
FIG. 3 is a representative: (A) UV-vis absorption spectra of monomer (301), dimer (Compound 1; 302), trimer (Compound 2; 303), and tetramer (Compound 3; 304) ($1\times10^{-5}$ M concentration in dichloromethane with a path length l=1 cm) (B) Fluorescence spectra of the monomer excited at 488 nm, (Compound 1) excited at 386 nm, (Compound 2) excited at 414 nm and (Compound 3) excited at 425 nm ($1\times10^{-7}$ M in dichloromethane).
Figure 10:
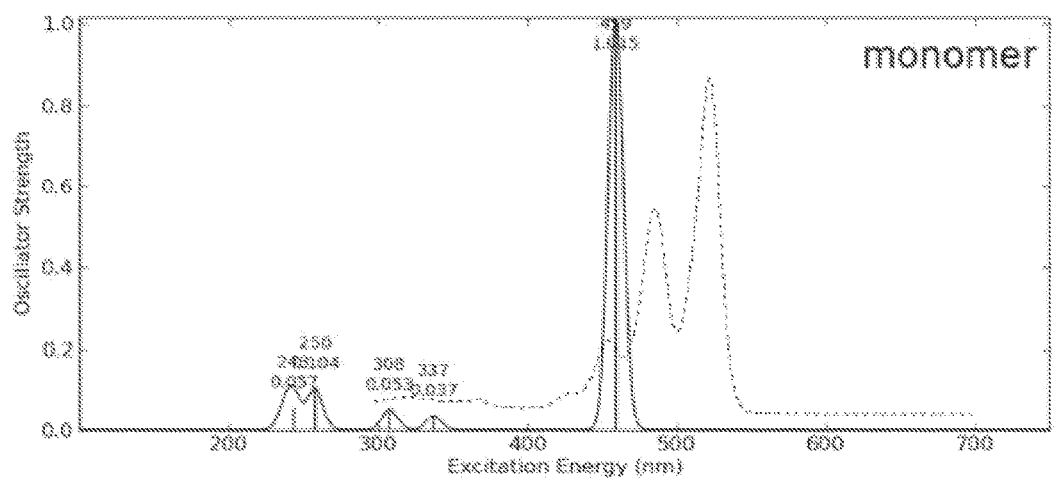
FIG. 10 is a representative compound absorption spectrum of the monomer, dimer, trimer, and tetramer.
Figure 10:
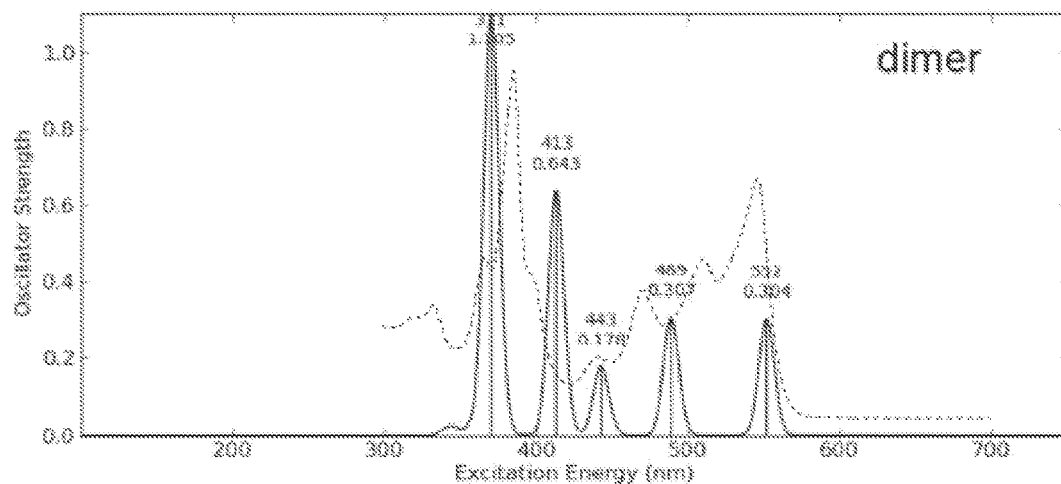
Figure 10:
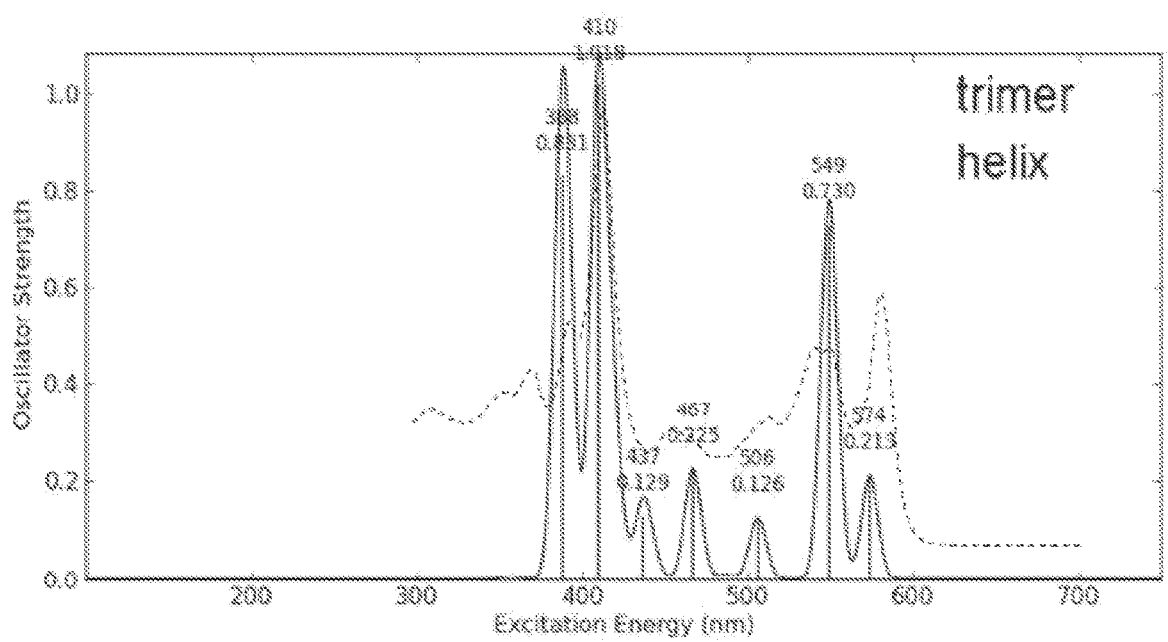
Figure 10:
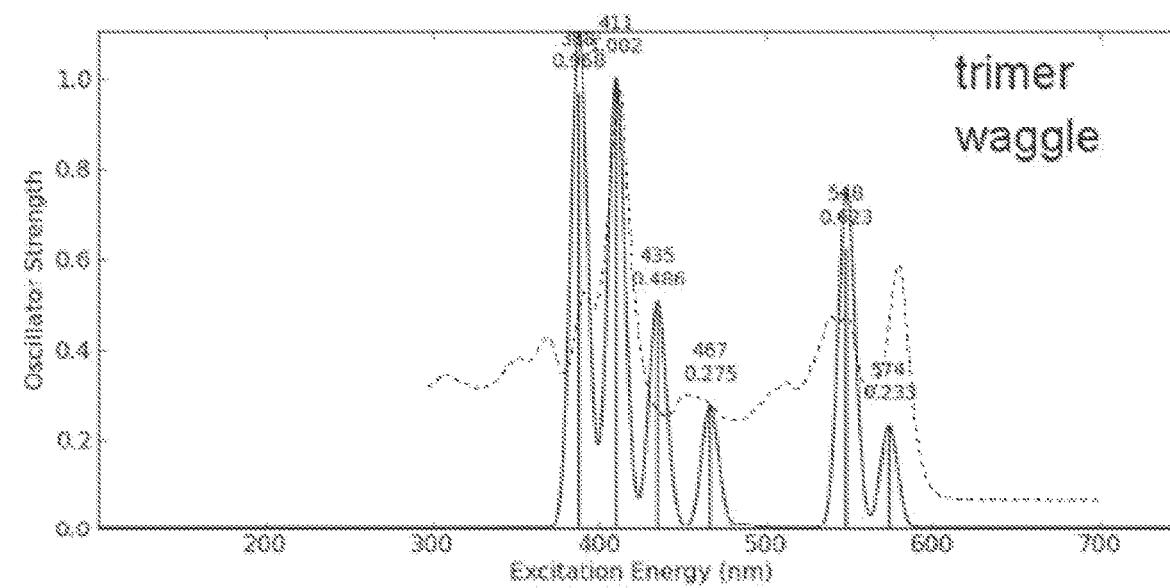
Figure 10:
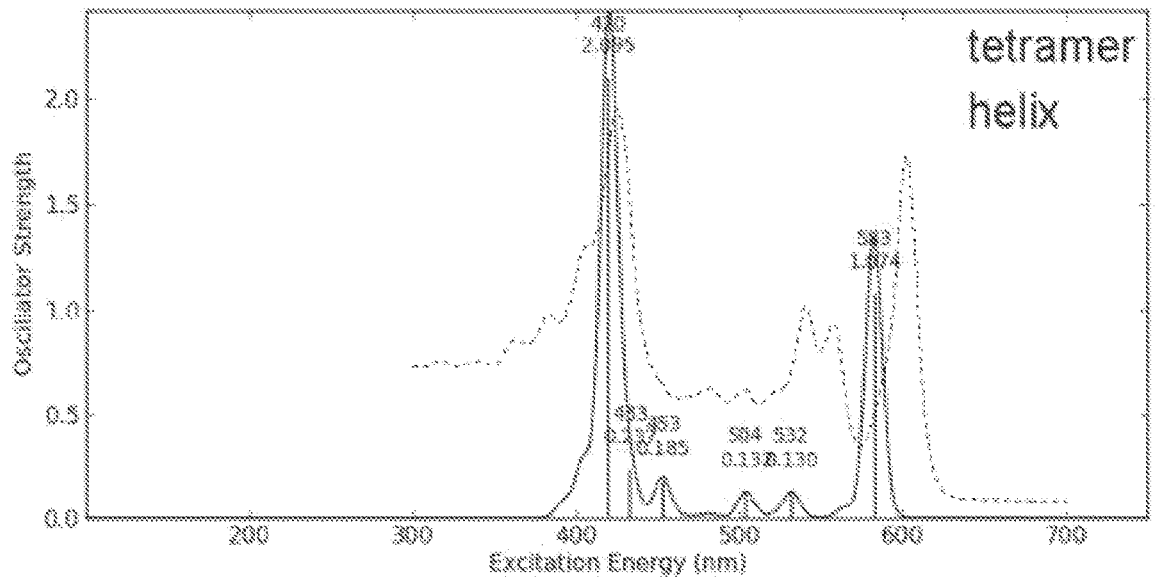
Figure 10:
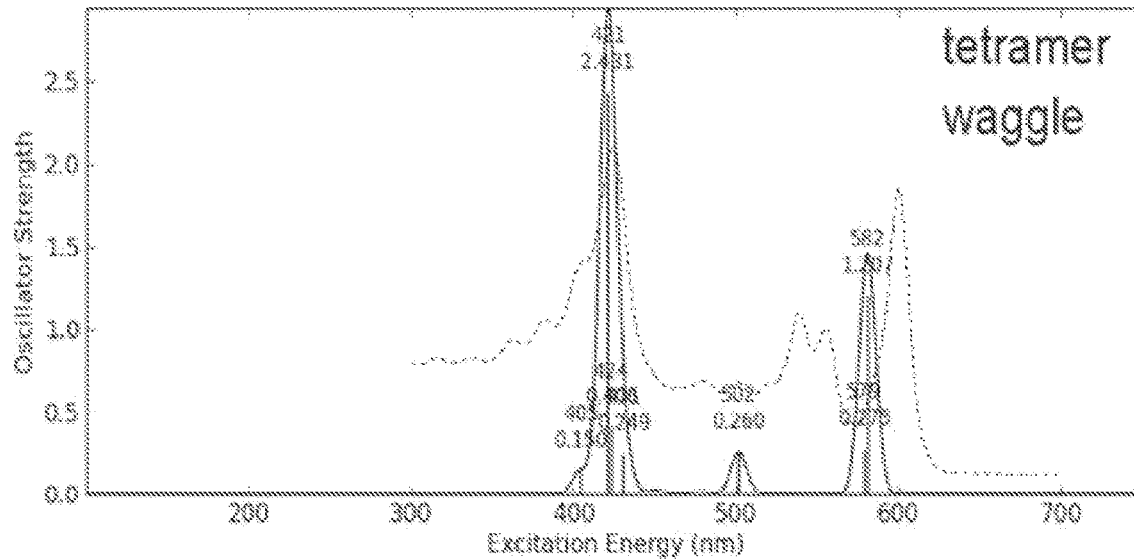
Figure 10:
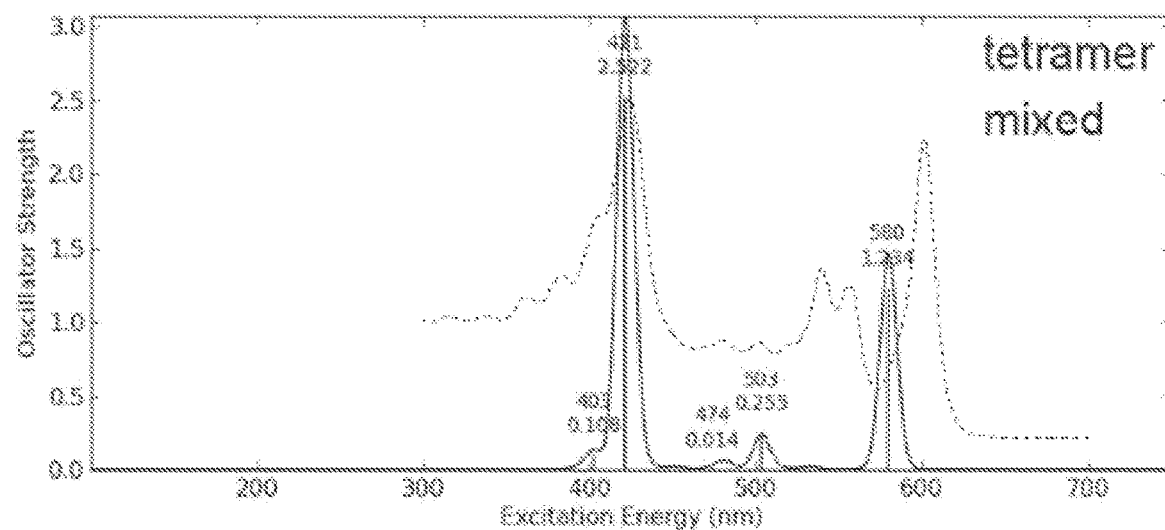

The absorption and emission spectra for the monomer through tetramer in FIG. 3. Comparison of these spectra through the series raised several questions. The first: what is the source of the shift to the red of the lowest energy excitation? The second is: while the series of absorptions in the monomer has been assigned to a vibrational progression, the spectra of Compounds 1-3 do not appear as simple, are other higher-energy absorptions present in addition to (or in place of) any vibrational signatures? The third: with respect to the tetramer; why is its lowest-energy absorption so intense? The fourth question: what is the source of the shorter-wavelength absorptions (~350 to ~450 nm) that show up in the oligomers but are absent in the monomer? The calculated physical structures of the monomer-tetramer show that the PDI-oligomers may be idealized as individually flat PDI units that are linked by contorted C.C moieties. (In each case the C—C—C—C dihedral angle around the C.C subunits that link the PDI subunits is roughly 155°). How do these subunits interact to yield the electronic behavior of the ultimate nanoribbon. Quantum chemical (groundstate DFT and excited state TD-DFT) calculations were performed on the PDI oligomers to better understand these effects and answer the question posed above. The computed absorption spectra for monomer-tetramer in shown in FIG. 10 A-G.

TABLE 2

|   | Computational[a] | | | Optical[b] | |
|---|---|---|---|---|---|
|   | $E_{HOMO}$/eV | $E_{LUMO}$/eV | $E_{gap}$/eV | $\lambda_{max}$/nm | $E_{gap}$/eV |
| Monomer | −6.11 | −3.58 | 2.53 | 525 | 2.36 |
| Dimer | −6.19 | −3.77 | 2.41 | 547 | 2.27 |

TABLE 2-continued

| | Computational[a] | | | Optical[b] | |
|---|---|---|---|---|---|
| | $E_{HOMO}$/eV | $E_{LUMO}$/eV | $E_{gap}$/eV | $\lambda_{max}$/nm | $E_{gap}$/eV |
| Trimer | −6.23 | −3.86 | 2.37 | 580 | 2.14 |
| Tetramer | −6.26 | −3.91 | 2.35 | 602 | 2.06 |

[a]Calculations were performed at the B3LYP/6-31G** level.
[b]Optical band gaps were estimated from the wavelength of the absorption peak.

In Table 2 the optical HOMO-LUMO gap was compared with the computed HOMO-LUMO gap for the monomer-tetramer. In each molecule the HOMO was formed primarily from the C—C π orbitals arrayed in alternating phase around the central six-membered rings (FIG. 2A) and in each molecule the LUMO may be viewed as a similar combination of the corresponding C—C π* orbitals (FIG. 2B). Excited-state (TD-DFT) calculations showed that in the monomer, dimer, and trimer the lowest-energy electronic excitation moved one electron from the HOMO to the LUMO. The energy of this HOMO-LUMO excitation decreased with increasing oligomer length due to quantum confinement similar to that seen in conjugated molecules or semiconductor clusters. The calculated absorption spectrum for the monomer was quite simple, showing only a single peak in the visible region; this is in agreement with the previous assignment of the set of equally spaced absorptions as a vibrational progression. Therefore, the first question above has a simple answer (at least in elementary, single-electron terms): the lowest energy optical absorption effectively moves one electron from the HOMO to the LUMO, and as one moves from the monomer to the tetramer both the HOMO and LUMO energies are lowered, but that of the LUMO lowers faster.

While the calculated absorption spectrum of the monomer was very simple, the spectra of Compounds 1-3 were more complex. For example, while the calculated spectrum of the monomer showed only one peak for wavelengths longer than 350 nm, Compound 1 showed at least five and Compound 2 at least seven. These facts, along with the definite nonplanarity of the oligomers, suggest an answer to the second question: that their higher-energy absorptions were not due exclusively to vibronic effects. Further, according to the TD-DFT calculations in Compounds 1 and 2, the second-lowest-energy allowed transition promotes an electron from the HOMO-2 to the LUMO. In each case the HOMO-2 was the highest-energy occupied orbital that can be associated with C—C bonds that bridge the PDI units. Since the LUMO in each molecule was associated with the PDI subunits, this (HOMO-2)-to-LUMO transition was seen as promoting an electron from the bridging C.C. subunit array to the PDI subunit array. As with the HOMO-LUMO transition, this excitation also shifted to lower energy with increasing oligomer size. The shift of this (HOMO-2)-to-LUMO to increasingly lower energy with degree of oligomerization was also the source of the very intense longest wavelength absorption in Compound 3 (FIG. 3A). This (HOMO-2)-to-LUMO transition also answers the third question: the energy of this transition in the tetramer is calculated to be essentially the same as that of the HOMO-to-LUMO transition. In fact, the calculated oscillator strength for the (HOMO-2)-to-LUMO transition was much larger than that of the HOMO-LUMO transition. The energy of the HOMO-2 was only slightly lower (~4 mh=~0.1 eV) than that of the HOMO, so the C—C and PDI subunits were close to degenerate in the tetramer; this hinted that the longer oligomers will provide an even richer photophysics. The calculations on Compounds 1-3 showed a third important type of electronic transition. In these, an electron was promoted from the molecular HOMO (situated primarily on the PDI subunits) to an orbital that was best characterized as a π* orbital of the bridging olefin (FIG. 2B). This transition was quite strong and occurs at higher energies. This type of transition accounts for the families of shorter-wavelength absorptions in the oligomers and answers the fourth of the questions posed above.

Figure 11:
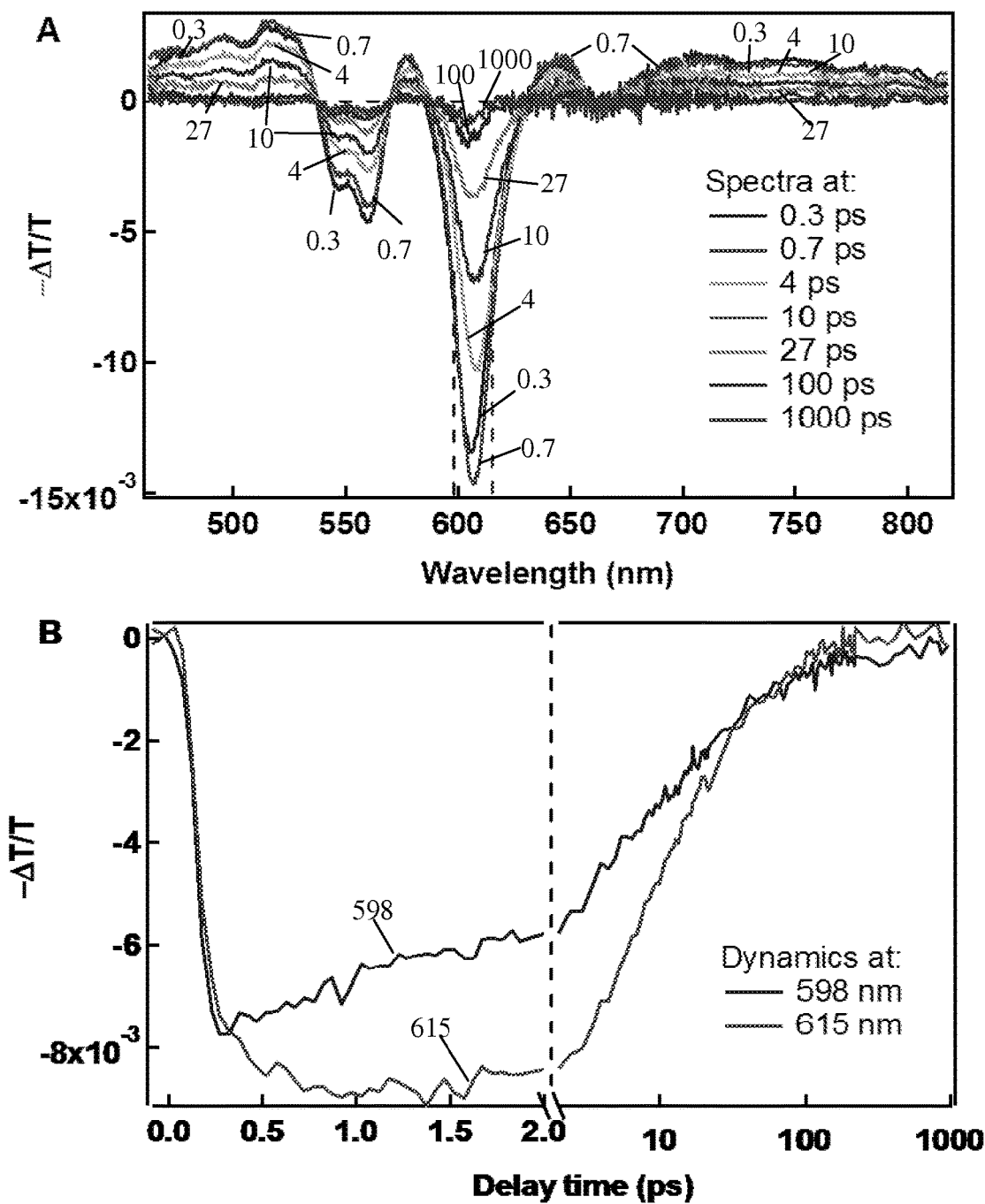
FIG. 11 is a representative plot of (A) different transmission, $-\Delta T/T$, as a function of probe photon energy at different delay time between pump and probe pulses. (B) Exciton dynamics probing at the red side (615 nm) and blue side (598 nm) of the absorption peak at 605 nm (right and left dashed lines in the panel A).

To probe these transitions directly femtosecond transient absorption spectroscopy was used as disclosed in Trinh, M. T.; Sfeir, M. Y.; Choi, J. J.; Owen, J. S.; Zhu, X.-Y. Nano Lett. 2013, 13, 6091. A sample of Compound 3 was excited with a 450 nm laser pulse and probe with a white light supercontinuum. FIG. 11 shows the transient absorption spectra as a function of probe photon energy for Compound 3 at different delay times between pump and probe pulses. The negative signals at 550 and 605 nm were due to photo bleaching from the absorption peaks at the same wavelengths. The positive signals were due to photoinduced absorption in the transitions from S1 to higher lying singlet states. The bleaching peaks were spectrally better resolved than corresponding features in the static spectrum. In particularly, the bleaching features at 605 and 550 nm were well separated; this confirms that the absorption at 550 nm is not vibrational progression associated with the transition centered at 605 nm. FIG. 11B presents the dynamics at the red side (615 nm) and the blue side (598 nm) of the absorption peak centered at 605 nm. It was clear that the dynamics were very different. These dynamics can be fitted well by a biexponential function. While the decay constants for the dynamics at 598 nm were 2.5 and 28 ps, the dynamics at 615 nm were 8 and 48 ps. This result is in line with the DFT calculation in which the lowest-energy allowed transition was the combination of the (HOMO-2)-to-LUMO and the HOMO-to-LUMO transitions in the tetramer. According to the calculation the difference in energy for these two transitions was ~0.1 eV. The bleaching dynamics for the monomer were similar at different probe wavelengths. This transient absorption data experimentally answered the second and third questions above.

Therefore, the optical spectra (FIG. 3) can at least be partially assigned by citing three families of electronic transition. The first is the HOMO-LUMO transition, and it is roughly similar in the monomer, dimer, trimer, and tetramer. These transitions involve orbitals confined to the PDI subunits; there was little orbital density on the bridging olefins. Only the monomer showed avibrational progression (Sadrai, M.; Bird, G. R. Opt. Commun. 1984, 51, 62). In the higher oligomers that were distorted away from planarity, the vibronic effects are absent. In the second family of optical transitions, an electron is promoted from a C.C bonding level in the bridging olefin(s) (FIG. 2A) to the LUMO. Since the LUMO was situated on the PDI subunits, this transition was from the olefinic bridges to the PDI framework. These transitions were slightly higher in energy than the HOMO-LUMO transitions in the dimer and trimer, but in the tetramer the two transitions were essentially degenerate. The third family of transitions promoted an electron from the HOMO to antibonding levels of the bridging olefins. As the HOMO was situated on the PDI subunits, this transition was from the PDI framework to the olefinic bridges. These transitions were all higher in energy, accounting for the shorter wavelength absorptions seen in the dimer, trimer, and tetramer spectra (FIG. 3).

Example 8: Efficient Organic Solar Cell Using Compound 1

Figure 12:
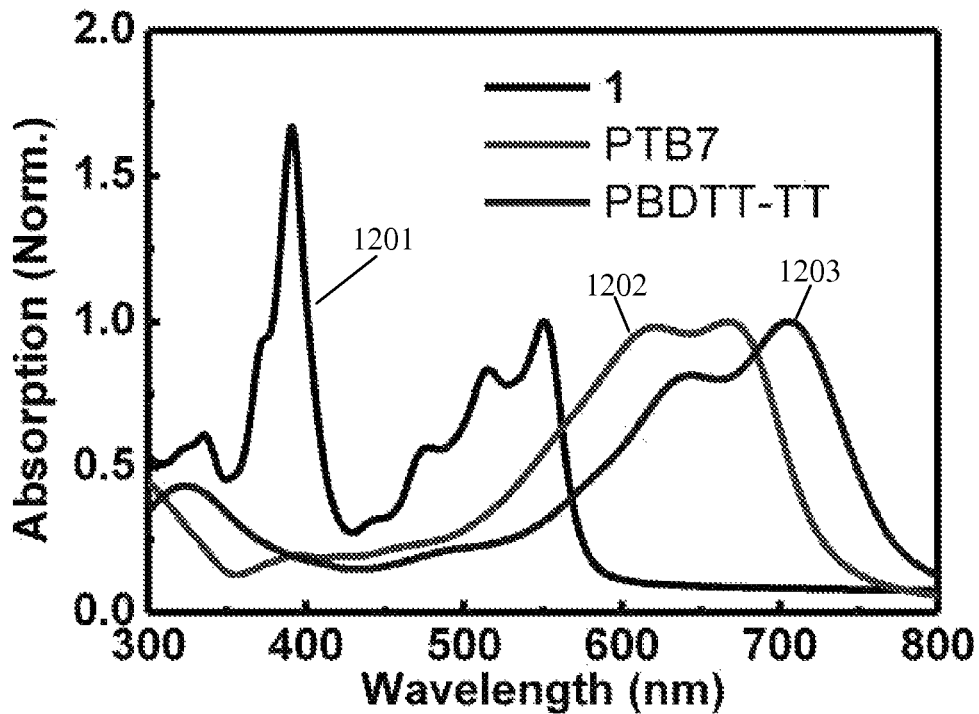
FIG. 12 provides representative data according to some embodiments of the disclosed subject matter: (A) PTB7 (1202), PBDTT-TT (1203), and Compound 1 (1201) normalized at their low energy $\lambda_{max}$. (B) J-V curves for PTB7:PDI-dimer (1204) and PBDTT-TT:PDI-dimer (1205) solar cells.
Figure 12:
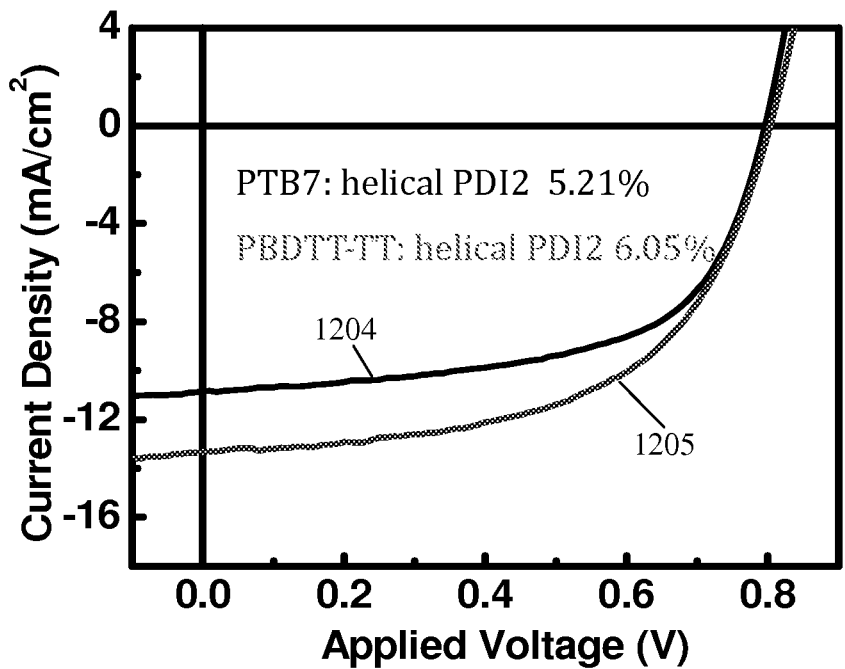

Bulk-heterojunctions (BHJs) were fabricated using Compound 1. The narrowband-gap semiconducting polymers polythieno[3,4-b]-thiophene-co-benzodithiophene (PTB7) and poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene)-2-carboxylate-2,6-diyl] (PBDTT-TT) were used as the electron donors. The absorption bands of PTB7 and PBDTT-TT were red-shifted relative to those of Compound 1 (FIG. 12A); as a result, blended films of Compound 1 and the donor polymers have broad and intense absorptions that span 350 to 800 nm.

Figure 13:
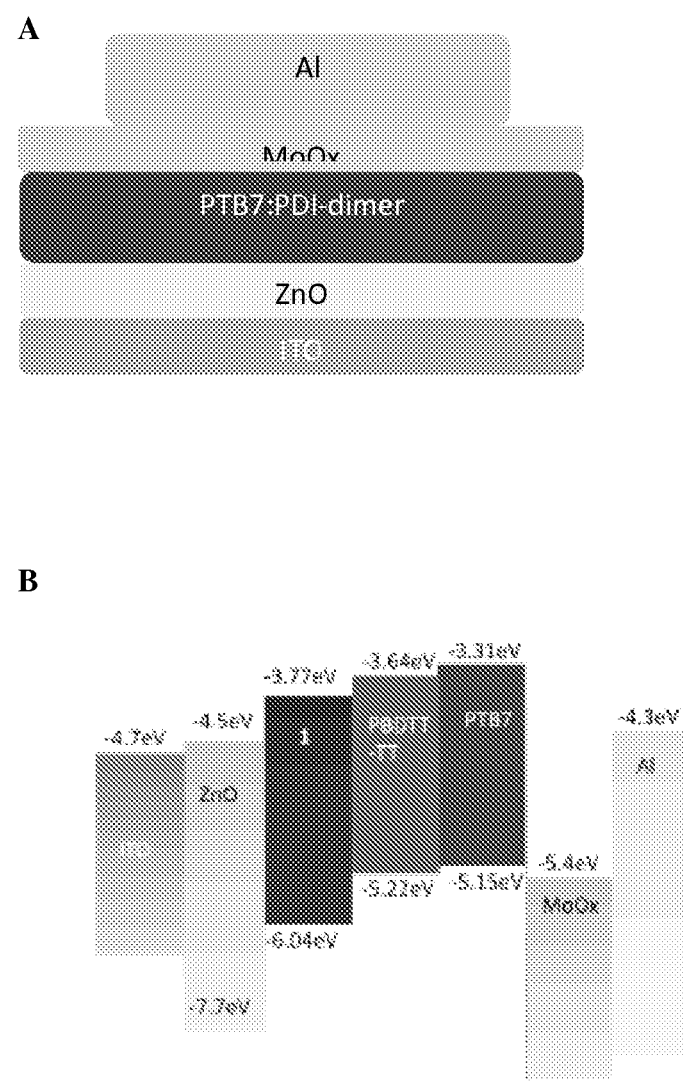
FIG. 13 provides representative data according to some embodiments of the disclosed subject matter: (A) Schematic illustrations of the device architectures of the PTB7:PDI-dimer solar cell and (B) Energy diagram of the device.

The mass ratio of PTB7 and Compound 1 were varied in solution to optimize the device performance. Devices were fabricated in both a conventional structure with a configuration of ITO/PEDOT:PSS(40 nm)/PTB7:1/BCP(7 nm)/Al (100 nm) and an inverted structure with a configuration of ITO/ZnO(20 nm)/PTB7:1/MoOx(5 nm)/Al(100 nm). A 3:7 mass ratio of PTB7 and Compound 1 provided the highest PCEs: 3.5% in a conventional structure and 4.5% in an inverted structure. The inverted structure was chosen for further optimization. A schematic of the energy levels in these inverted devices is shown in FIG. 13.

Figure 14:
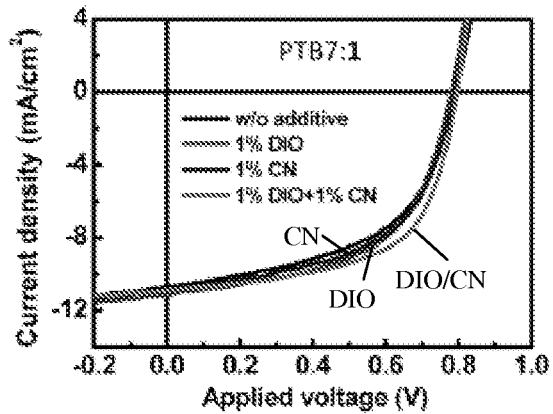
FIG. 14 provides representative data according to some embodiments of the disclosed subject matter: (A) J-V curves for PTB7:Compound 1 solar cells with different additives, (B) J-V curves for PBDTT-TT:Compound 1 solar cells with different additives, and (C) EQE spectra (symbols) of PTB7:Compound 1 and PBDTT-TT:Compound 1 devices with 1% DIO and 1% CN solvent additive and absorption spectra (dashed lines) for the PTB7:Compound 1 and PBDTT-TT:Compound 1 blend films (3:7 D/A mass ratio).
Figure 14:
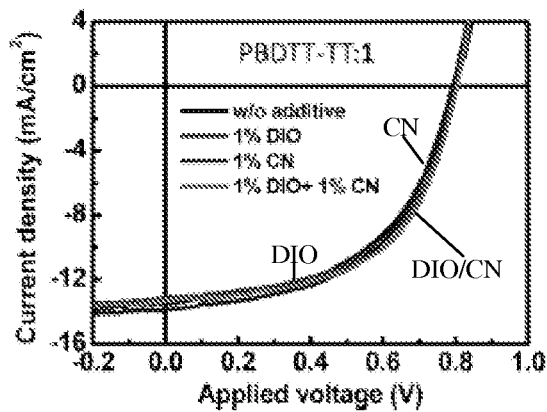
Figure 14:
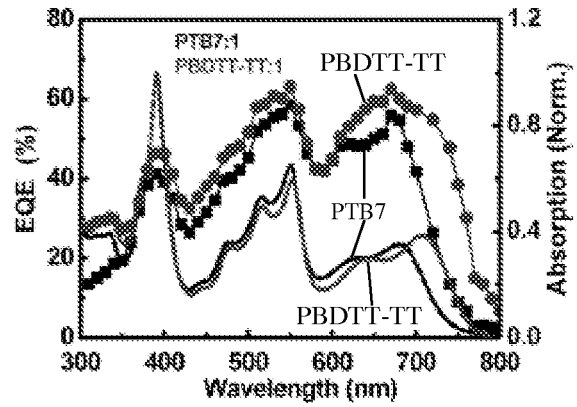

Diiodooctane (DIO) and 1-chloronaphthalene (CN) were used as solvent additives to improve the overall morphology. Typical current density-voltage (J-V) curves for PTB7:1 (1 being Compound 1) solar cells with different additives are shown in FIG. 14A. Compared with devices without additive, those devices with 1% DIO and 1% CN showed higher PCEs, mainly because of improvements in the fill factor (FF) from 53.1% without additive to 55.6% with DIO and 54.5% with CN. Furthermore, when 1% DIO and 1% CN were used as coadditives in the solution, the fill factor increased to 60.0%, resulting in an average PCE of 5.14%. The highest PCE achieved from a PTB7:1 solar cell was 5.21%. This cell had the following characteristics: short-circuit current density (Jsc)=10.9 mA/cm2, open-circuit voltage (Voc)=0.791 V, and FF=60.0%.

A similar effect of DIO and CN was observed with PBDTT-TT:1 solar cells (FIG. 14B). Overall, the solar cells containing PBDTT-TT exhibited larger Jsc values than the PTB7 solar cells because of their more red-shifted absorption. The average PCE from six devices without any additives was 5.52%; the average PCEs with various additives were 5.63% with DIO, 5.70% with CN, and 5.94% with DIO and CN as coadditives, respectively. The champion PBDTT-TT:1 solar cell showed the following characteristics: Jsc=13.3 mA/cm$^2$, Voc=0.803 V, FF=56.6%, and PCE=6.05%. The parameters of the solar cells are summarized in Table 3.

TABLE 3

Summary of Device Parameters of PTB7:1 and PBDTT-TT:1 Solar Cells

|  | $J_{sc}$ (mA/cm$^2$) | $V_{oc}$ (V) | FF (%) | PCE (%)[a] |
|---|---|---|---|---|
| PTB7:1 with no additive | 10.5 ± 0.2 | 0.796 ± 0.006 | 53.6 ± 0.5 | 4.47 ± 0.03 (4.50) |
| PTB7:1 with 1% DIO | 10.9 ± 0.2 | 0.782 ± 0.004 | 56 ± 1 | 4.74 ± 0.05 (4.81) |
| PTB7:1 with 1% CN | 10.7 ± 0.4 | 0.787 ± 0.009 | 54.1 ± 0.8 | 4.54 ± 0.18 (4.70) |
| PTB7:1 with 1% DIO + 1% CN | 11.0 ± 0.1 | 0.789 ± 0.005 | 59 ± 1 | 5.14 ± 0.04 (5.21) |
| PBDTT-TT:1 with no additive | 13.6 ± 0.1 | 0.796 ± 0.005 | 51.1 ± 0.7 | 5.52 ± 0.05 (5.59) |
| PBDTT-TT:1 with 1% DIO | 13.2 ± 0.1 | 0.794 ± 0.005 | 54 ± 1 | 5.63 ± 0.11 (5.81) |
| PBDTT-TT:1 with 1% CN | 13.7 ± 0.2 | 0.790 ± 0.005 | 53 ± 1 | 5.70 ± 0.11 (5.86) |
| PBDTT-TT:1 with 1% DIO + 1% CN | 13.5 ± 0.2 | 0.796 ± 0.005 | 55 ± 1 | 5.94 ± 0.07 (6.05) |

[a]Average PCE values were calculated from six devices for each condition; the highest PCE values are shown in parentheses.

These properties are excellent for a PDI-based solar cell, and the PCEs compete with the highest PCEs reported for solution-processed nonfullerene BHJs. These values were lower than those for the corresponding cells with fullerenes as the acceptors, but those partners were optimized for each other. This highlights the enormous potential of Compound 1 in solar cells when tailored donor materials are created for them.

Example 9: Characterization of Compound 4

Figure 15:
FIG. 15 depicts crystals of dimer 2-Br (Compound 4) grown on an OTS-treated Si/SiO$_2$ wager (about 75 μm) of dimer 2-Br: (A) representative SEM. (B) XRP analysis of the dimer 2-Br crystal.
Figure 15:
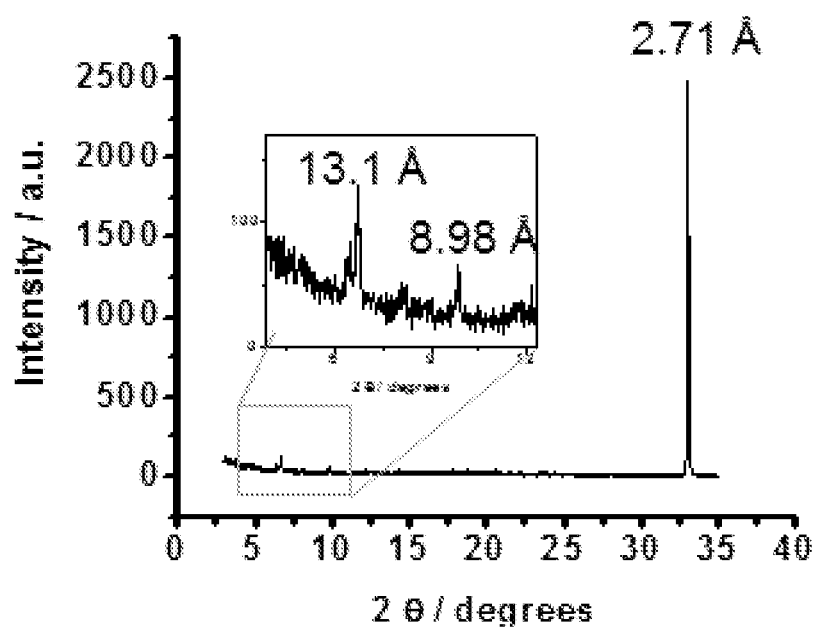

A BHJ was fabricated using Compound 4. Unlike compound 1, crystals were able to be grown from Compound 4 (FIG. 15). Dark field polarized light was used because the crystals appeared brighter than an amorphous film—further demonstrating that the diBr-dimer crystallized.

Figure 16:
FIG. 16 provides representative data according to some embodiments of the disclosed subject matter: (A) Construction of the diBr-dimer FTE. (B) Transfer characteristics of the FET. (C) Representative cyclic voltammograms for the diBr-dimer.
Figure 16:
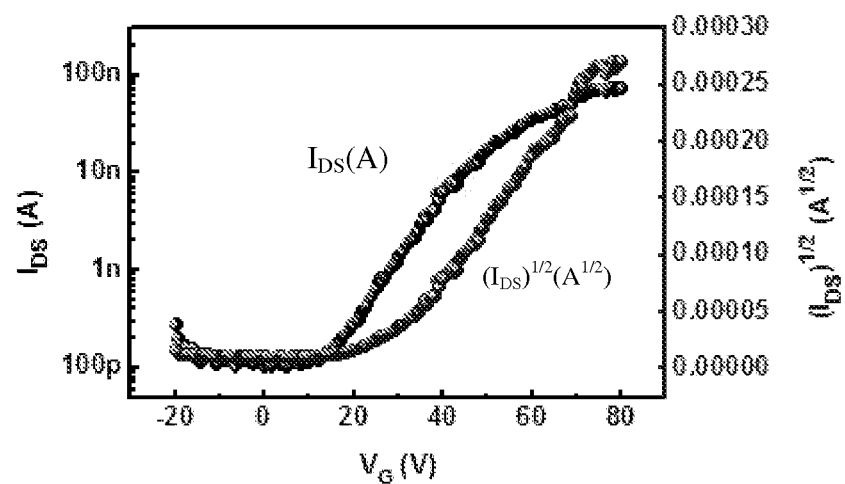
Figure 16:
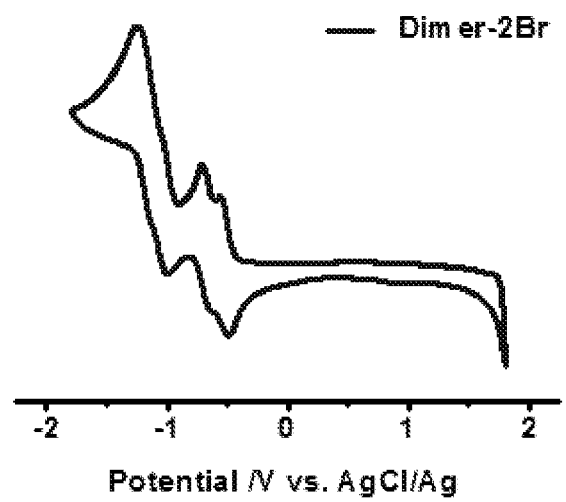
Figure 17:
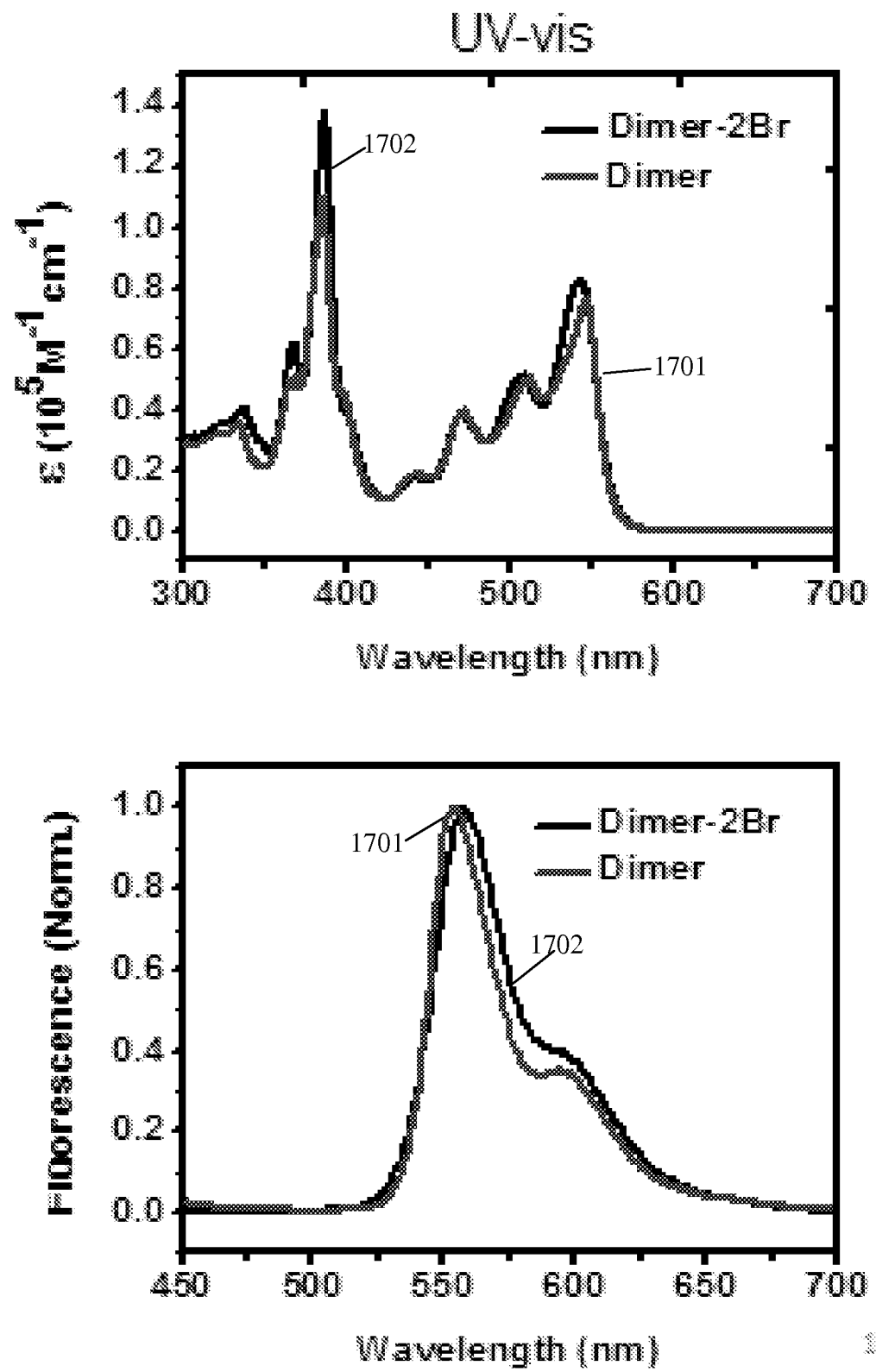
FIG. 17 provides representative comparison of the film absorption spectra of Compounds 1 (1701) and 4 (1702).

An FET was constructed using Compounds 4 as the semiconductor. The substrate (300 nm of $SiO_2$ on a Si wafer) was first treated with octadecyltrichlorosilane (OTS) in order to passivate traps on the $SiO_2$ surface. Compounds 4 was spun-casted as a film onto this surface. The thickness of the organic films was 15-20 nm. The Au source and drain electrodes were deposited on the film to make a bottom-gate and top-contact configuration with W=105 μm and L=15 μm. The schematic of the FET device structure is shown in FIG. 16A). The compound was annealed (under inert atmosphere) to optimize device performance. The typical transfer curves for Compound 4 is shown in FIG. 16B. Electrochemical measurements in $CH_2Cl_2$ with $Bu_4NPF_6$ (0.1 M) as the supporting electrolyte revealed that Compounds 1-3 could accept electrons (FIG. 16C). The estimated LUMO from CV was −3.94 eV. The optical bandgap from UV-Vis was 2.20 eV. The absorption bands of Compound 4 matched well with those of Compound 1 (FIG. 17).

Example 10: Characterization of Compounds 5 and 6

Figure 18:
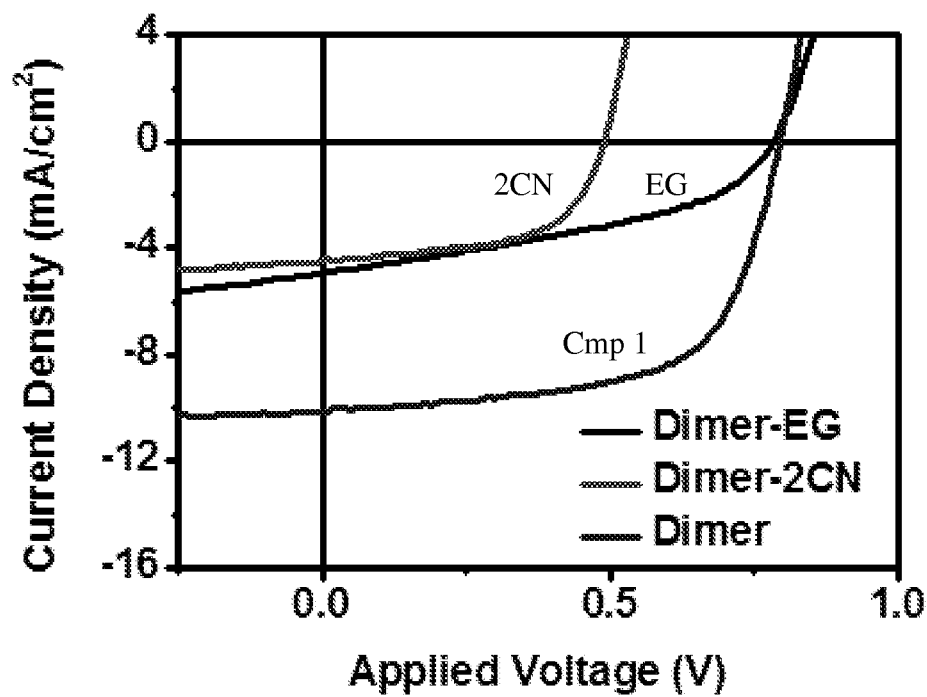
FIG. 18 provides comparison of the J-V curves for Compounds 1, 5, and 6.

BHJ solar cells were fabricated using Compounds 5 and 6. The narrowband-gap semiconducting polymers (PTB7) was used as the electron donors. Typical current density-voltage (J-V) curves for PTB7 solar cells with different additives are shown in FIG. 18. A summary of the results is presented in Table 4.

TABLE 4

|  | Jsc (mA/cm$^2$) | Voc (V) | FF (%) | Max. PCE (%) |
|---|---|---|---|---|
| Dimer | 10.1 | 0.80 | 63.4 | 5.10 |
| Dimer-2CN | 4.5 | 0.49 | 59 | 1.3 |
| Dimer-EG | 4.9 | 0.79 | 41 | 1.6 |

Example 11: Efficient Organic Solar Cell Using Compound 4

Figure 19:
FIG. 19 provides representative data according to some embodiments of the disclosed subject matter: (A) Schematic illustrations of the device architectures of the PTB7-th:Dimer-2Br solar cell. (B) Film absorption spectra of Dimer-2Br. (C) Energy diagram of the device.
Figure 19:
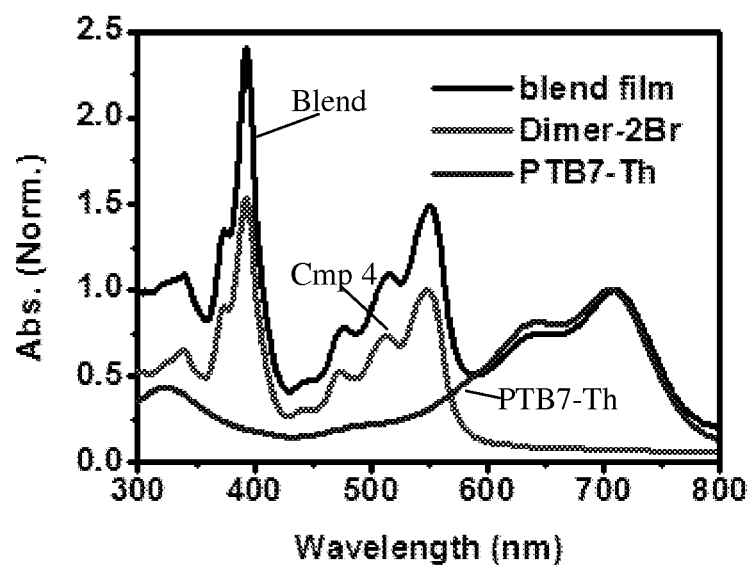
Figure 19:
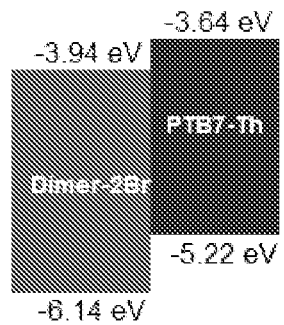

A BHJ was fabricated using Compound 4. The narrow-band-gap semiconducting polymer poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene)-2-carboxylate-2,6-diyl] (PTB7-Th) was used as the electron donor (FIG. 19A). The absorption bands of PTB7-Th was red-shifted relative to Compound 4 (FIG. 19B); as a result, blended films of Compound 4 and the donor polymer has broad and intense absorptions that span 350 to 800 nm. A schematic of the energy levels in these inverted devices is shown in FIG. 19C.

Figure 20:
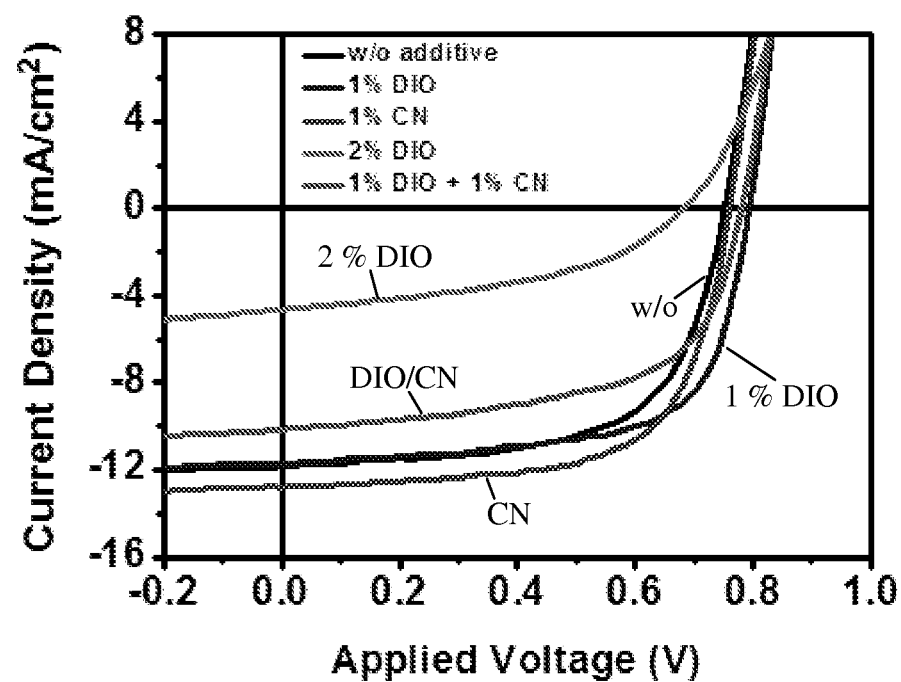
FIG. 20 provides comparison of the J-V curves for Compound 4 and different concentrations of additives.

Diiodooctane (DIO) and 1-chloronaphthalene (CN) were used as solvent additives to improve the overall morphology. Typical current density-voltage (J-V) curves for PTB7-Th solar cells with different additives are shown in FIG. 20. Compared with devices without additive, those devices with 1% DIO and 1% CN show higher PCEs, mainly because of improvements in the fill factor (FF) from 63.2% without additive to 66.0% with DIO and 65.6% with CN. The highest PCE achieved from the PTB7-Th solar cells tested was 6.38%, which was obtained with 1% CN.

TABLE 5

|  | Jsc (mA/cm$^2$) | Voc (V) | FF (%) | Max. PCE (%) |
|---|---|---|---|---|
| w/o additive | 11.8 | 0.75 | 63.2 | 5.60 |
| 1% DIO | 11.7 | 0.80 | 66.0 | 6.15 |
| 1% CN | 12.8 | 0.76 | 65.6 | 6.38 |
| 2% DIO | 4.6 | 0.68 | 44.6 | 1.4 |
| 1% DIO + 1% CN | 10.2 | 0.78 | 58.3 | 4.66 |

This highlights the enormous potential of Compound 4 in solar cells when tailored donor materials are created for them.

Example 12: Efficient Organic Solar Cell Using Compounds 2 and 3

This example reports two atomically defined graphene nanoribbons that serve as highly efficient electron acceptors in BHJ solar cells (Compound 2 and 3). These fullerene-free BHJs exhibited PCEs over 8% with high short circuit current and large fill factors. The film morphology of the active layer consisted of a mesh-like network of acceptors with pores that are tens of nanometers in diameter. Transient absorption spectroscopy (TAS) revealed that excitons generated in both the donor and acceptor phases contribute to the photocurrent by effective hole and electron transfer at the interface between donor and acceptor.

Figure 21:
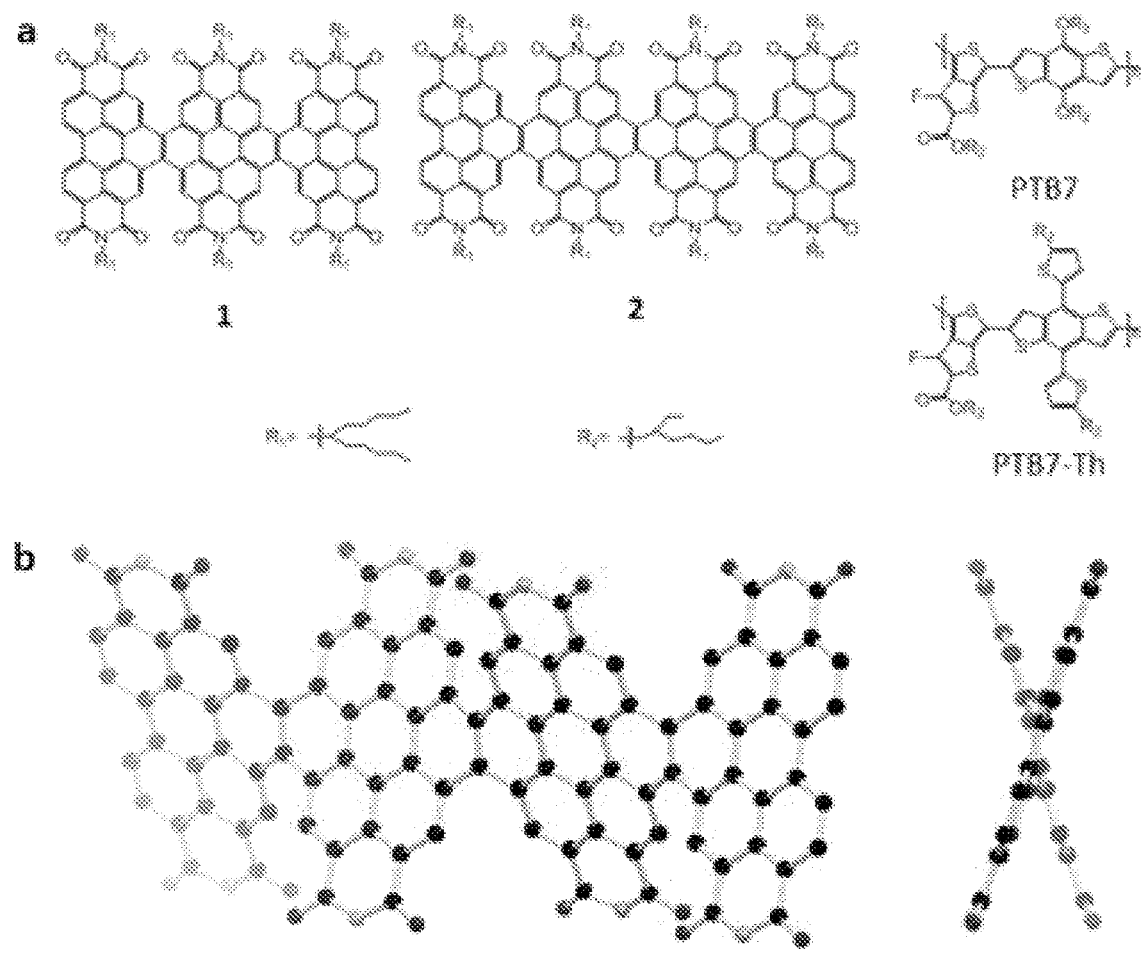
FIG. 21 provides (A) Chemical structure of Compound 2 (1), Compound 3 (2), PTB7, and PTB7-Th. (B) Molecular model of Compound 3 in a waggling conformation from DFT calculations. Hydrogens and alkyl side chains have been removed for clarity.
Figure 22:
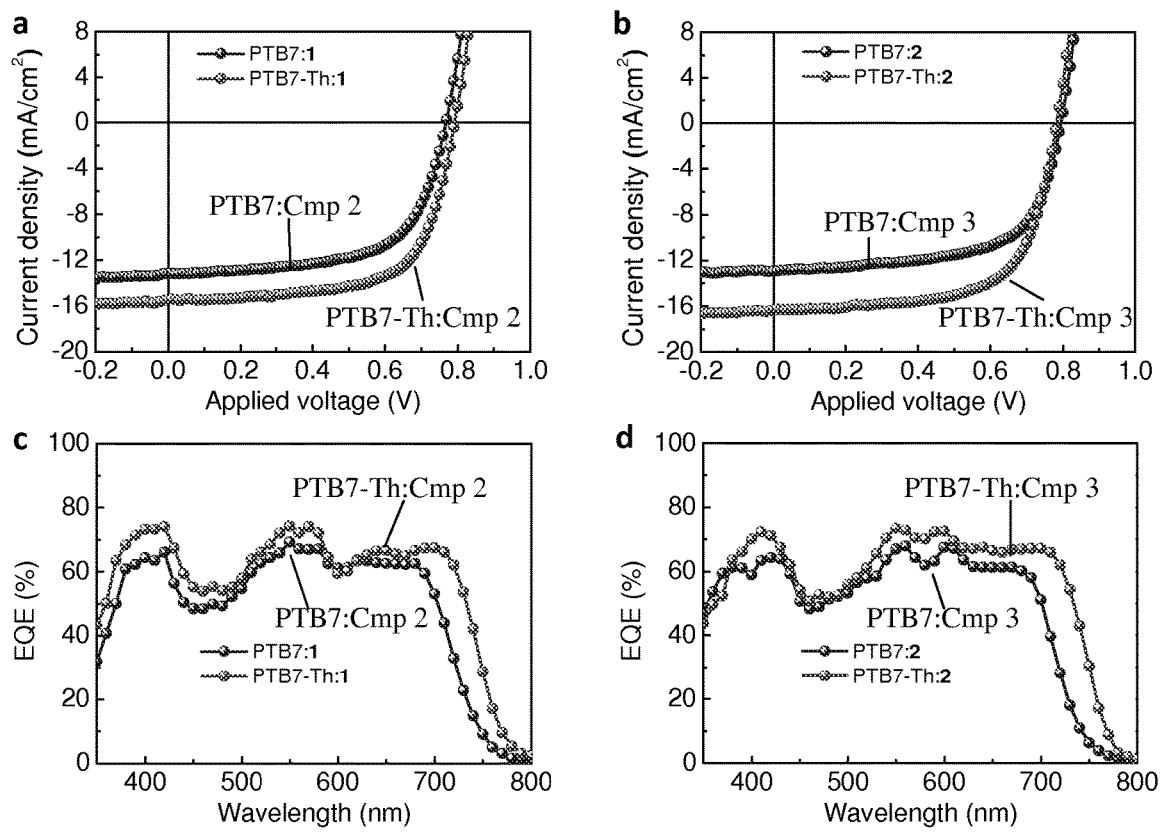
FIG. 22 provides representative J-V curves for devices with Compounds 2 (represented by 1) and 3 (represented by 2): (A) and (B), J-V curves for (A), PTB7:Compound 2 and PTB7-Th:Compound 3 solar cells, (B), PTB7: Compound 2 and PTB7-Th: Compound 3 solar cells under optimized conditions and simulated AM 1.5G irradiation (100 mWcm$^{-2}$). (C) and (D), EQE spectra of (C), PTB7: Compound 2, PTB7-Th: Compound 3 and (D), PTB7: Compound 2, PTB7-Th: Compound 3 solar cells under optimized conditions.

The two graphene nanoribbons (Compounds 2 and 3) had relatively high electron mobilities, good electron-accepting ability and appropriate energy levels for commercially available electron donating polymers (FIG. 22). These nanoribbons possessed nonplanar molecular structures due to the steric congestion in the cove areas defined by the junction point between the PDIs. There were several isoenergetic conformations within these oligomers because of the inversion of the helicity at each of these junctions. FIG. 21B displays one of these conformations. Because of the nonplanar structure and the associated conformational dynamics, these molecules did not aggregate strongly in thin films. Compounds 2 and 3 absorbed light strongly from 350 to 600 nm with a maximum molar extinction coefficient of 1.5×[10]^5 M-1 cm-1 for Compound 2 and 1.8×[10]^5 M-1 cm-1 for Compound 3. The strong light absorption, the lack of aggregation, and the propensity of the isolated linear structure to form networks indicates that these two compounds have the potential to be superior to PDI monomers and dimers in BHJs.

To fabricate BHJs based on Compounds 2 and 3, commercially available low bandgap semiconducting polymers polythieno[3,4-b]-thiophene-co-benzodithiophene (PTB7) and poly[4,8-bis(5-(2-ethylhexyl)thiophen-2-yl)benzo[1,2-b;4,5-b']dithiophene-2,6-diyl-alt-(4-(2-ethylhexyl)-3-fluorothieno[3,4-b]thiophene)-2-carboxylate-2,6-diyl] (PTB7-Th) were used as the electron donors. The absorption bands of PTB7 and PTB7-Th were red-shifted relative to those of Compounds 2 and 3 (FIG. 21B). In films of Compound 2 or 3 blended with PTB7 or PTB7-Th, broad intense absorptions were found that span from 350 to 800 nm.

The BHJ devices were fabricated in a standard inverted structure using ZnO as the electron transport layer and MoO$_3$ as the hole transport layer. For each combination of polymers and compounds, the ratio of donor and acceptor was varied and then optimized the film morphology with the solvent additive diiodooctane (DIO). For Compound 2-based BHJs, optimal device performance was obtained when donor-to-acceptor mass ratio is 4:6 with 1% DIO additive (v/v). Typical current density-voltage (J-V) curves for PTB7-Th:Compound 2 solar cells are shown in FIG. 22A. The optimal solar cells based on PTB7: Compound 2 had the following characteristics: short-circuit current density (Jsc)=13.2 mA/cm2, open-circuit voltage (Voc)=0.77 V, Fill factor (FF)=63.3% and PCE=6.4%. Compared with PTB7: Compound 2, the PTB7-Th:Compound 2 device exhibited larger Jsc due to the red-shifted absorption of PTB7-Th relative to PTB7. The highest PCE achieved was from a PTB7-Th:Compound 2 solar cell is 8.19%. This cell had the following characteristics: Jsc=15.5 mA/cm2, Voc=0.79 V and FF=66.9%. The average PCE from devices was 7.8%.

For Compound 3-based BHJs, the optimal device performance was obtained when donor-to-acceptor mass ratio was 5:5 with 1% DIO additive (v/v). Overall, Compound 3-based solar cells exhibited very similar parameters to Compound 2-based ones. The best PCEs for PTB7:Compound 3 and PTB7-Th:Compound 3 solar cells were 6.52% and 8.40%, respectively. Table 6 summarizes the parameters of the solar cells.

TABLE 6

Summary of Device Parameters of the best solar cells.

|  | Jsc (mA/cm$^2$) | Voc (V) | FF (%) | PCE (%) |
|---|---|---|---|---|
| PTB7:1 | 13.2 | 0.77 | 63.3 | 6.43 (6.33) |
| PTB7-Th:1 | 15.5 | 0.79 | 66.9 | 8.19 (7.78) |

TABLE 6-continued

Summary of Device Parameters of the best solar cells.

|  | Jsc (mA/cm$^2$) | Voc (V) | FF (%) | PCE (%) |
|---|---|---|---|---|
| PTB7:2 | 12.9 | 0.79 | 64.0 | 6.52 (6.40) |
| PTB7-Th:2 | 16.3 | 0.78 | 66.1 | 8.40 (8.07) |

These PCEs are record highs for PCEs in nonfullerene BHJs. It is important to note that the PCEs for the fullerene based cells with these donor polymers (PTB7-Th:PC71BM) using the same interfacial layers (ZnO and MoO$_3$) are similar (7.4%-8.5%). These graphene nanoribbons are the first example of electron acceptors that are on par with fullerene derivatives and provide an untapped vein to explore high performance BHJ solar cells.

For traditional non-fullerene solar cells, Jsc's are below 15 mA/cm2 and the FF values area below 60% (Zang, Y. et al. Adv Mater 26, 5708-5714 (2014); Zhong, Y. et al. 136, 15215-15221 (2014); Lin, Y. et al. An Electron Acceptor Challenging Fullerenes for Efficient Polymer Solar Cells. Advanced Materials, n/a-n/a (2015); Lin, Y. et al. High-performance fullerene-free polymer solar cells with 6.31% efficiency. Energy & Environmental Science (2015)). The values for the compounds 2 and 3 were significantly enhanced relative to these prior studies. This increase in Jsc and FF values was due to the efficient exciton generation, separation and carrier transport in these devices. To support this, the photocurrent density ($J_{ph}$) was plotted versus effective voltage ($V_{eff}$) to study the exciton generation rate and the charge dissociation probabilities P(E,T) at $J_{sc}$ conditions. For both PTB7:Compound 3 and PTB7-Th:Compound 3 devices, $J_{ph}$ reached saturation current density at a relatively low $V_{eff}$ (2V). The PTB7-Th: Compound 3 device had a slightly higher saturation current density than the PTB7-Th: Compound 2 device, consistent with the trend of $J_{sc}$ values. The calculated exciton generation rates were $1.0 \times 10^{22}$ cm$^{-3}$s$^{-1}$ for PTB7: Compound 3 and PTB7-Th: Compound 3 devices, respectively. Under $J_{sc}$ conditions, the P(E,T)'s for PTB7: Compound 3 and PTB7-Th: Compound 3 devices were up to 97% and 96%, respectively. From the light-intensity-dependent current density measurement, near-unity exponent a was found in the expression of $J_{sc}$ versus. I$^\alpha$, where I is incident light intensity. This data also suggests that there was a suppressed bimolecular recombination and suppressed space-charge effect at Jsc conditions.

The electron and hole mobilities were measured in the optimal blend films by the space-charge-limited current (SCLC) method. For PTB7-Th:Compound 2 blended film, the hole and electron mobilities were $1.1 \times 10^{-4}$ and $1.5 \times 10^{-4}$ cm$^2$V$^{-1}$s$^{-1}$, respectively. For PTB7-Th:Compound 3 blended film, the hole and electron mobilities are $1.2 \times 10^{-4}$ and $1.5 \times 10^{-5}$ cm$^2$V$^{-1}$s$^{-1}$, respectively. PTB7-Th:Compound 3 blended film exhibits similar electron mobility to PTB7-Th:PC$_{71}$BM blended film while PTB7-Th:Compound 3 showed even more balanced electron and hole mobility than PTB7-Th:PC$_{71}$BM.

FIGS. 22C and 22D displays the external quantum efficiency (EQE) spectra for each of the devices. These devices showed broad and intense photoresponse from 350 nm to 800 nm. Compared with the PTB7-based solar cells, the PTB7-Th solar cells showed a significant increase in the photoresponse between 700 to 800 nm due to the red-shifted absorption of PTB7-Th. The integrated Jsc values for PTB7: Compound 2, PTB7-Th: Compound 3, PTB7: Compound 2 and PTB7-Th:Compound 3 were 13.2 mA/cm$^2$, 13.1 mA/cm$^2$, 15.3 mA/cm$^2$ and 15.5 mA/cm$^2$, respectively. These values agreed well with measured values with a mismatch that is within 2% for all the devices. Spectra for the Compound 3-based solar cells showed an increase at 600 nm due to the intense absorption band of Compound 3 in this region. It is notable that all the EQE data consist of maximal transition bands around 400 nm and 550 nm that was mainly from the intense absorption of the compounds. For those PTB7-Th-based solar cells, the highest EQE values were even beyond 70%. The important conclusion is that the photogenerated excitons from the compounds contribute greatly to the photocurrent in these solar cells.

An advantage of graphene nanoribbons over fullerenes is the much higher optical absorption cross section of the former in the visible part of the solar spectrum and tunable bandgap. The graphene nanoribbon electron acceptors can thus complement low bandgap electron donors in the efficient harvesting of solar radiation in a broad wavelength region. To establish this dual light-harvesting mechanism, transient absorption (TA) spectroscopy was used to investigate exciton generation in the donor and acceptor and charge transfer between the two materials.

Figure 24:
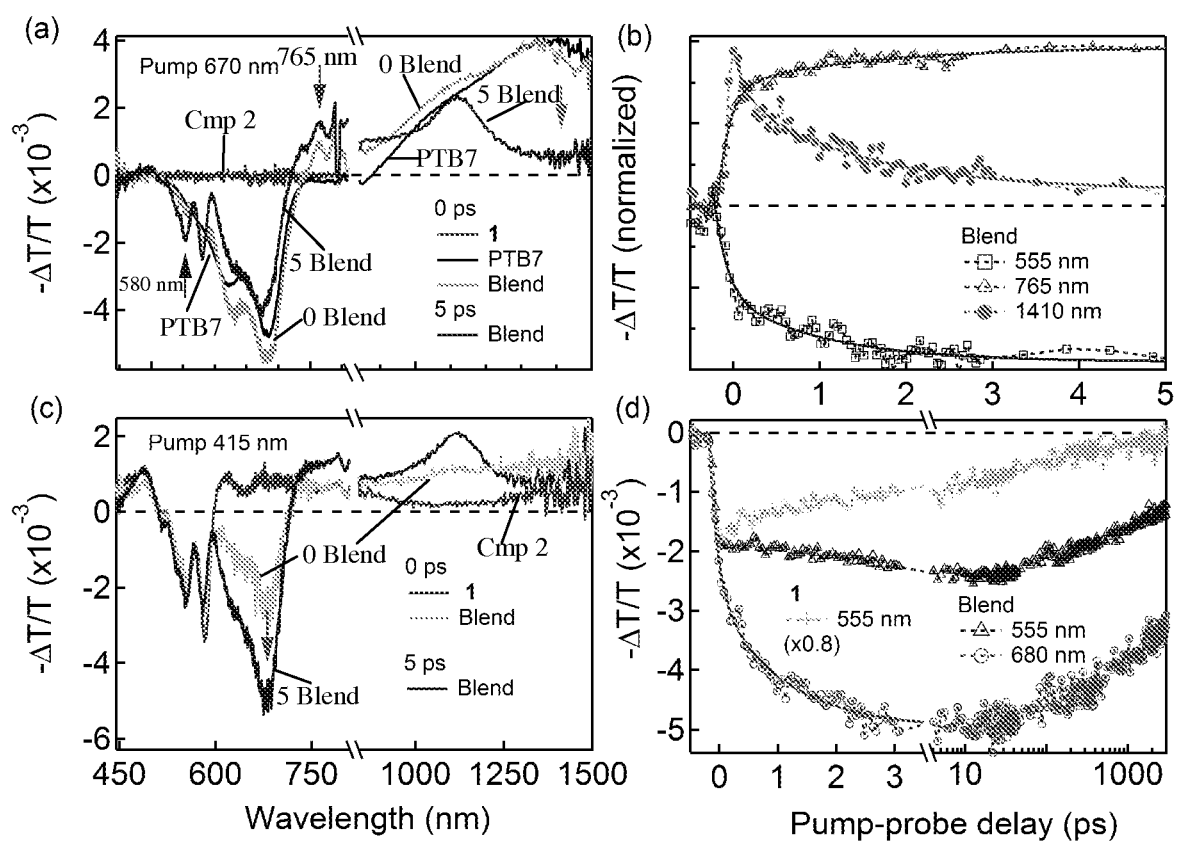
FIG. 24 depicts transient absorption spectra for the films of neat Compound 2, neat PTB7 and their blended films, excited by 670 nm (A) and 415 nm (C). (B) Normalized dynamics in the blend at 555 nm (Compound 2 bleaching peak), polaron absorption at 765 nm and exciton ESA peak in PTB7 at 1410 nm, the probe wavelengths are depicted by arrows in (A). (D) Dynamics at 555 nm for the neat Compound 2 and at 555 and 680 nm for the blended film upon 415 nm excitation. The pump density was ~20 μJ/cm$^2$ per pulse.

FIG. 24A compares TA spectra for neat films of Compound 2, PTB7 and their blended at 0 and 5 ps, respectively upon photo excitation at 670 nm. At this wavelength, only PTB7 was excited, as confirmed by the absence of TA signal for Compound 2. The spectrum from neat PTB7 featured ground-state bleaching (GB) peaks at 620 and 680 nm and a broad excited state absorption (ESA) peaks at ~1400 nm; these features decay bi-exponentially with time constants of 3.2±0.3 and 50±4 ps. In the blend, this ESA feature decayed rapidly, with two time constants of 0.12±0.03 and 1.4±0.2 ps (FIG. 24B), suggesting ultrafast electron transfer from photoexcited PTB7 to the electron acceptor, Compound 2. The ultrafast decay of the ESA at ~1410 nm was accompanied by a new ESA at ~1120 nm, which is assigned to hole polaron absorption in PTB7. This assignment is consistent with previous spectroscopic measurement on chemical doped PTB7 that showed a polaron band at the same wavelength.

The dynamics of exciton dissociation into charge carriers was characterized by two time scales, as shown by the biexponential fit ($\tau_1$=0.12±0.03 ps; and $\tau_2$=1.4±0.2 ps) to the ESA signal probed at 1410 nm (circles and fit in FIG. 24B). This was more obvious in the ESA signal at ~765 nm (arrow in FIG. 24A and trianges in FIG. 24B), which was negligible for the neat PTB7, but appeared in the blend. The new ESA in this region was assigned to the polaron absorption both in Compound 2 and PTB7. Bi-exponential fit (trangles, FIG. 24B) to the dynamics at 765 nm yielded time constants of $\tau_1$=0.12±0.03 ps (70% relative weight) and $\tau_2$=1.3±0.2 ps (30% relative weight). These time constants were identical to those obtained from fit to signal at 1410 nm and both wavelengths probe the same dynamics: the decay of exciton in PTB7 (1410 nm) and rise of polaron absorption (765 nm). $\tau_1$ (=0.12±0.03 ps) was assigned to the ultrafast exciton dissociation of PTB7 at the interface with electron acceptor Compound 2 and $\tau_2$ (=1.3±0.2 ps) to the diffusion of excitons in PTB7 toward interfaces prior to dissociation. Further confirming the assignment of charge transfer dynamics, the appearance of ground state bleaching from Compound 2 was at 555 and 580 nm, which tracks the charge transfer dynamics (arrow in FIG. 24A and squares/fit in FIG. 24B).

Figure 23:
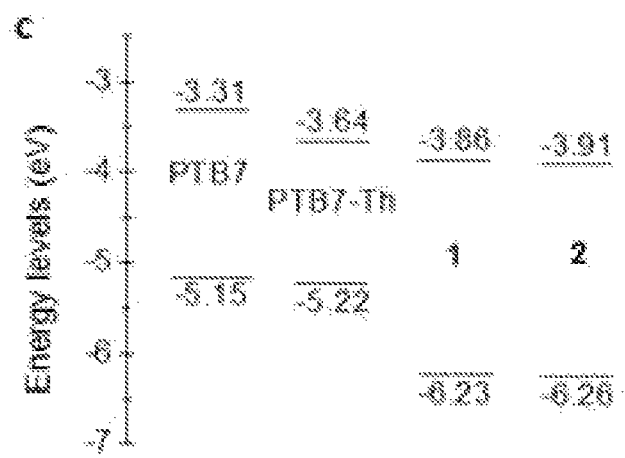
FIG. 23 is a representative data according to some embodiments of the disclosed subject matter: (A) Schematic of the energy levels of Compound 2 (represented by 1), Compound 3 (represented by 2), PTB7 and PTB7-Th. (B) Film absorption spectra of Compound 2 (represented by 1), Compound 3 (represented by 2), PTB7 and PTB7-Th.
Figure 23:
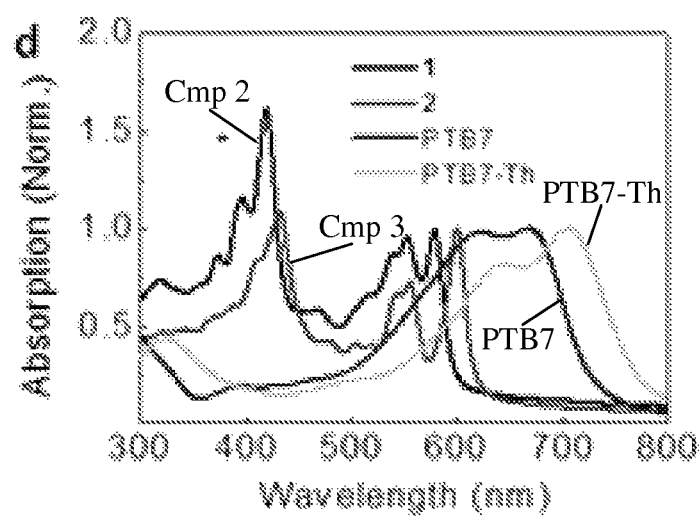

Complementary light harvesting by Compound 2 was conducted at its peak absorption wavelength of 415 nm (FIG. 23B). For neat Compound 2, excitation at this wavelength leads to GB at 555 and 580 nm, as well as a broad ESA feature in the range of ~600-1000 nm (FIG. 24C). In the blend, excitation of Compound 2 lead to a rise of the bleaching of PTB7 at 680 nm. This bleaching signal grows with two time constants: $\tau_1'=0.14\pm0.02$ ps and $\tau_2'=1.2\pm0.3$ ps (circles and fit in FIG. 24D). The former was assigned to ultrafast hole transfer from photoexcited Compound 2 to PTB7 and the latter to exciton diffusion time in Compound 2 toward interfaces prior to hole transfer. This interpretation was supported by the growth of ESA of hole polaron absorption in PTB7 at 1120 nm (see FIG. 24C, spectrum at 5 ps). The charge separation process in the blend lead to a ~2-orders of magnitude increase in the time constant for the recovery of Compound 2 (probed at 555 nm, triangle/fit in FIG. 24D) as compared to the same process in neat Compound 2 (plus sign/fit in FIG. 24D). The similar longer carrier lifetime was also found in the blended film at different excitation wavelengths (see supporting information). The much longer carrier recombination times in the blend than those in neat films were attributed to bimolecular recombination of charges in the former (in the absence of charge extraction).

The TA results presented above established that photoexcitation of either the donor or the acceptor contribute to charge carrier generation. In BHJ of donors with fullerene systems, the majority of charge carriers are generated in ultrafast time scale, which was assigned to the highly delocalized photoexcitation. The minority charge carrier was yielded from exciton diffusion to interfaces prior to charge transfer with time constant of 50 ps. In this study, beside the ultrafast exciton dissociation into charge carriers the exciton diffusion was found to also play an important role on the charge generation. The diffusion time was significantly shorter in comparison with the BHJ with fullerenes.

It is well known that proper phase separation and interpenetrating networks of donor and acceptor domains are critical to charge separation and carrier transport. Many studies on the film morphology in polymer/fullerene solar cells suggest optimal morphology for device operation with aggregated domains having sizes of tens of nanometers for both the donor and acceptor. However, film morphology of non-fullerene solar cells has received less attention. To study the morphology of our blend films, grazing-incident X-ray diffraction was performed to understand molecular packing in our blend films. Both of PTB7:Compound 2 and PTB7-Th:Compound 2 blend films showed short-range order, as evident by halos in the q=0.3-0.4 Å$^{-1}$). This suggests PTB7 and PTB7-Th aggregate to form crystallites in blend films, with a d-spacing of 1.8 Å for PTB7 and 2.1 Å for PTB7-Th, respectively.

Figure 25:
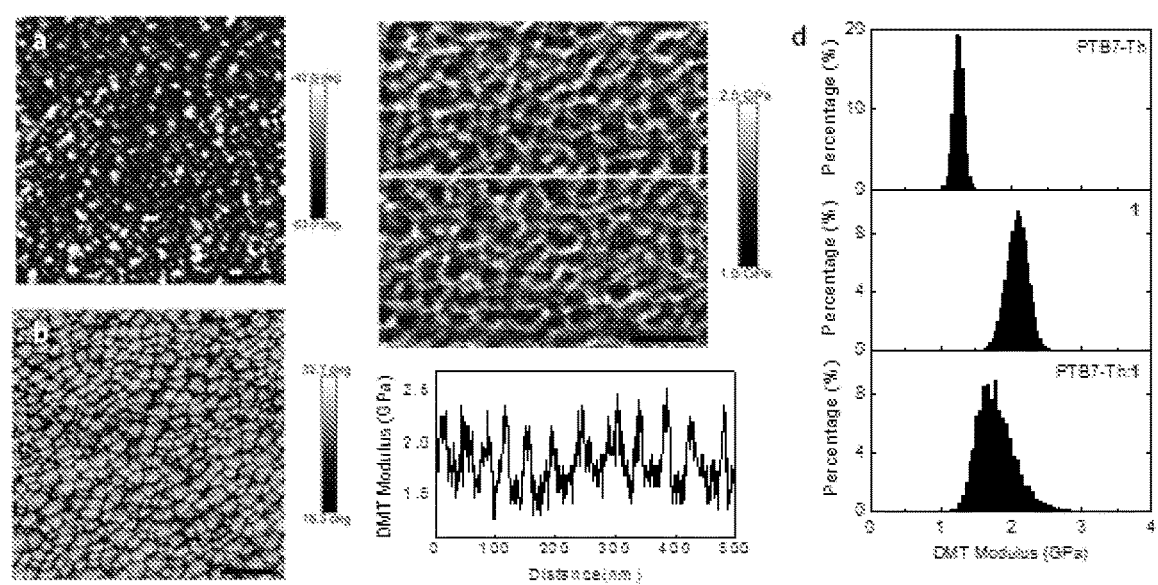
FIG. 25 depicts film morphology of PTB7-Th:Compound 2 blended film. a, Top surface phase image of BHJ thin film measured in tapping mode. b, Internal phase image of BHJ thin film measured in tapping mode. c, Internal DMT modulus map of BHJ thin film measured in QNM mode. Bottom graph is line-cut analysis of image c. d, DMT modulus of PTB7-Th and Compound 2 pure thin films and PTB7-Th:Compound 2 blend film.

FIG. 25 displays the micrographs from atomic force microscopy (AFM) that was used to investigate PTB7-Th:Compound 2 blended film in tapping and quantitative nanomechanical (QNM) modes. While the height image of the top surface of the film suggested a very smooth thin film with a RMS, the phase image showed a distinct phase separation with domain size of about 10-20 nm. (FIG. 25A). To test if the top surface of the film's morphology may differ from the internal morphology of the film, oxygen plasma was used to etch ~30 nm from the top of the film. Under tapping mode, the phase image clearly showed a continuous interpenetrating network with a feature size of 20-40 nm (FIG. 25B). These images indicated a proper phase separation for exciton dissociation and charge transport. Nanomechanical study showed that the continuous network (dark regions in FIG. 25B) has a DMT modulus of ~2.2 GPa, which was similar to that of pure Compound 2 film. Nevertheless, isolated domains (bright regions in FIG. 25B) embedded in the continuous network had a smaller DMT modulus (~1.5 GPa), close to that of pure PTB7 film (FIGS. 25C and 25D). This suggested that interpenetrating network was comprised of Compound 2-rich domains embedded in PTB7-Th-rich matrix. This blend film shared very similar morphology with PTB7:PC$_{71}$BM, which was considered an optimal morphology to enable efficient charge generation and transport in BHJ solar cells.

Device Fabrication.

Pre-patterned ITO-coated glass with a sheet resistance of ~15 Ω/sq was cleaned with detergent, ultrasonicated in DI water, acetone and isopropanol for 30 min, respectively. Subsequently, we treated the substrates by UV-Ozone for 10 min. The prepared ZnO precursor was spin-cast onto the ITO substrate at 3000 rpm for 1 min, followed by annealing at 200° C. for 1 h in air, to form a thin film with approximate thickness of 20 nm. The nGNR-based BHJ active layers were prepared by spin-coating a mixed solution containing polymer and nGNR in chlorobenzene at a total concentration of 25 mg/ml at 1000 rpm for 2 min. The thickness of the prepared active layers is about 100 nm. Active layers were heated at 80° C. for 10 min in the nitrogen filled glove box to remove the residual solvent. Finally, a 7 nm MoO$_x$ layer was deposited first and then a 100 nm Al electrode were subsequently deposited through a shadow mask by thermal evaporation under a vacuum about 1×10$^{-6}$ torr.

Although the presently disclosed subject matter and its advantages have been described in detail, it should be understood that various changes, substitutions and alterations can be made herein without departing from the spirit and scope of the disclosed subject matter as defined by the appended claims. Moreover, the scope of the disclosed subject matter is not intended to be limited to the particular embodiments described in the specification. Accordingly, the appended claims are intended to include within their scope such alternatives.

What is claimed is:

1. An oligomer compound comprising at least one repeating monomer, wherein the compound is represented by the Formula:

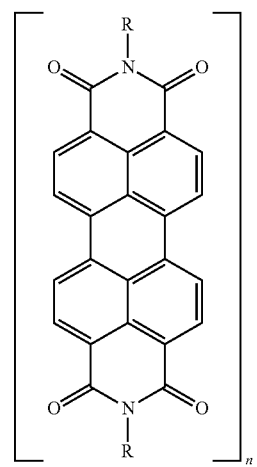

wherein each R is independently selected from the group consisting of branched and unbranched alkyl groups with a total of 6-20 carbon atoms;

n is an integer from 3-10; and wherein units are connected by ethylene bridges between bay-positions.

2. The oligomer compound of claim 1, wherein each R is independently selected from the group consisting of branched and unbranched $C_8$-$C_{15}$ alkyl groups.

3. The oligomer compound of claim 1, wherein each R is independently selected from the group consisting of branched and unbranched $C_9$-$C_{12}$ alkyl groups.

4. The oligomer compound of claim 1, wherein at least one R is branched or unbranched $C_{11}H_{23}$.

5. The oligomer compound of claim 1, wherein each R is independently a branched or unbranched $C_{11}H_{23}$.

6. The oligomer compound of claim 5, wherein each R is branched $C_{11}H_{23}$.

7. The oligomer compound of claim 6, wherein each R is:

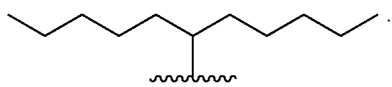 [SMILES: *C(CCCCC)CCCCC]

8. The oligomer compound of claim 1, wherein n is an integer from 3-4.

9. The oligomer compound of claim 1, wherein the compound is represented by the formula:

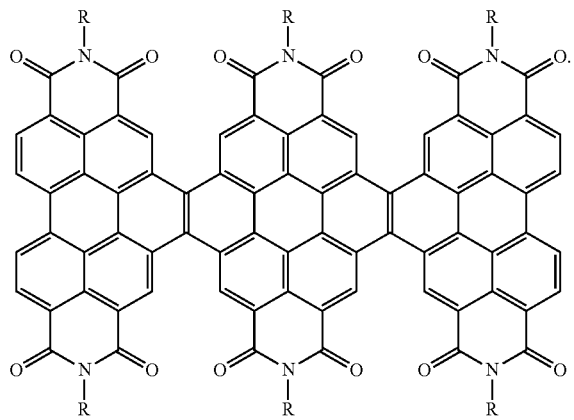

10. The oligomer compound of claim 1, wherein the compound is represented by the formula:

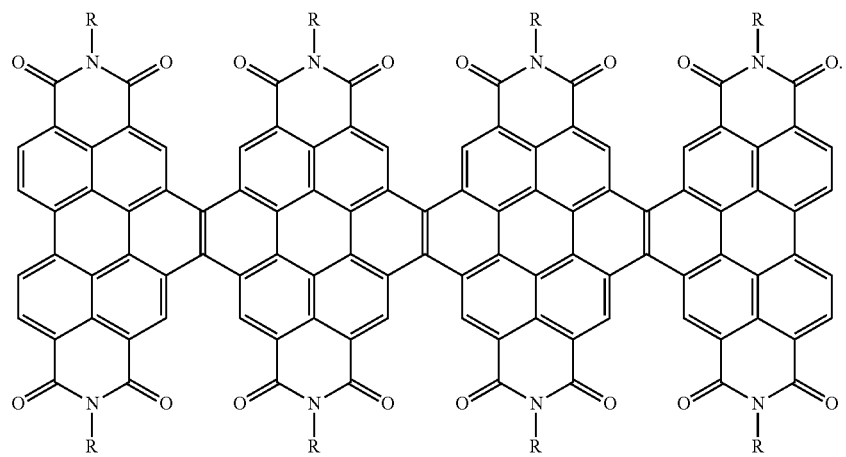

11. The oligomer compound of claim 1, wherein the compound is:

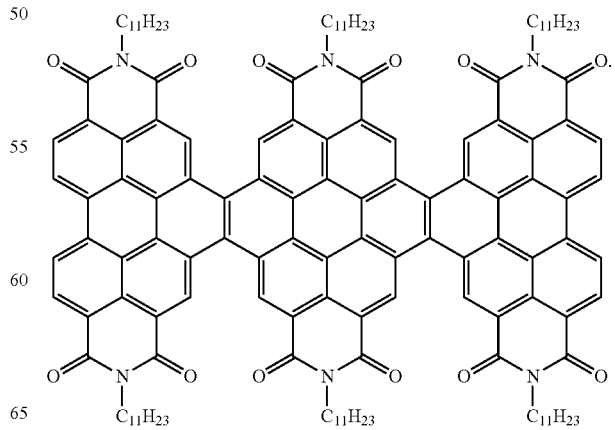

12. The oligomer compound of claim 1, wherein the compound is:

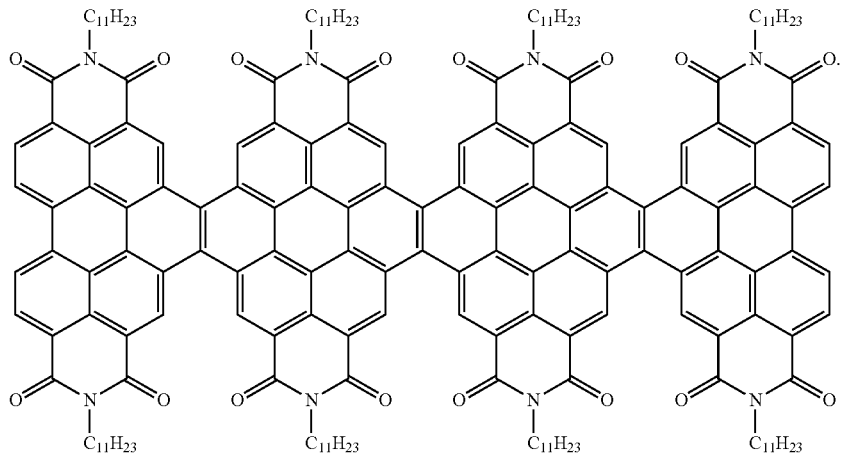

13. The oligomer compound as in claim 1, wherein the compounds are non-planar.

14. The oligomer compound as in claim 1, wherein the LUMO levels of the compound are between about −1 eV to about −6 eV.

15. The oligomer compound of claim 14, wherein the LUMO levels are about −4 eV.

16. The oligomer compound as in claim 1, wherein the electron mobilities of the compound are between about $10^{-4}$ to about $10^{-5}$ cm$^2$V$^{-1}$s$^{-1}$.

17. The oligomer compound of claim 16, wherein the electron mobilities are between about $10^{-1}$ to about $10^{-2}$ cm$^2$V$^{-1}$s$^{-1}$.

18. The oligomer compound as in claim 1, wherein the oligomer compound forms a helical, waggling, or mixed helical and waggling superstructure.

19. The oligomer compound as in claim 1, wherein one or more carbons at positions 1, 2, 5, 6, 7, 8, 11, or 12 is substituted.

20. The oligomer compound as claim 19, wherein one or more carbons at positions 1, 2, 5, 6, 7, 8, 11, or 12 is substituted with the group consisting of a bromine, nitrile, and ethylene glycol dimethyl ether.

21. A device comprising at least one compound of claim 1, at least one electron donor, and optionally at least one solvent additive.

22. The device of claim 21, wherein the electron donor is selected from the group consisting of Group IA metals, Group IA metal arenes, P3HT, poly[2-methoxy-5-(3,7-dimethyloctyloxy)-1,4-phenylene vinylene] (MDMO-PPV), poly(2-methoxy-5-(2'-ethyl-hexyloxy)-1,4-phenylene vinylene) (MEH-PPV), N,N-diisopropyl-3-pentylamine, N-ethyldiisopropylamine, and 1,2,2,6,6-pentamethylpiperidine, thieno[3,4-b]thiophene/benzodithiophene (PTB7), PSBTBT, Poly[(4,8-bis[5-(2-ethylhexyl)thiophene-2-yl]benzo[1,2-b:4,5-b']dithiophene)-2,6-diyl-alt-(4-(2-ethylhexanoyl)-thieno[3,4-b]thiophene))-2,6-diyl] (PBDTT-TT) and combinations thereof.

23. The device of claim 22, wherein the electron donor thieno[3,4-b]thiophene/benzodithiophene (PTB7) or Poly[(4,8-bis[5-(2-ethylhexyl)thiophene-2-yl]benzo[1,2-b:4,5-b']dithiophene)-2,6-diyl-alt-(4-(2-ethylhexanoyl)-thieno[3,4-b]thiophene))-2,6-diyl] (PBDTT-TT).

24. The device of claim 21, wherein the solvent additive is selected from the group consisting of 1,6-dichlorohexane; 1,6-dibromohexane; 1,6-diiodohexane; diiodooctane; 1,8-dithioloctane; 1,8-dichlorooctane; 1,8-dibromooctane; 1,8-diiodooctane, decanedinitrile; 1,10-dithioldecane; 1,8-dichlorodecane; 1,8-dibromodecane; 1,8-diiododecane; chloronaphthalene, octanedithiol, 1,6-dithiolhexane; octadinitrile; dodecanedinitrile; 1-chloronaphthalene and combinations thereof.

25. The device of claim 24, wherein solvent additive is 1,8-diiodooctane or 1-chloronaphthalene.

26. The device of claim 21, wherein the power conversion efficiency of the device is between about 3% to about 12%.

27. The device of claim 26, wherein the power conversion efficiency is between about 5% to about 10%.

28. The device of claim 21, wherein the power conversion efficiency of the device is at least about 5%.

29. The device of claim 21, where in the device is selected from the group consisting of a solar cell, an optical device, an electroluminescent device, a photovoltaic cell, a semiconducting cell, and a photodiode.

30. A process for preparing oligomer compounds, comprising coupling two or more perylene diimide monomers with an ethylene bridge to form a oligomer compound,
wherein the oligomer compound is represented by the Formula:

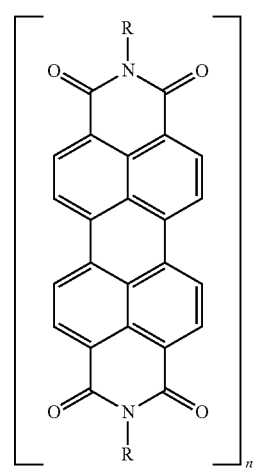

wherein each R is independently selected from the group consisting of branched and unbranched alkyl groups with a total of 6-20 carbon atoms;

n is an integer from 3-10; and wherein the units are connected by ethylene bridges (C═C) between the bay positions.

31. The process of claim 30, wherein each R is independently selected from the group consisting of branched and unbranched $C_8$-$C_{15}$ alkyl groups.

32. The process of claim 30, wherein each R is independently selected from the group consisting of branched and unbranched $C_9$-$C_{12}$ alkyl groups.

33. The process of claim 30, wherein at least one R is branched or unbranched $C_{11}H_{23}$.

34. The process of claim 30, wherein each R is independently a branched or unbranched $C_{11}H_{23}$.

35. The process of claim 30, wherein each R is branched $C_{11}H_{23}$.

36. The process of claim 35, wherein each R is:

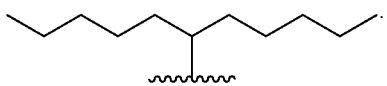 [SMILES: *C(CCCCC)CCCCC]

37. The process of claim 30, wherein n is an integer from 3-4.

38. The process of claim 30, wherein the ethylene bridge forms between the bay positions of the monomers.

39. The process of claim 30, wherein the oligomer compound is synthesized by coupling a halogen substituted monomer or oligomer to trans-1,2-bis(tributylstannyl)ethene followed by a cyclization reaction.

40. The process of claim 39, wherein the oligomer being coupled is a trimer.

41. The process of claim 39, wherein the halogen is bromine or chlorine.

42. The process of claim 39, wherein the halogen substitution is at a bay position.

43. The process of claim 42, wherein the substitution is at the 1 position, 7 position, or both the 1 and 7 positions.

44. The process of claim 39, wherein the cyclization reaction is a photocyclization reaction.

45. The process of claim 44, wherein the cyclization reaction is conducted under oxidative conditions.

46. The process of claim 45, wherein oxidants O2 or I2 are used during the cyclization reaction.

47. The process of claim 46, wherein the oxidant is I2.

48. The process of claim 44, wherein air is purged during the irradiation step of the photocyclization reaction.

49. The process of claim 44, wherein the photocyclization reaction uses a 220-600 W lamp.

50. The process of claim 44, wherein the photocyclization reaction uses a 450 W medium mercury lamp.

* * * * *